US 8,785,104 B2

(12) United States Patent
Mizutani et al.

(10) Patent No.: US 8,785,104 B2
(45) Date of Patent: Jul. 22, 2014

(54) RESIST COMPOSITION AND PATTERN FORMING METHOD USING THE SAME

(75) Inventors: Kazuyoshi Mizutani, Shizuoka (JP); Jiro Yokoyama, Shizuoka (JP); Shinichi Sugiyama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 510 days.

(21) Appl. No.: 12/921,354

(22) PCT Filed: Mar. 13, 2009

(86) PCT No.: PCT/JP2009/055543
§ 371 (c)(1),
(2), (4) Date: Sep. 7, 2010

(87) PCT Pub. No.: WO2009/113735
PCT Pub. Date: Sep. 17, 2009

(65) Prior Publication Data
US 2011/0014570 A1   Jan. 20, 2011

(30) Foreign Application Priority Data

Mar. 14, 2008   (JP) .................................. 2008-066746

(51) Int. Cl.
*G03F 7/004*   (2006.01)
*G03F 7/039*   (2006.01)
*G03F 7/26*    (2006.01)

(52) U.S. Cl.
USPC ........................................ 430/270.1; 430/326

(58) Field of Classification Search
USPC ........................................ 430/270.1–326, 910
See application file for complete search history.

(56) References Cited

U.S. PATENT DOCUMENTS

| | | | |
|---|---|---|---|
| 5,498,506 A | 3/1996 | Wengenroth et al. | |
| 6,040,112 A | 3/2000 | Yako et al. | |
| 6,171,755 B1 | 1/2001 | Elian et al. | |
| 6,274,286 B1 | 8/2001 | Hatakeyama et al. | |
| 6,303,264 B1 | 10/2001 | Fujie et al. | |
| 7,851,131 B2 * | 12/2010 | Kawamori et al. | 430/270.1 |
| 2003/0186161 A1 | 10/2003 | Fujimori | |
| 2004/0053158 A1 * | 3/2004 | Yamato et al. | 430/296 |
| 2006/0264528 A1 * | 11/2006 | Wada | 522/130 |
| 2007/0072096 A1 * | 3/2007 | Takakuwa et al. | 430/7 |
| 2007/0141513 A1 | 6/2007 | Fujimori | |
| 2007/0190448 A1 * | 8/2007 | Ishiduka et al. | 430/270.1 |
| 2008/0318159 A1 | 12/2008 | Fujimori | |

FOREIGN PATENT DOCUMENTS

| | | |
|---|---|---|
| EP | 0919867 A2 | 6/1999 |
| JP | 03-200968 A | 9/1991 |
| JP | 07-092680 A | 4/1995 |
| JP | 07-508840 T | 9/1995 |
| JP | 10-326015 A | 12/1998 |
| JP | 11-044950 A | 2/1999 |
| JP | 11-084639 A | 3/1999 |
| JP | 2000-181065 A | 6/2000 |
| JP | 2000-275837 A | 10/2000 |
| JP | 2000275837 A * | 10/2000 |
| JP | 2003-098672 A | 4/2003 |
| JP | 2004-043779 A | 2/2004 |

OTHER PUBLICATIONS

Kameyama et al., JP 2000-275837, (2000), (English Translation).*
Machine translation of JP 2000-275837, published on Oct. 6, 2000.*
International Search Report (PCT/ISA/210), for PCT/JP2009/055543, dated Apr. 14, 2009.
International Preliminary Examination Report (PCT/ISA/237), for PCT/JP2009/055543, dated Apr. 14, 2009.
Japanese Office Action, dated Sep. 14, 2010, issued in counterpart application No. 2008-066746.
Extended European Search Report dated Sep. 14, 2012 in European Application No. 09720706.2.
Office Action dated Sep. 23, 2013 issued by the Taiwanese Patent Office in counterpart Taiwanese Patent Application No. 098108115.

* cited by examiner

*Primary Examiner* — Anca Eoff
(74) *Attorney, Agent, or Firm* — Sughrue Mion, PLLC

(57) ABSTRACT

A resist composition and a pattern forming method using the composition are provided, the resist composition including: (A) a resin that decomposes by an action of an acid to increase a solubility of the resin (A) in an alkali developer; (B) a compound capable of generating an acid upon irradiation with actinic rays or radiation; (C) a compound represented by formula (C1); and (D) a solvent:

$$\underset{Rb}{\overset{Ra}{\diagdown}}N\underset{}{\overset{}{-}}\left(\underset{}{\overset{H_2}{C}}\right)_n\underset{}{\overset{}{-}}\left[O-(CH_2)_w\right]_p O\underset{}{\overset{}{-}}\left(\underset{}{\overset{H_2}{C}}\right)_m\underset{}{\overset{}{-}}N\underset{Rd}{\overset{Rc}{\diagup}} \quad (C1)$$

wherein n represents an integer of 1 to 6; w represents an integer of 1 to 6; p represents an integer of 1 to 6; m represents an integer of 1 to 6; Ra, Rb, Rc and Rd each independently represents a hydrogen atom, an alkyl group, a cycloalkyl group, an aryl group or an aralkyl group, provided that Ra and Rb may combine together to form a ring, and Rc and Rd may combine together to form a ring.

11 Claims, No Drawings

RESIST COMPOSITION AND PATTERN FORMING METHOD USING THE SAME

TECHNICAL FIELD

The present invention relates to a resist composition suitable for use in the ultramicrolithography process such as production of VLSI or a high-capacity microchip or in other photofabrication processes, and a pattern forming method using the composition. More specifically, the present invention relates to a resist composition capable of forming a high-resolution pattern by using KrF excimer laser light, ArF excimer laser light, electron beam, EUV light or the like, and a pattern forming method using the composition. That is, the present invention relates to a resist composition suitably usable for fine processing of a semiconductor device, where KrF excimer laser light, ArF excimer laser light, electron beam or EUV light is used, and a pattern forming method using the composition.

BACKGROUND ART

In the process of producing a semiconductor device such as IC and LSI, fine processing by lithography using a photoresist composition has been conventionally performed. Recently, the integration degree of an integrated circuit is becoming higher and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using electron beam, X ray or EUV light is proceeding.

The lithography using electron beam or EUV light is positioned as a next-generation or next-next-generation pattern formation technique and a high-sensitivity, high-resolution resist is being demanded. Particularly, in order to shorten the wafer processing time, elevation of the sensitivity is very important, but when high sensitivity of a positive resist for use with electron beam or EUV is sought for, not only reduction in the resolution but also worsening of the line width roughness (LWR) are incurred and development of a resist satisfying these properties at the same time is strongly demanded. High sensitivity, high resolution and good LWR are in a trade-off relationship and it is very important how to satisfy these properties at the same time.

Also in the lithography using ArF or KrF excimer laser light, it is similarly an important problem to satisfy all of high sensitivity, high resolution and good LWR.

Furthermore, in the process as typified by a contact hole process, sidelobe margin, exposure latitude (EL), depth-of-focus (DOF) performance and profile are raised as problems to be solved. In particular, as for the sidelobe margin, mere elevation of contrast also involves elevation of sensitivity to sidelobe light, resulting in a trade-off relationship with the exposure latitude (EL). It is very important how to satisfy these properties all at the same time.

Here, the sidelobe margin is a phenomenon such that phase shifting due to use of a phase shift mask called a halftone mask, which is generally performed in recent years for raising the resolution when resolving contact holes, allows slight light transmission through an originally unintended part to form a groove on the side of a hole. This groove is likely to be transferred to a substrate by an etching process and if the sidelobe resistance is poor, an electrical characteristic failure is brought about to reduce the yield.

As regards the resist suitable for such a lithography process using KrF excimer laser light, electron beam or EUV light, a chemical amplification-type resist utilizing an acid catalytic reaction is mainly used from the standpoint of elevating the sensitivity and in the case of a positive resist, a chemical amplification-type resist composition mainly comprising an acid generator and a phenolic polymer which is insoluble or sparingly soluble in an alkali developer but becomes soluble in an alkali developer by the action of an acid (hereinafter simply referred to as a "phenolic acid-decomposable resin"), is being effectively used.

As regards the resist for electron beam or X-ray, a resist technique for KrF excimer laser has been heretofore mainly utilized and studied. For example, there are disclosed a combination of a compound capable of generating an acid upon irradiation with electron beams and an amine compound having a boiling point of 250° C. or less in JP-A-2000-181065 (the term "JP-A" as used herein means an "unexamined published Japanese patent application"), a combination use of an acid-decomposable group-containing polymer, an acid generator and an electron beam sensitizer in European Patent 0919867, a tertiary amine compound having an ether bond in JP-A-10-326015, and a combination use of an amide compound in JP-T-7-508840 (the term (the term "JP-T" as used herein means a "published Japanese translation of a PCT patent application"). Furthermore, JP-A-3-200968 discloses a maleimide compound, JP-A-7-92680 discloses a sulfonamide compound, JP-A-11-44950 discloses a sulfonimide compound containing an —$SO_2$—NH—$SO_2$— partial structure, and JP-A-2003-98672 discloses an oxygen-containing aliphatic amine. However, at present, none of these attempts for improvement has succeeded in satisfying high resolution, good sidelobe margin, exposure latitude (EL), depth-of-focus (DOF) performance and profile all at the same time.

DISCLOSURE OF THE INVENTION

An object of the present invention is to solve the problems in the technology for enhancing the performance at the time of fine-processing a semiconductor device by using an actinic ray or radiation, particularly, electron beam, X-ray, KrF excimer laser light or ArF excimer laser light, and provide a resist composition excellent in the sensitivity, resolution, pattern profile, sidelobe margin, exposure latitude (EL), depth-of-focus (DOF) performance and LWR performance and a pattern forming method using the composition.

The object of the present invention is attained by the following constructions.

(1) A resist composition, comprising:
(A) a resin that decomposes by an action of an acid to increase a solubility of the resin (A) in an alkali developer;
(B) a compound capable of generating an acid upon irradiation with actinic rays or radiation;
(C) a compound represented by formula (C1); and
(D) a solvent:

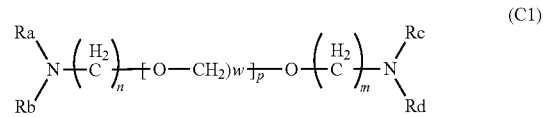

wherein n represents an integer of 1 to 6;
w represents an integer of 1 to 6;
p represents an integer of 1 to 6;
m represents an integer of 1 to 6;

Ra, Rb, Rc and Rd each independently represents a hydrogen atom, an alkyl group, a cycloalkyl group, an aryl group or an aralkyl group, provided that Ra and Rb may combine together to form a ring, and Rc and Rd may combine together to form a ring.

(2) The resist composition as described in (1) above, wherein in formula (C1), n, w and m each is 2.

(3) The resist composition as described in (1) or (2) above, wherein in formula (C1), Ra, Rb, Rc and Rd each is a hydrogen atom.

(4) The resist composition as described in any one of (1) to (3) above, wherein the resin (A) that decomposes by an action of an acid to increase the solubility in an alkali developer contains a repeating unit represented by formula (A1):

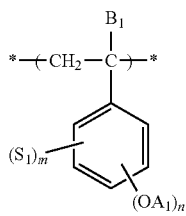

(A1)

wherein n represents an integer of 1 to 3;

m represents an integer of 0 to 3, provided that m+n≤5;

$A_1$ represents a group that leaves by an action of an acid or a group containing a group that decomposes by an action of an acid;

$S_1$ represents a substituent and when a plurality of $S_1$'s are present, the plurality of $S_1$'s may be the same or different; and $B_1$ represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

(5) The resist composition as described in any one of (1) to (3) above, wherein the resin (A) that decomposes by an action of an acid to increase the solubility in an alkali developer contains a repeating unit represented by formula (A2):

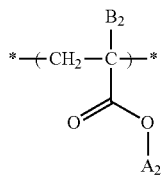

(A2)

wherein $A_2$ represents a group that leaves by an action of an acid or a group containing a group that decomposes by an action of an acid; and $B_2$ represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

(6) The resist composition as described in (5) above, wherein the repeating unit represented by formula (A2) is represented by formula (A2'):

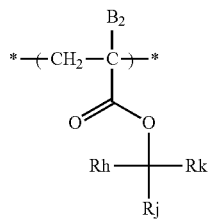

(A2')

wherein Rh, Rk and Rj each independently represents a hydrogen atom, an alkyl group, a cycloalkyl group, an aryl group or an aralkyl group, provided that Rk and Rj may combine together to form a ring; and $B_2$ represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

(7) The resist composition as described in any one of (1) to (6) above, wherein the compound (B) capable of generating an acid upon irradiation with actinic rays or radiation contains at least one kind of a compound selected from the group consisting of triarylsulfonium salts, diazodisulfone derivatives and oxime esters of an organic sulfonic acid.

(8) The resist composition as described in any one of (1) to (7) above, wherein the compound (B) capable of generating an acid upon irradiation with actinic rays or radiation contains at least one kind of a compound selected from the group consisting of triarylsulfonium salts, and at least one kind of a compound selected from the group consisting of diazodisulfone derivatives and oxime esters of an organic sulfonic acid.

(9) The resist composition as described in any one of (1) to (8) above, wherein the solvent (D) contains at least one kind of a solvent selected from the group consisting of propylene glycol monomethyl ether acetate, propylene glycol monomethyl ether propionate, propylene glycol monoethyl ether acetate, propylene glycol monomethyl ether, ethyl lactate, methoxymethyl propionate, ethoxyethyl propionate, γ-butyrolactone and propylene carbonate.

(10) The resist composition as described in any one of (1) to (9) above, further comprising:

a basic compound represented by formula (C3) or (C4):

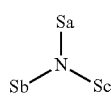

(C3)

wherein Sa, Sb and Sc each independently represents an alkyl group, a cycloalkyl group, an aryl group or an aralkyl group, provided that Sa and Sb may combine together to form a ring; and

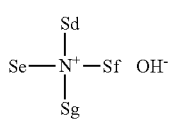

(C4)

wherein Sd, Se, Sf and Sg each independently represents an alkyl group, a cycloalkyl group, an aryl group or an aralkyl group, provided that Sd and Se may combine together to form a ring.

(11) A pattern forming method, comprising:
forming a resist film from the resist composition as described in any one of (1) to (10) above; and
exposing and developing the resist film.

(12) A pattern forming method, comprising:
forming a resist film from the resist composition as described in any one of (1) to (10) above;
exposing the resist film through an immersion medium, so as to foul' an exposed resist film; and
developing the exposed resist film.

Furthermore, preferred embodiments of the present invention are set forth below.

(13) The resist composition as described in any one of (1) to (10), further comprising: a surfactant.

(14) The resist composition as described in any one of (1) to (10) and (13) above, further comprising:
an antioxidant.

(15) The resist composition as described in any one of (1) to (10), (13) and (14) above, which is exposed by irradiation of KrF, ArF, electron beam, X-ray or EUV.

(16) A pattern forming method, comprising:
forming a resist film from the resist composition as described in any one of (13) to (15) above; and
exposing and developing the resist film.

BEST MODE FOR CARRYING OUT THE INVENTION

The best mode for carrying out the present invention is described below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

(C) Compound Represented by Formula (C1)

The resist composition of the present invention contains a compound represented by the following formula (C1):

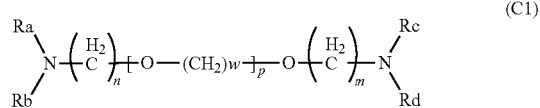

(C1)

In formula (C1), n represents an integer of 1 to 6,
w represents an integer of 1 to 6,
p represents an integer of 1 to 6,
m represents an integer of 1 to 6,
Ra, Rb, Rc and Rd each independently represents a hydrogen atom, an alkyl group, a cycloalkyl group, an aryl group or an aralkyl group, provided that Ra and Rb may combine together to form a ring, and Rc and Rd may combine together to form a ring.

The alkyl group in Ra, Rb, Rc and Rd may have a substituent and is preferably a linear or branched alkyl group having a carbon number of 1 to 12, such as methyl group, ethyl group or tert-butyl group. The substituent which the alkyl group in Ra, Rb, Rc and Rd may have is preferably a cycloalkyl group, an aryl group, an alkoxy group, a hydroxyl group, a halogen atom, a carboxyl group, a nitro group, an acyl group, an acylamino group, a sulfonylamino group, an alkylthio group, an arylthio group, an aralkylthio group or an alkoxycarbonyl group.

The cycloalkyl group in Ra, Rb, Rc, Rd may have a substituent and may be monocyclic or polycyclic. Specific examples thereof include a group having a carbon number of 5 or more and having a monocyclo, bicyclo, tricyclo or tetracyclo structure. The carbon number thereof is preferably from 5 to 30, more preferably from 5 to 25.

Examples of the structure of the alicyclic structure in the cycloalkyl group are set forth below.

(1)

(2)

(3)

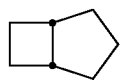

(4)

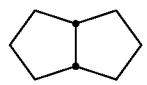

(5)

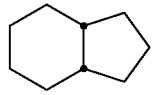

(6)

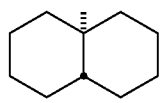

(7)

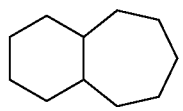

(8)

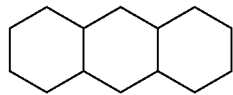

(9)

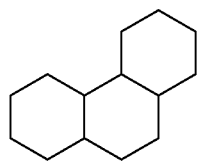
(10)
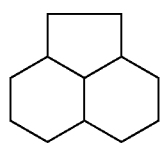
(11)
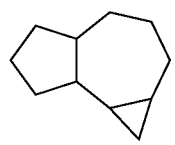
(12)
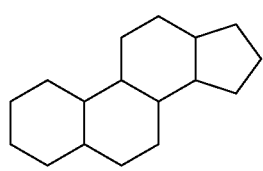
(13)
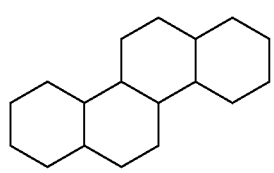
(14)
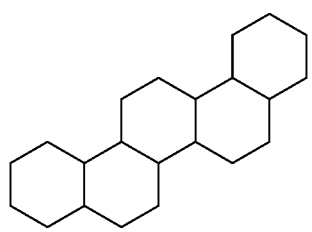
(15)
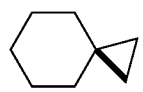
(16)
(17)
(18)
(19)
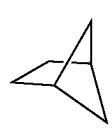
(20)
(21)
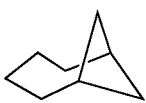
(22)
(23)
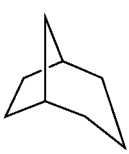
(24)
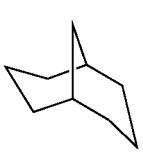
(25)
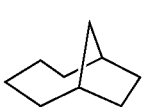
(26)
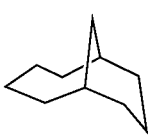
(27)
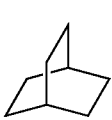
(28)
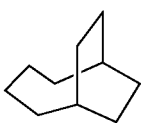
(29)
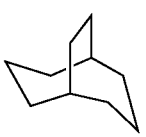
(30)
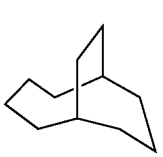
(31)
(32)

-continued

(33) 

(34) 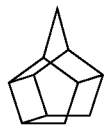

(35) 

(36) 

(37) 

(38) 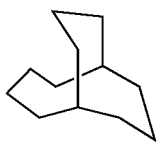

(39) 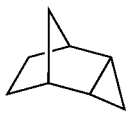

(40) 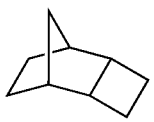

(41) 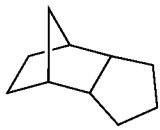

(42) 

(43) 

(44) 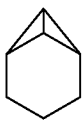

(45) 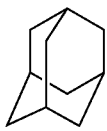

(46) 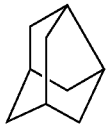

(47) 

(48) 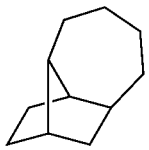

(49) 

(50) 

Examples of the cycloalkyl group in Ra, Rb, Rc and Rd include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. Among these, more preferred are an adamantyl group, a decalin residue, a norbornyl group, a cedrol group, a cyclohexyl group, a cycloheptyl group, a cyclooctyl group, a cyclodecanyl group and a cyclododecanyl group. The substituent which the cycloalkyl group in Ra, Rb, Rc and Rd may have is preferably an alkyl group, an aryl group, an alkoxy group, a hydroxyl group, a halogen atom, a carboxyl group, a nitro group, an acyl group, an acylamino group, a sulfonylamino group, an alkylthio group, an arylthio group, an aralkylthio group or an alkoxycarbonyl group.

The aryl group in Ra, Rb, Rc and Rd includes, for example, an aryl group having a carbon number of 6 to 15, such as benzyl group and naphthyl group. These groups each may have a substituent. Preferred examples of the substituent of the aryl group include an alkyl group, an alkoxy group, a hydroxyl group, a halogen atom, a carboxyl group, a nitro group, an acyl group, an acylamino group, a sulfonylamino group, an alkylthio group, an arylthio group, an aralkylthio group and an alkoxycarbonyl group.

The aralkyl group in Ra, Rb, Rc and Rd may have a substituent and is preferably an aralkyl group having a carbon number of 7 to 12, such as benzyl group, phenethyl group or naphthylmethyl group. These groups each may have a substituent. Preferred examples of the substituent of the aralkyl group include an alkyl group, an alkoxy group, a hydroxyl group, a halogen atom, a carboxyl group, a nitro group, an acyl group, an acylamino group, a sulfonylamino group, an alkylthio group, an arylthio group, an aralkylthio group and an alkoxycarbonyl group.

The group formed by Ra and Rb or by Rc and Rd when the pair of Ra and Rb or of Rc and Rd combines together to form a ring is preferably an alkylene group having a carbon number of 2 to 10.

Ra, Rb, Rc and Rd is preferably a hydrogen atom or an alkyl group having a carbon number of 1 to 4, more preferably a hydrogen atom.
n, w and m each is preferably 2. p is preferably 1 or 2.
Specific preferred examples of the compound represented by formula (C1) are set forth below, but the present invention is not limited thereto.
(C1-1)
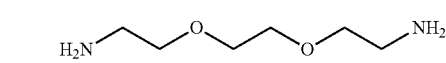
(C1-2)
(C1-3)
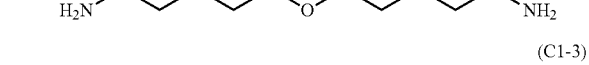
(C1-4)
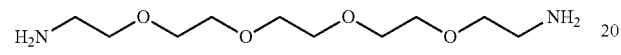
(C1-5)
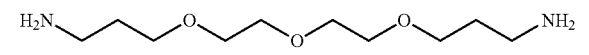
(C1-6)
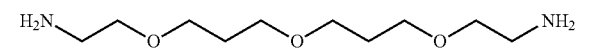
(C1-7)
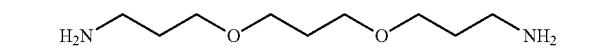
(C1-8)
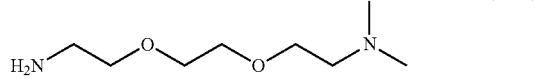
(C1-9)
(C1-10)
(C1-11)
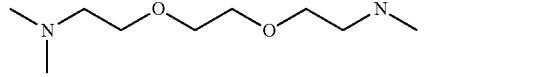
(C1-12)
-continued
(C1-13)
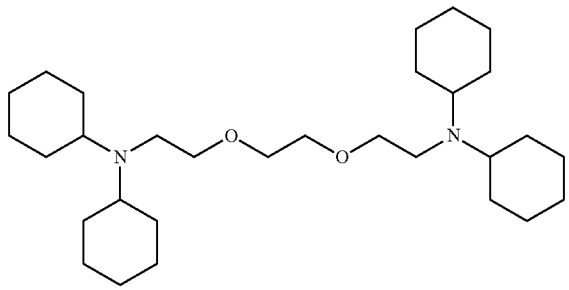
(C1-14)
(C1-15)
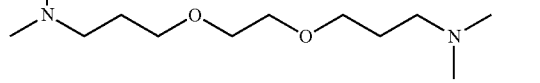
(C1-16)
(C1-17)
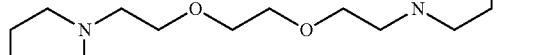
(C1-18)

(C1-19)

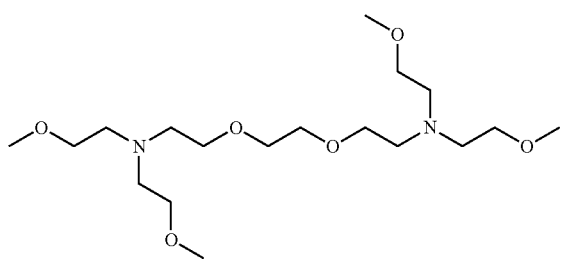

Some of the compound represented by formula (C1) are commercially available (from Sigma-Aldrich Japan K.K.) and those of which synthesis is necessary can be synthesized by the method described in references K. E. Krakowiak et al., J. Org. Chem., 56, 3723 (1991), N. Fukada et al., J. Chem. Res. Synop., 254, (1990), 3 and F. Sournies et al., J. Mol. Struct., 220, 63 (1990).

The amount used of the compound represented by formula (C1) is usually from 0.001 to 10 mass %, preferably from 0.01 to 5 mass %, based on the solid content of the resist composition. (In this specification, mass ratio is equal to weight ratio.)

(A) Resin that Decomposes by the Action of an Acid to Increase the Solubility in an Alkali Developer The resist composition of the present invention contains a resin that decomposes by the action of an acid to increase the solubility in an alkali developer (hereinafter sometimes referred to as a "resin (A)").

The resin (A) preferably has a repeating unit containing a group (hereinafter sometimes referred to as an "acid-decomposable group") that decomposes by the action of an acid to produce a group having high solubility in an alkali developer.

Examples of the acid-decomposable group include a group where a hydrogen atom of an alkali-soluble group such as carboxyl group, phenolic hydroxyl group, sulfonic acid group or thiol group is protected by a group that leaves by the action of an acid.

Examples of the group that leaves by the action of an acid include —C($R_{36}$)($R_{37}$)($R_{38}$), —C($R_{36}$)($R_{37}$)(O$R_{39}$), —C(=O)—O—C($R_{36}$)($R_{37}$)($R_{38}$), —C($R_{01}$)($R_{02}$)(O$R_{39}$), —C($R_{01}$)($R_{02}$)—C(=O)—O—C($R_{36}$)($R_{37}$)($R_{38}$) and —CH($R_{36}$)(Ar).

In the formulae, $R_{36}$ to $R_{39}$ each independently represents an alkyl group, a cycloalkyl group, an aryl group, an aralkyl group or an alkenyl group. $R_{36}$ and $R_{37}$ may combine together to form a ring.

$R_{01}$ and $R_{02}$ each independently represents a hydrogen atom, an alkyl group, a cycloalkyl group, an aryl group, an aralkyl group or an alkenyl group.

Ar represents an aryl group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be monocyclic or polycyclic. The monocyclic cycloalkyl group is preferably a cycloalkyl group having a carbon number of 3 to 8, and examples thereof include a cyclopropyl group, a cyclobutyl group, a cyclopentyl group, a cyclohexyl group and a cyclooctyl group. The polycyclic cycloalkyl group is preferably a cycloalkyl group having a carbon number of 6 to 20, and examples thereof include an adamantyl group, a nor-bornyl group, an isoboronyl group, a camphanyl group, a dicyclopentyl group, an α-pinel group, a tricyclodecanyl group, a tetracyclododecyl group and an androstanyl group. Incidentally, a part of the carbon atom in the cycloalkyl group may be substituted by a heteroatom such as oxygen atom.

The aryl group of $R_{36}$ to $R_{39}$, $R_{01}$, $R_{02}$ and Ar is preferably an aryl group having a carbon number of 6 to 10, and example thereof include a phenyl group, a naphthyl group and an anthryl group.

The aralkyl group of $R_{36}$ to $R_{39}$, $R_{01}$ and $R_{02}$ is preferably an aralkyl group having a carbon number of 7 to 12, and examples thereof include a benzyl group, a phenethyl group and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group and a cyclohexenyl group.

The ring formed by combining $R_{36}$ and $R_{37}$ together may be monocyclic or polycyclic. The monocyclic ring is preferably a cycloalkane structure having a carbon number of 3 to 8, and examples thereof include a cyclopropane structure, a cyclobutane structure, a cyclopentane structure, a cyclohexane structure, a cycloheptane structure and a cyclooctane structure. The polycyclic ring is preferably a cycloalkane structure having a carbon number of 6 to 20, and examples thereof include an adamantane structure, a norbornane structure, a dicyclopentane structure, a tricyclodecane structure and a tetracyclododecane structure. Incidentally, a part of the carbon atom in the cycloalkane structure may be substituted by a heteroatom such as oxygen atom.

$R_{36}$ to $R_{39}$, $R_{01}$, $R_{02}$ and Ar each may have a substituent. Examples of the substituent which $R_{36}$ to $R_{39}$, $R_{01}$, $R_{02}$ and Ar each may have include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group and a nitro group.

The acid-decomposable group decomposes by the action of an acid to produce an alkali-soluble group such as carboxyl group, phenolic hydroxyl group, sulfonic acid group or thiol group, whereby the solubility in an alkali developer increases.

The resin (A) preferably contains a repeating unit represented by the following formula (A1) or (A2) as a repeating unit having an acid-decomposable group.

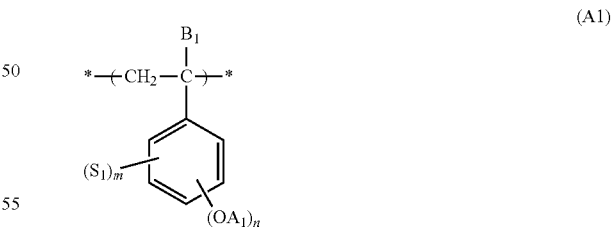

(A1)

In formula (A1), n represents an integer of 1 to 3, m represents an integer of 0 to 3, provided that m+n≤5, $A_1$ represents a group that leaves by the action of an acid, or a group containing a group that decomposes by the action of an acid, $S_1$ represents an arbitrary substituent and when a plurality of $S_1$'s are present, the plurality of $S_1$'s may be the same or different, and $B_1$ represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

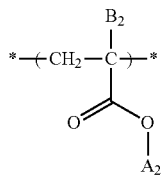

(A2)

In formula (A2), A2 represents a group that leaves by the action of an acid, or a group having a group that decomposes by the action of an acid, and $B_2$ represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

In formula (A1), the alkyl group of $B_1$ and the alkyl group in the alkyloxycarbonyl group and alkylcarbonyloxy group of $B_1$ are preferably a linear or branched alkyl group having a carbon number of 1 to 5, and examples thereof include a methyl group, an ethyl group, an n-propyl group, an isopropyl group, an n-butyl group, an isobutyl group, a sec-butyl group, a tert-butyl group, a pentyl group, an isopentyl group, a neopentyl group and a tert-pentyl group.

The alkoxy group of $B_1$ is preferably an alkoxy group having a carbon number of 1 to 5, and examples thereof include a methoxy group, an ethoxy group, a propoxy group and an n-butoxy group.

The acyl group of $B_1$ and the acyl group in the acyloxy group of $B_1$ are preferably an acyl group having a carbon number of 1 to 8, and examples thereof include a formyl group, an acetyl group, a propionyl group, a butyryl group, a valeryl group, a pivaloyl group and a benzoyl group.

The cycloalkyl group of $B_1$ is preferably a monocyclic or polycyclic cycloalkyl group having a carbon number of 3 to 15, and examples thereof include a cyclopropyl group, a cyclobutyl group, a cyclopentyl group, a cyclohexyl group, a norbornyl group and an adamantyl group.

The aryl group of $B_1$ is preferably an aryl group having a carbon number of 6 to 18, and example thereof include a phenyl group, a naphthyl group and an anthryl group.

The aralkyl group of $B_1$ is preferably an aralkyl group having a carbon number of 7 to 12, and examples thereof include a benzyl group, a phenethyl group and a naphthylmethyl group.

$B_1$ is preferably a hydrogen atom or a methyl group.

Examples of the group that leaves by the action of an acid, of $A_1$, are the same as those of the group that leaves by the action of an acid, described above for the acid-decomposable group, and the group is preferably, for example, a tertiary alkyl group such as tert-butyl group and tert-amyl group, a tert-butoxycarbonyl group, a tert-butoxycaronylmethyl group, a ketal group represented by $-C(L_1)(L_2)-O-Z^2$, or an acetal group.

$L_1$ and $L_2$, which may be the same or different, each represents an atom or group selected from a hydrogen atom, an alkyl group, a cycloalkyl group, an aryl group and an aralkyl group.

$Z^2$ represents an alkyl group, a cycloalkyl group, an aryl group or an aralkyl group.

$Z^2$ and $L_1$ may combine together to form a 5- or 6-membered ring.

The 5- or 6-membered ring formed by combining $Z^2$ and $L_1$ together includes, for example, a tetrahydropyran ring and a tetrahydrofuran ring.

Examples of the alkyl group, cycloalkyl group, aryl group and aralkyl group in $L_1$, $L_2$ and $Z^2$ are the same as those of the alkyl group, cycloalkyl group, aryl group and aralkyl group in $B_1$.

Examples of the group having a group that decomposes by the action of an acid, of $A_1$ include an alkyl group, a cycloalkyl group and an aryl group each having an acid-decomposable group.

Examples of the arbitrary substituent of $S_1$ include a halogen atom, an alkyl group, a cycloalkyl group, an aryl group, an aralkyl group, an alkoxy group, an acyl group, $-OC(=O)Rf$, $-OC(=O)ORf$, $-C(=O)Rf$, $-C(=O)N(Rg)Rf$, $-N(Rg)C(=O)Rf$, $-N(Rg)C(=O)ORf$, $-N(Rg)SO_2Rf$, $-SRf$, $-SO_2Rf$, $-SO_3Rf$ and $-SO_2N(Rg)Rf$. In the formulae, Rf and Rg each independently represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

Examples of the alkyl group, cycloalkyl group, aryl group, aralkyl group, alkoxy group and acyl group in $S_1$ are the same as those of the alkyl group, cycloalkyl group, aryl group, aralkyl group, alkoxy group and acyl group in $B_1$.

The halogen atom in $S_1$ includes a fluorine atom, a chlorine atom, a bromine atom and an iodine atom and is preferably a fluorine atom.

Examples of the alkyl group, alkoxy group, acyl group, cycloalkyl group, aryl group and aralkyl group in Rf and Rg are the same as those in $B_1$.

Examples of the acyl group in the acyloxy group of Rf and Rg are the same as those of the acyl group in $B_1$.

Examples of the alkyl group contained in the alkyloxycarbonyl group and alkylcarbonyloxy group of Rf and Rg are the same as those of the alkyl group in $B_1$.

When a plurality of $S_1$'s are present, the plurality of $S_1$'s each independently represents an arbitrary substituent.

Specific examples of the repeating unit represented by formula (A1) are set forth below, but the present invention is not limited thereto.

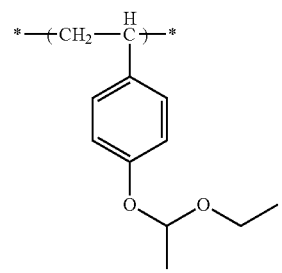

(H-1)

(H-2) 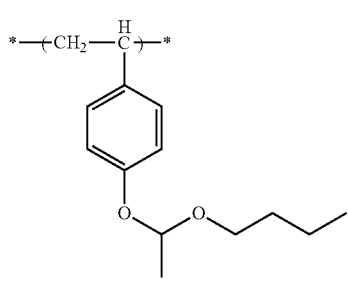
(H-3) 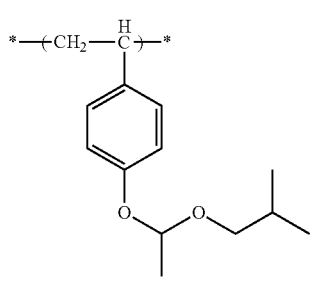
(H-4) 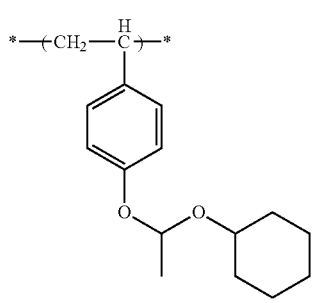
(H-5) 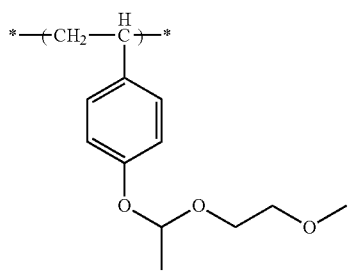
(H-6) 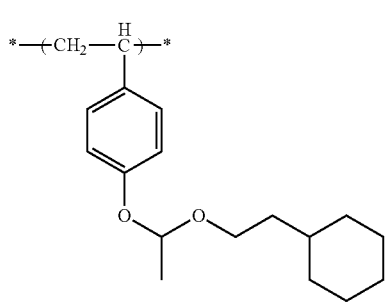
(H-7) 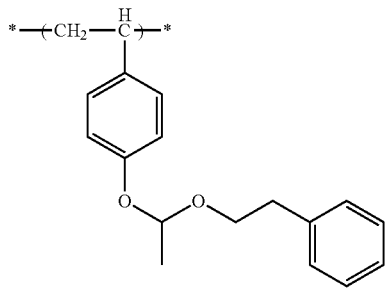
(H-8) 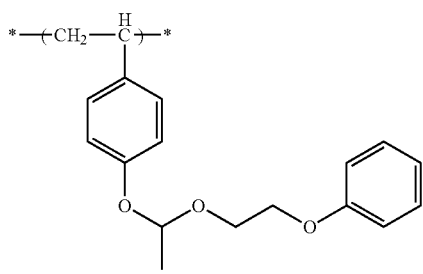
(H-9) 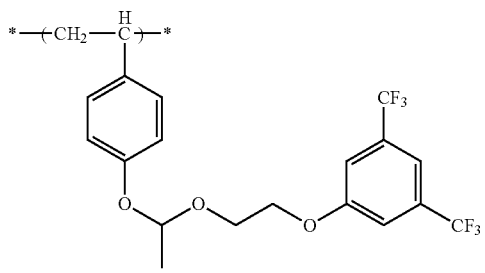
(H-10) 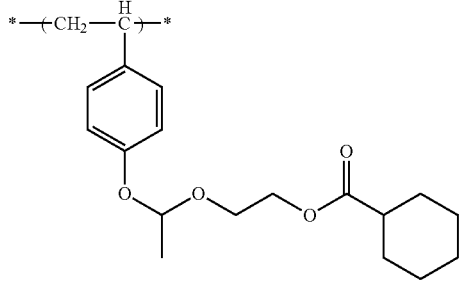
(H-11) 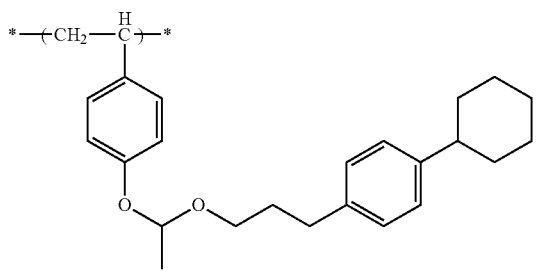

(H-12) 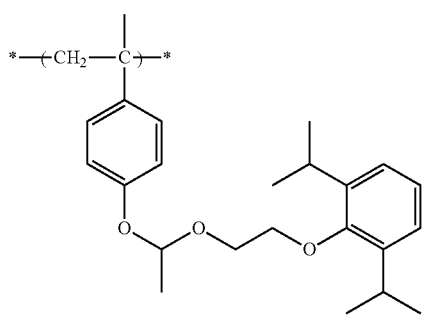
(H-13) 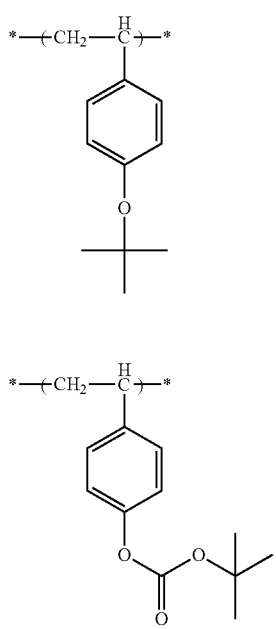
(H-14)
(H-15)
(H-16) 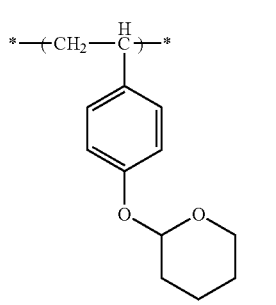
(H-17) 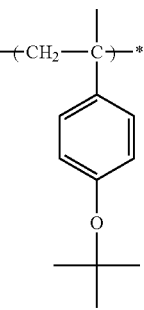
(H-18) 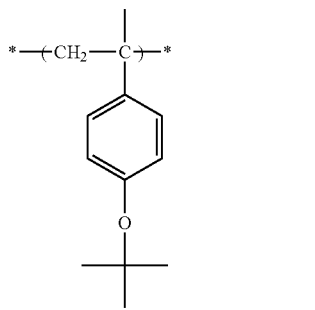
(H-19) 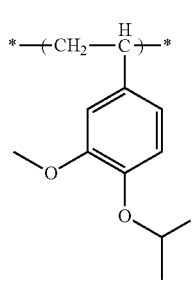
(H-20) 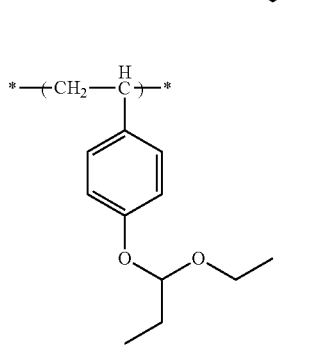
(H-21) 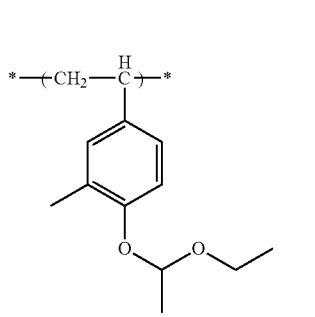

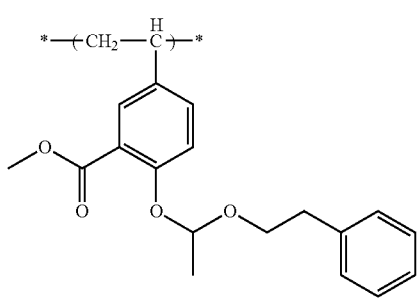
(H-22)

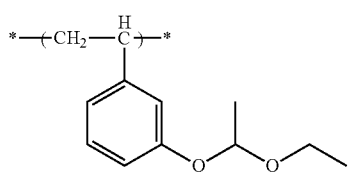
(H-23)

In formula (A2), examples of the group that leaves by the action of an acid, of $A_2$, are the same as those of the group that leaves by the action of an acid, described above for the acid-decomposable group, and the group is preferably a hydrocarbon group.

The hydrocarbon group is preferably a group having an alkyl group, a cycloalkyl group, an aryl group or an aralkyl group, more preferably a group having an alkyl group or a cycloalkyl group, still more preferably a group having an alkyl group. Examples of the alkyl group, cycloalkyl group, aryl group and aralkyl group in $A_2$ are the same as those in the group that leaves by the action of an acid.

Examples of the group having a group that decomposes by the action of an acid, of $A_2$ include an alkyl group, a cycloalkyl group and an aryl group each having an acid-decomposable group.

$B_2$ has the same meaning as $B_1$ in formula (A1).

$B_2$ is preferably a hydrogen atom or an alkyl group, and in the case of an alkyl group, more preferably a methyl group.

Formula (A2) is preferably represented by the following formula (A2'):

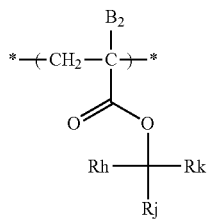
(A2')

In formula (A2'), Rh, Rk and Rj each independently represents a hydrogen atom, an alkyl group, a cycloalkyl group, an aryl group or an aralkyl group, and Rk and Rj may combine together to form a ring; and $B_2$ represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

In formula (A2'), examples of the alkyl group, cycloalkyl group, aryl group and aralkyl group in Rh, Rk and Rj are the same as those in the group that leaves by the action of an acid.

The ring formed by combining Rk and Rj together may be monocyclic or polycyclic. The monocyclic ring is preferably a cycloalkane structure having a carbon number of 3 to 8, and examples thereof include a cyclopropane structure, a cyclobutane structure, a cyclopentane structure, a cyclohexane structure, a cycloheptane structure and a cyclooctane structure. The polycyclic ring is preferably a cycloalkane structure having a carbon number of 6 to 20, and examples thereof include an adamantane structure, a norbornane structure, a dicyclopentane structure, a tricyclodecane structure and a tetracyclododecane structure. Incidentally, a part of the carbon atom in the cycloalkane structure may be substituted by a heteroatom such as oxygen atom.

Rh, Rk and Rj each is preferably an alkyl group or a cycloalkyl group.

It is preferred that Rh is an alkyl group and Rk and Rj combine together to form a ring.

It is preferred that Rh is a hydrogen atom, Rk is an aryl group and Rj is an alkyl group, a cycloalkyl group or an aryl group.

$B_2$ in formula (A2') has the same meaning as $B_2$ in formula (A2).

Specific examples of the repeating unit represented by formula (A2) are set forth below, but the present invention is not limited thereto.

(I-1)

(I-2)

(I-3)

(I-4)

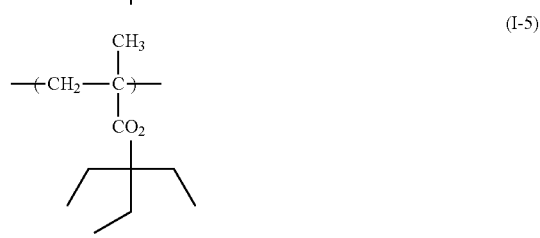
(I-5)

(I-6) 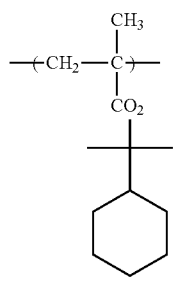
(I-7) 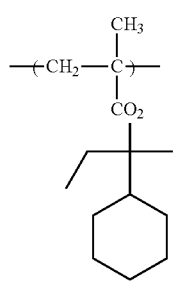
(I-8) 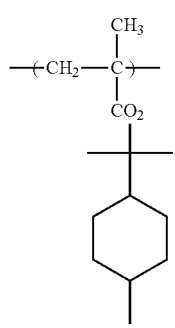
(I-9) 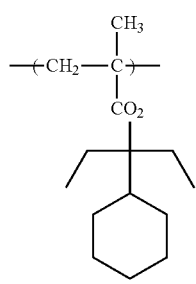
(I-10) 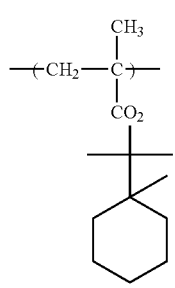
(I-11) 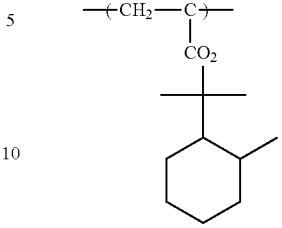
(I-12) 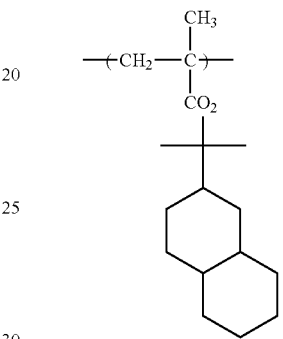
(I-13) 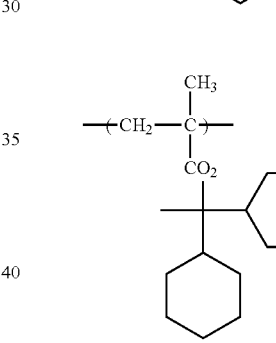
(I-14) 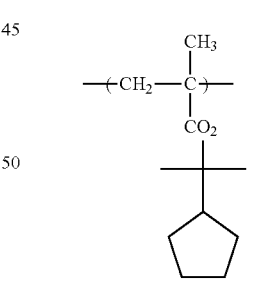
(I-15) 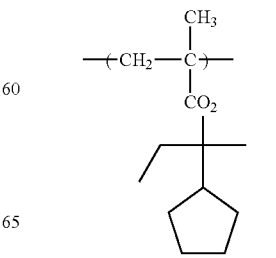

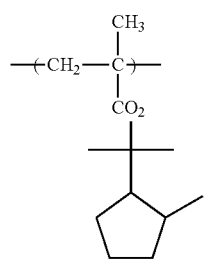 (I-16)
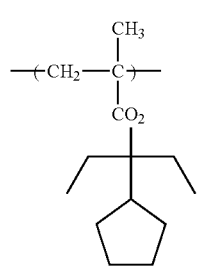 (I-17)
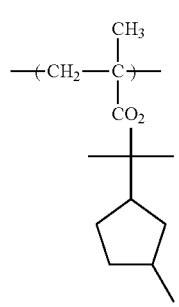 (I-18)
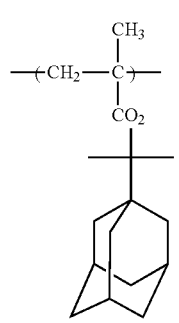 (I-19)
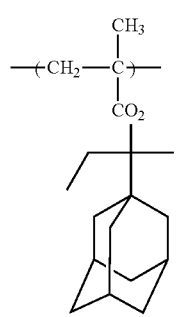 (I-20)
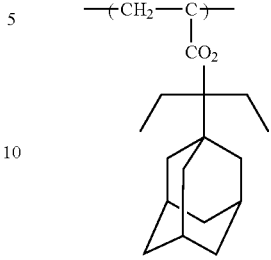 (I-21)
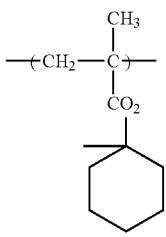 (I-22)
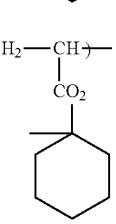 (I-23)
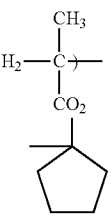 (I-24)
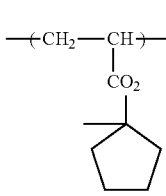 (I-25)
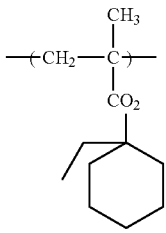 (I-26)
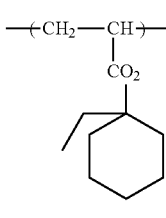 (I-27)

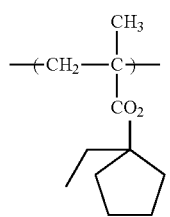 (I-28)
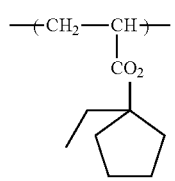 (I-29)
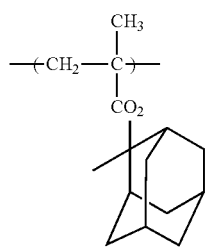 (I-30)
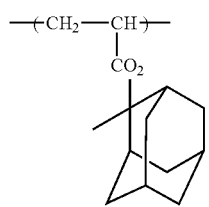 (I-31)
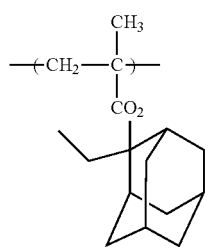 (I-32)
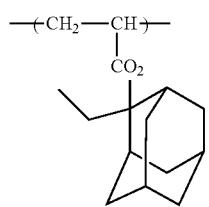 (I-33)
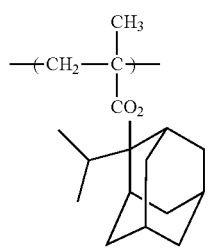 (I-34)
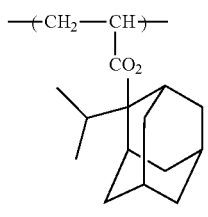 (I-35)
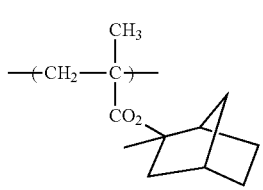 (I-36)
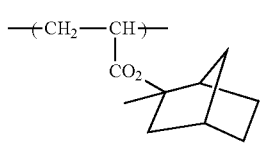 (I-37)
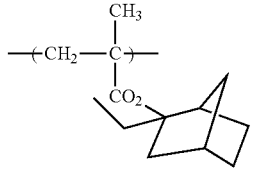 (I-38)
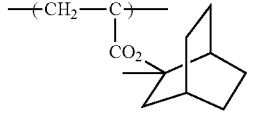 (I-39)
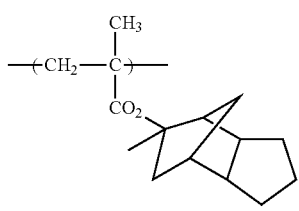 (I-40)
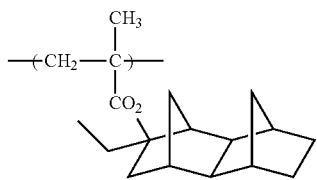 (I-41)
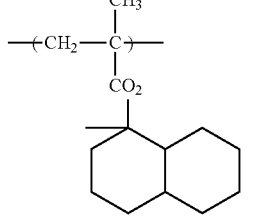 (I-42)

(I-43) 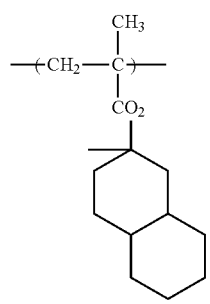
(I-44) 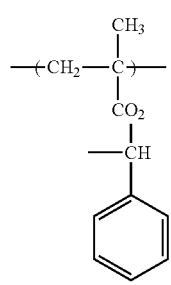
(I-45) 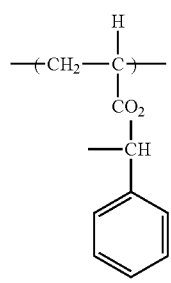
(I-46) 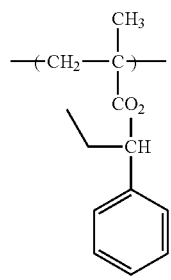
(I-47) 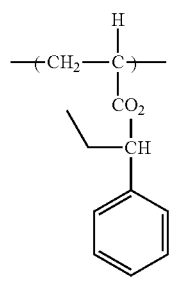
(I-48) 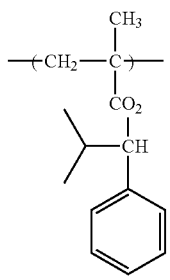
(I-49) 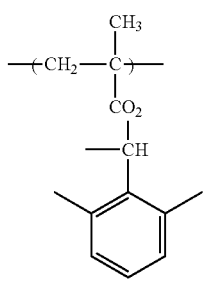
(I-50) 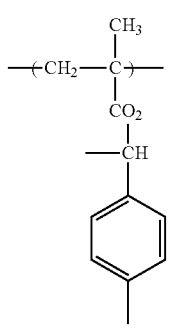
(I-51) 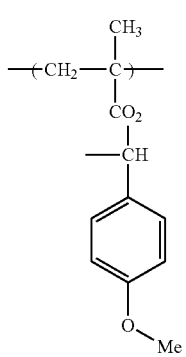
(I-52) 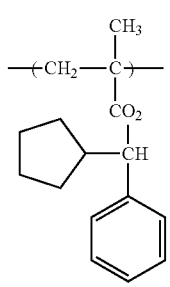

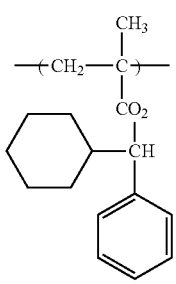
(I-53)

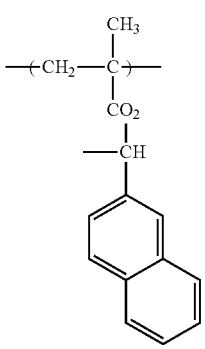
(I-54)

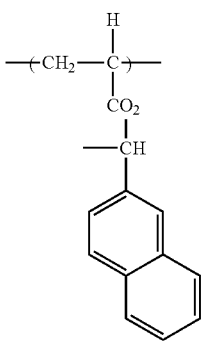
(I-55)

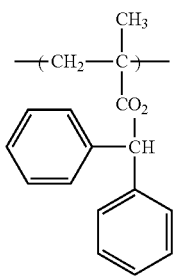
(I-56)

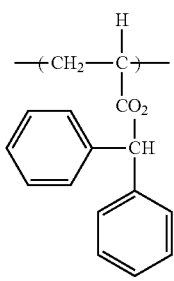
(I-57)

In the resin (A), in addition, styrene (which may be substituted by an alkyl group, a halogen atom, an alkylthio group, a sulfonyl group or an ester group), vinylnaphthalene (which may be substituted by an alkyl group, a halogen atom, an alkylthio group, a sulfonyl group or an ester group), vinylanthracene (which may be substituted by an alkyl group, a halogen atom, an alkylthio group, a sulfonyl group or an ester group), acrylamides, methacrylamides, an allyl compound, vinyl ethers, vinyl esters or the like, may be copolymerized.

In the resin (A), for maintaining good developability in an alkali developer, another appropriate polymerizable monomer may be copolymerized so that an alkali-soluble group such as phenolic hydroxyl group and carboxyl group can be introduced, or for enhancing the film property, another hydrophobic polymerizable monomer such as alkyl acrylate and alkyl methacrylate may be copolymerized.

In particular, for use with KrF, EB or EUV, the resin (A) preferably has a repeating unit represented by the following formula (IIIa):

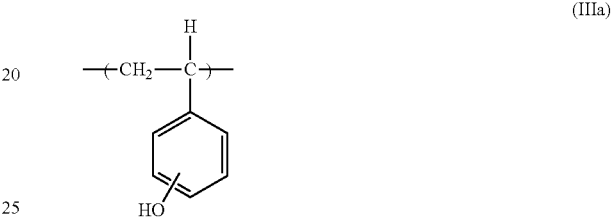
(IIIa)

The resin (A) more preferably has a repeating unit represented by the following formula (IIIb):

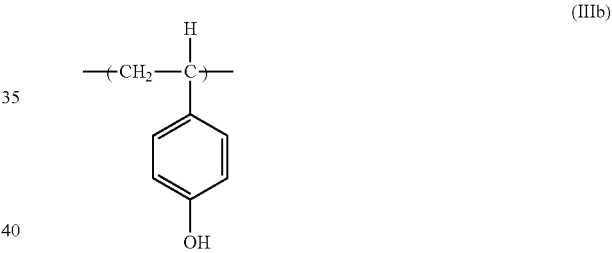
(IIIb)

The content of the repeating unit represented by formula (IIIa) is preferably from 10 to 90 mol %, more preferably from 50 to 90 mol %, still more preferably from 60 to 80 mol %, based on all repeating units in the polymer.

In the resin (A), for adjusting the hydrophilicity or hydrophobicity, a methacrylate or acrylate having a hydrophilic group such as alkyleneoxy group and lactone group may be copolymerized.

Examples of the alkyleneoxy group include an ethyleneoxy group, a propyleneoxy group, a butyleneoxy group and a pentyleneoxy group.

As for the lactone group, any group may be used as long as it has a lactone structure, but a group having a 5- to 7-membered ring lactone structure is preferred, and the 5- to 7-membered ring lactone structure is preferably condensed with another ring structure in the form of forming a bicyclo or spiro structure. It is more preferred to contain a repeating unit having a lactone structure represented by any one of the following formulae (LC1-1) to (LC1-16). The lactone structure may be bonded directly to the main chain. Among these lactone structures, preferred are (LC1-1), (LC1-4), (LC1-5), (LC1-6), (LC1-13) and (LC1-14). By virtue of using a specific lactone structure, the line width roughness and development defect are improved.

LC1-1 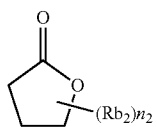
LC1-2 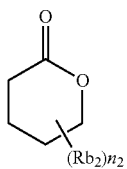
LC1-3 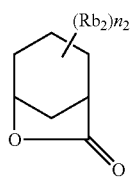
LC1-4 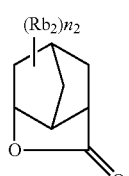
LC1-5 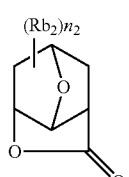
LC1-6 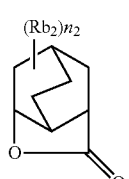
LC1-7 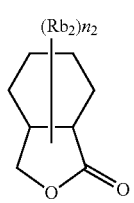
LC1-8 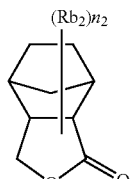
LC1-9 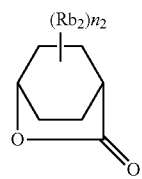
LC1-10 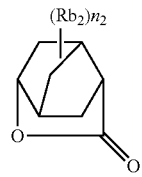
LC1-11 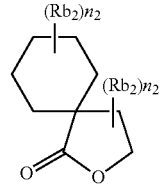
LC1-12 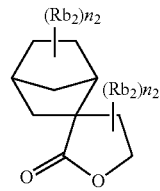
LC1-13 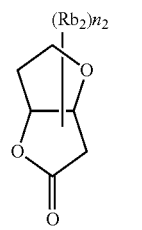
LC1-14 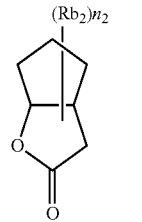
LC1-15 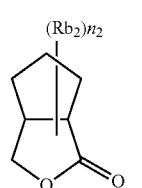
LC1-16 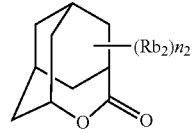
The lactone structure moiety may or may not have a substituent ($Rb_2$). Preferred examples of the substituent ($Rb_2$)

include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Of these, an alkyl group having a carbon number of 1 to 4, a cyano group and an acid-decomposable group are more preferred. $n_2$ represents an integer of 0 to 4. When $n_2$ is an integer of 2 or more, the plurality of substituents ($Rb_2$) may be the same or different and also, the plurality of substituents ($Rb_2$) may combine together to form a ring.

The repeating unit having a lactone structure represented by any one of formulae (LC1-1) to (LC1-16) includes a repeating unit represented by the following formula (AII):

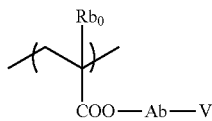

(AII)

In formula (AII), $Rb_0$ represents a hydrogen atom, a halogen atom or an alkyl group having a carbon number of 1 to 4. Preferred examples of the substituent which the alkyl group of $Rb_0$ may have include a hydroxyl group and a halogen atom.

The halogen atom of $Rb_0$ includes a fluorine atom, a chlorine atom, a bromine atom and an iodine atom.

$Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent group comprising a combination thereof, and is preferably a single bond or a divalent linking group represented by -$Ab_1$-$CO_2$—. $Ab_1$ represents a linear or branched alkylene group or a monocyclic or polycyclic cycloalkylene group and is preferably a methylene group, an ethylene group, a cyclohexylene group, an adamantylene group or a norbornylene group.

V represents a group having a structure represented by any one of formulae (LC1-1) to (LC1-16).

The repeating unit having a lactone group usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

The content of the repeating unit having a lactone group is preferably from 15 to 60 mol %, more preferably from 20 to 50 mol %, still more preferably from 30 to 50 mol %, based on all repeating units in the polymer.

Specific examples of the repeating unit having a lactone group are set forth below, but the present invention is not limited thereto.

(In the formulae, Rx is H, $CH_3$, $CH_2OH$ or $CF_3$.)

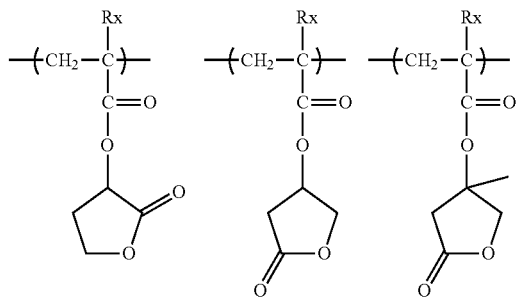

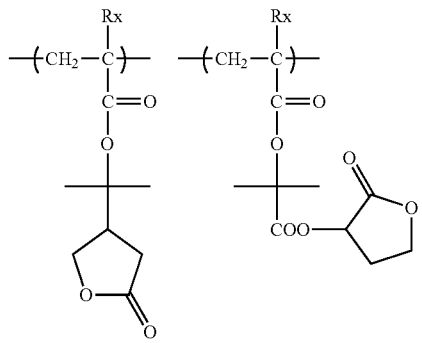

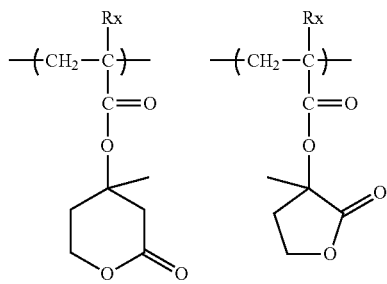

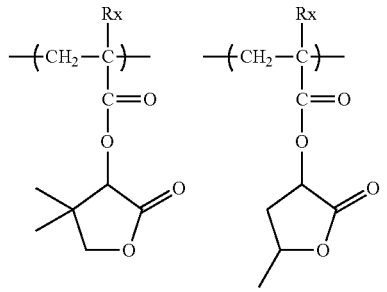

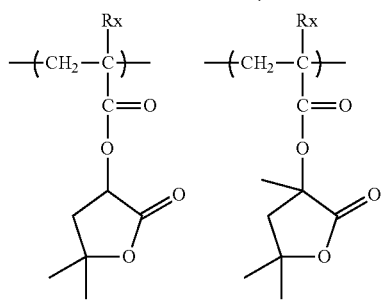

-continued
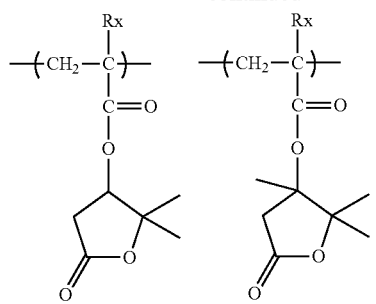
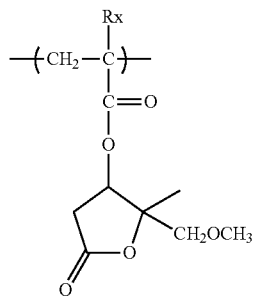
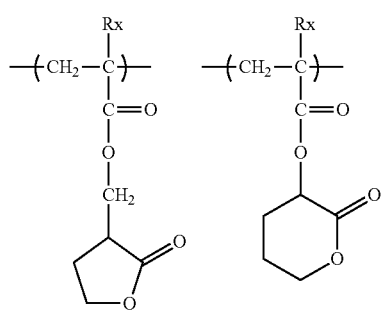
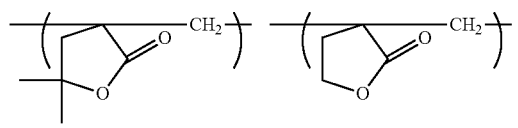
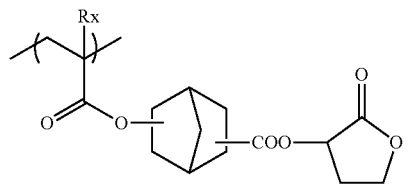
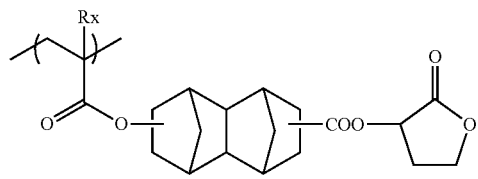
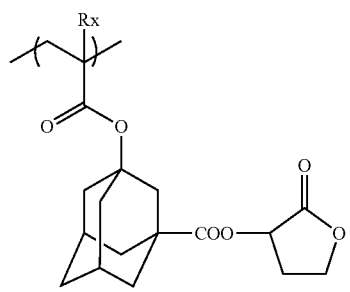
-continued
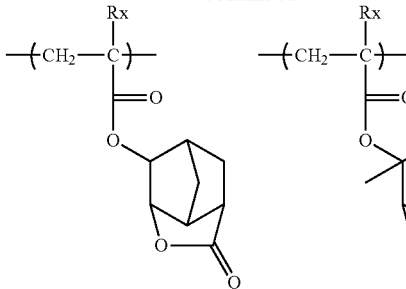
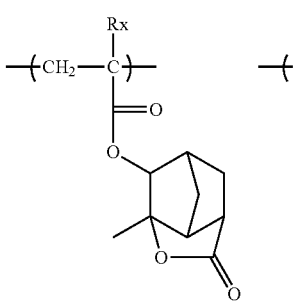
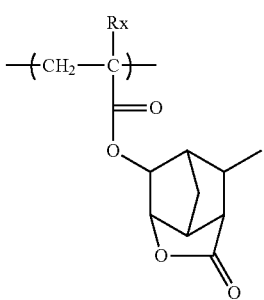
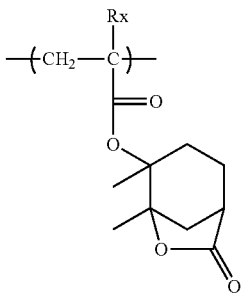
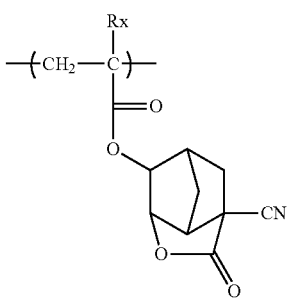

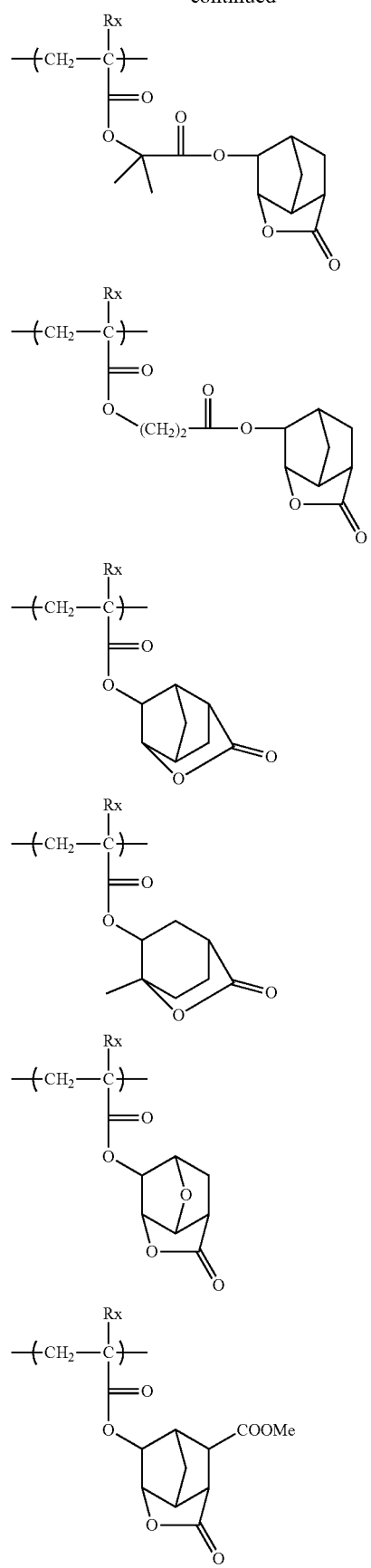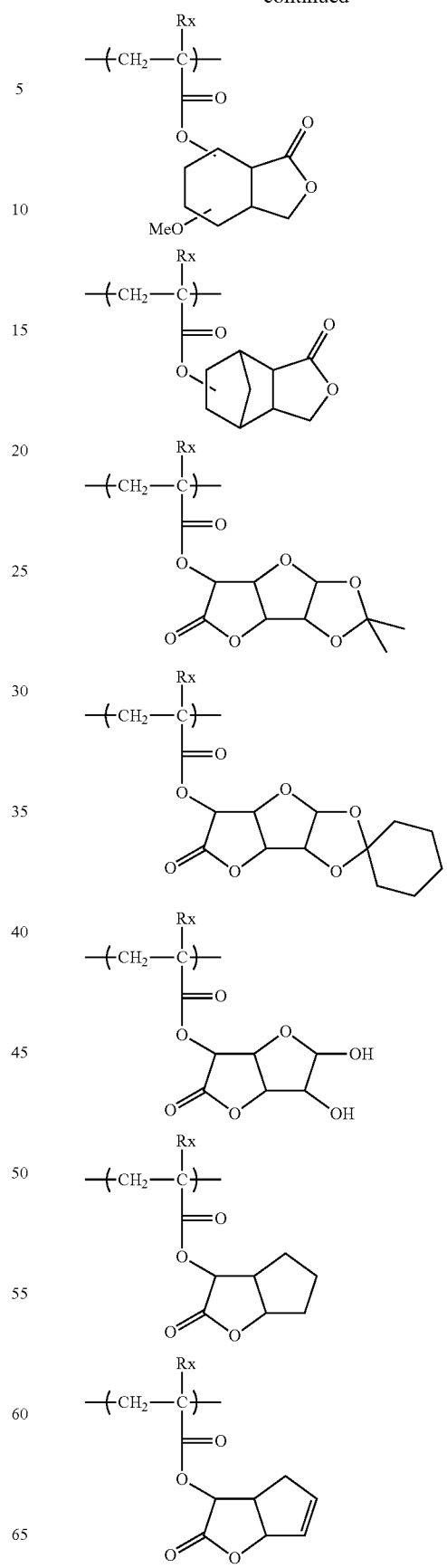

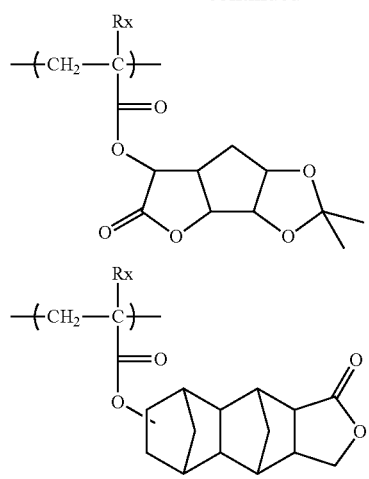
(In the formulae, Rx is H, CH₃, CH₂OH or CF₃.)
(In the formulae, Rx is H, CH₃, CH₂OH or CF₃.)
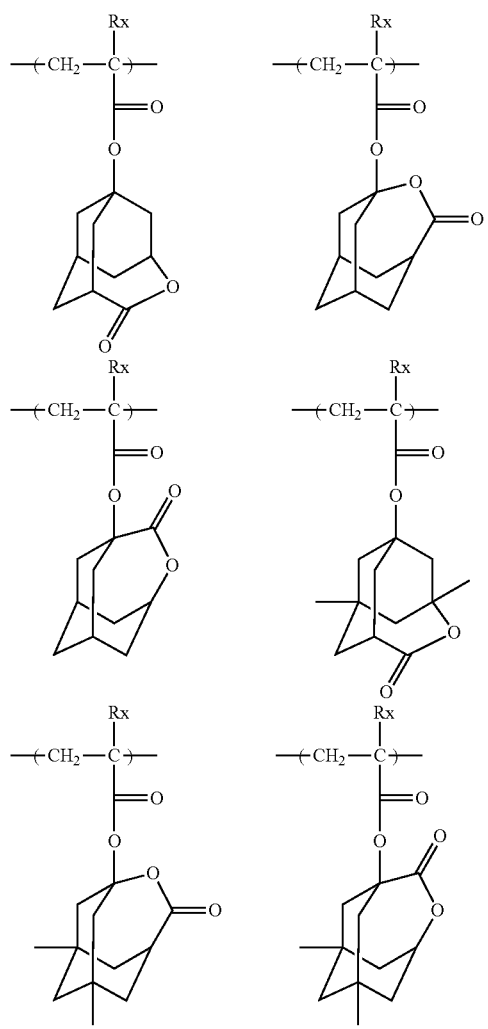
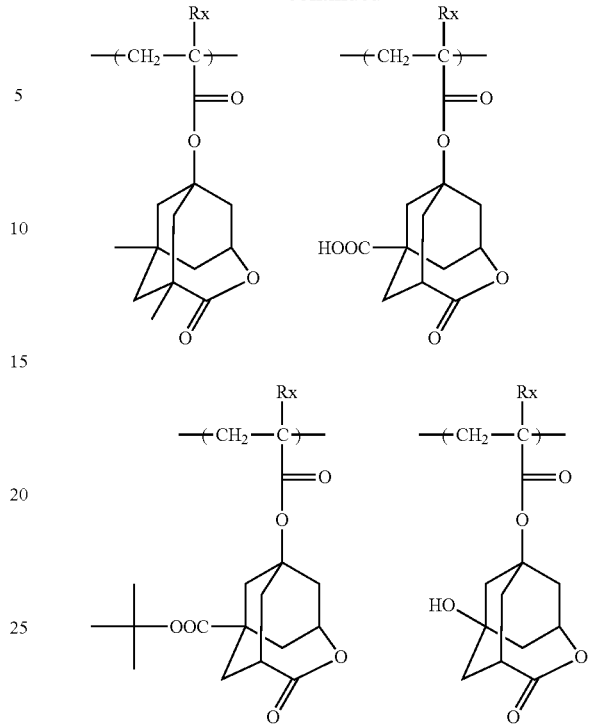
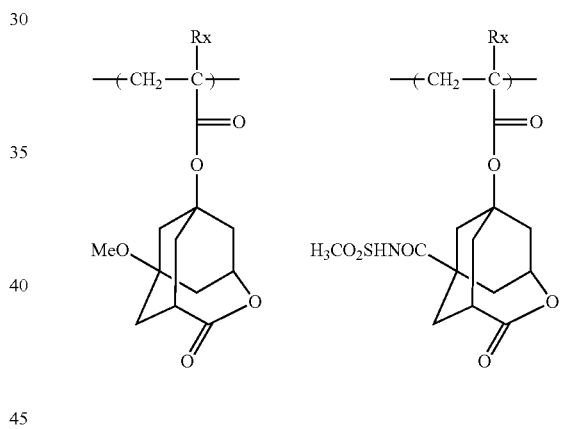
Particularly preferred repeating units having a lactone group are the repeating units shown below. By selecting an optimal lactone group, the pattern profile and iso/dense bias are improved.
(In the formulae, Rx is H, CH₃, CH₂OH or CF₃.)
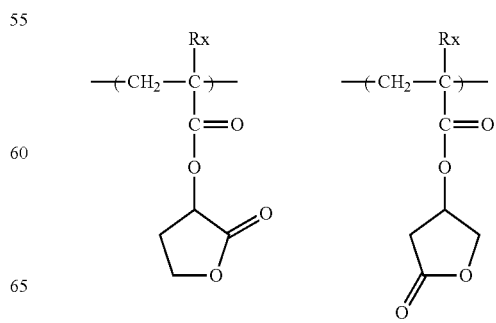

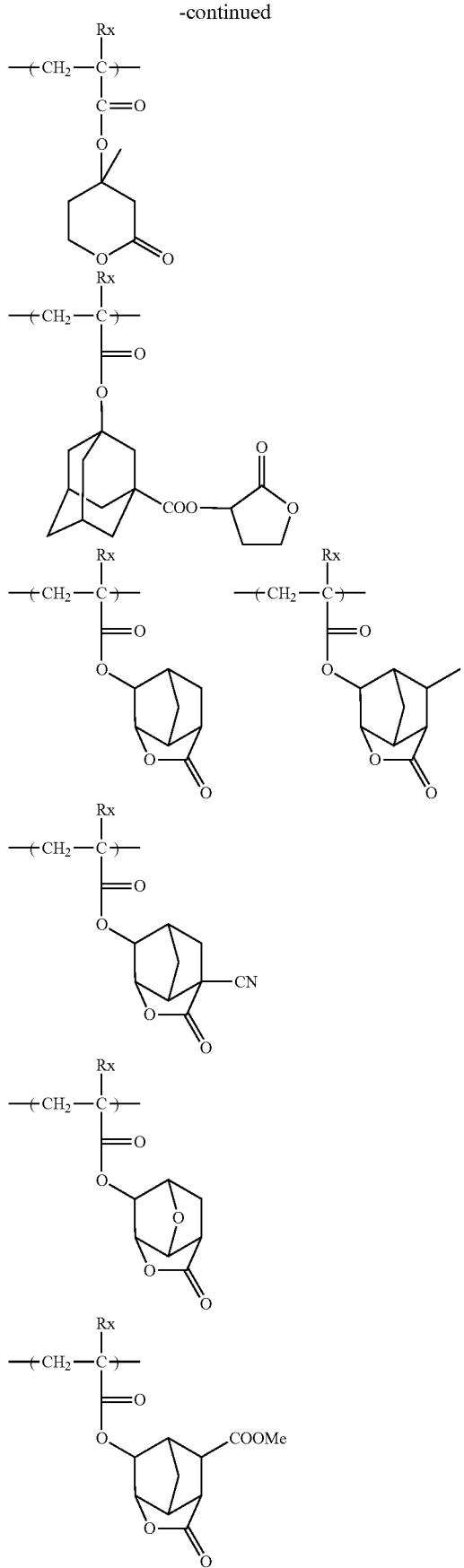

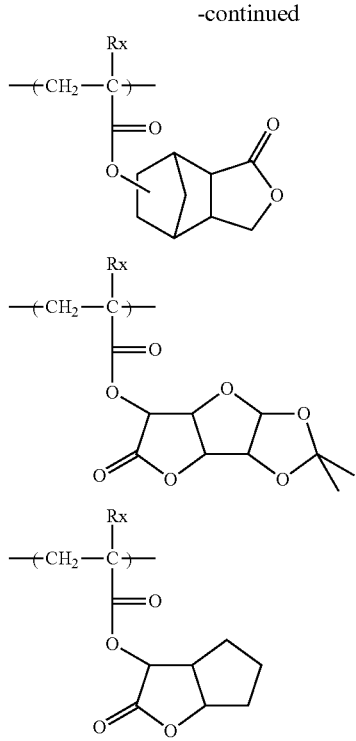

The resin (A) preferably contains a repeating unit having a hydroxyl group or a cyano group.

The repeating unit having a hydroxyl group or a cyano group is preferably a repeating unit having an alicyclic hydrocarbon structure substituted by a hydroxyl group or a cyano group. The alicyclic hydrocarbon structure in the alicyclic hydrocarbon structure substituted by a hydroxyl group or a cyano group is preferably an adamantyl group, a diamantyl group or a norbornane group. The alicyclic hydrocarbon structure substituted by a hydroxyl group or a cyano group is preferably a partial structure represented by any one of the following formulae (VIIa) to (VIId):

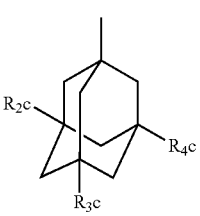
(VIIa)

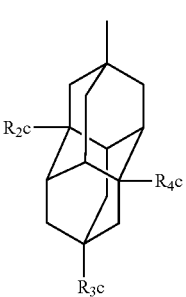
(VIIb)

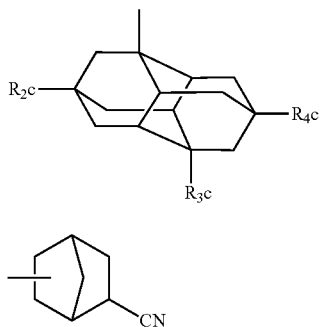
(VIIc)

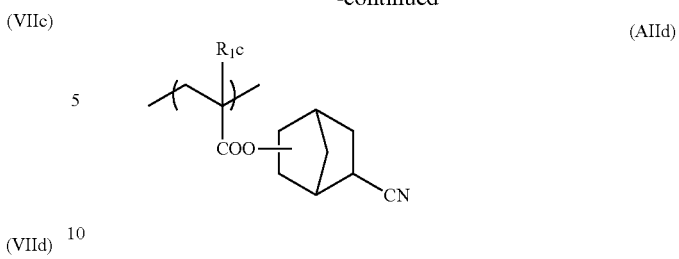
(VIId)

In formulae (VIIa) to (VIIe), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. A structure where one or two members out of $R_{2c}$ to $R_{4c}$ are a hydroxyl group with the remaining being a hydrogen atom is preferred. In formula (VIIa), it is more preferred that two members out of $R_{2c}$ to $R_{4c}$ are a hydroxyl group and the remaining is a hydrogen atom.

The repeating unit having a partial structure represented by any one of formulae (VIIa) to (VIId) includes repeating units represented by the following formulae (AIIa) to (AIId).

In formulae (AIIa) to (AIId), $R_{1c}$ represents a hydrogen atom, a methyl group, a trifluoromethyl group or a hydroxymethyl group.

$R_{2c}$ to $R_{4c}$ have the same meanings as $R_{2c}$ to $R_{4c}$ in formulae (VIIa) to (VIIc).

The content of the repeating unit having an alicyclic hydrocarbon structure substituted by a hydroxyl group or a cyano group is preferably from 5 to 40 mol %, more preferably from 5 to 30 mol %, still more preferably from 10 to 25 mol %, based on all repeating units in the polymer.

Specific examples of the repeating unit having a hydroxyl group or a cyano group are set forth below, but the present invention is not limited thereto.

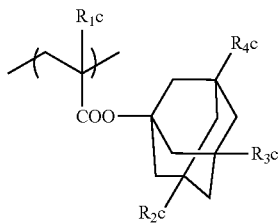
(AIIa)

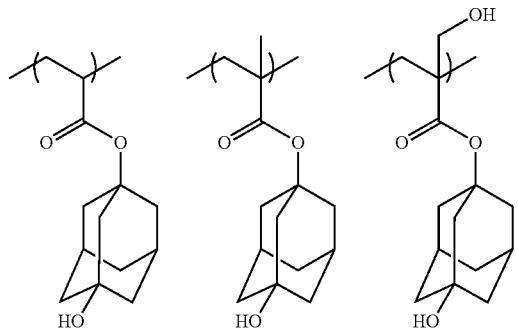

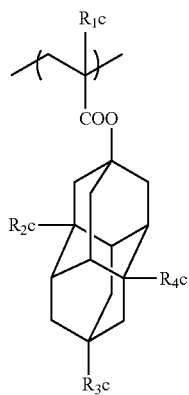
(AIIb)

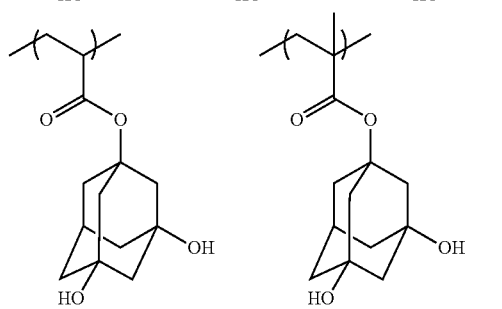

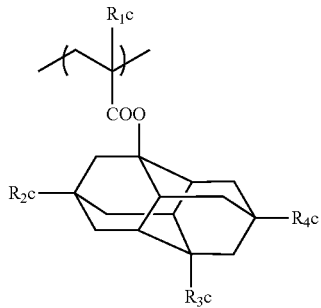
(AIIc)

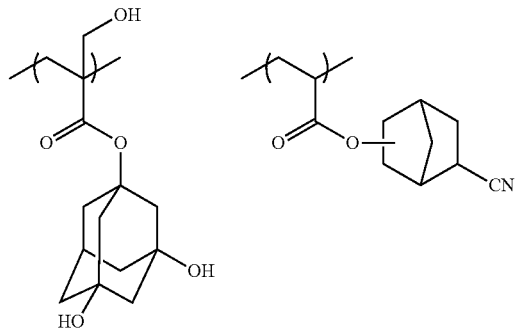

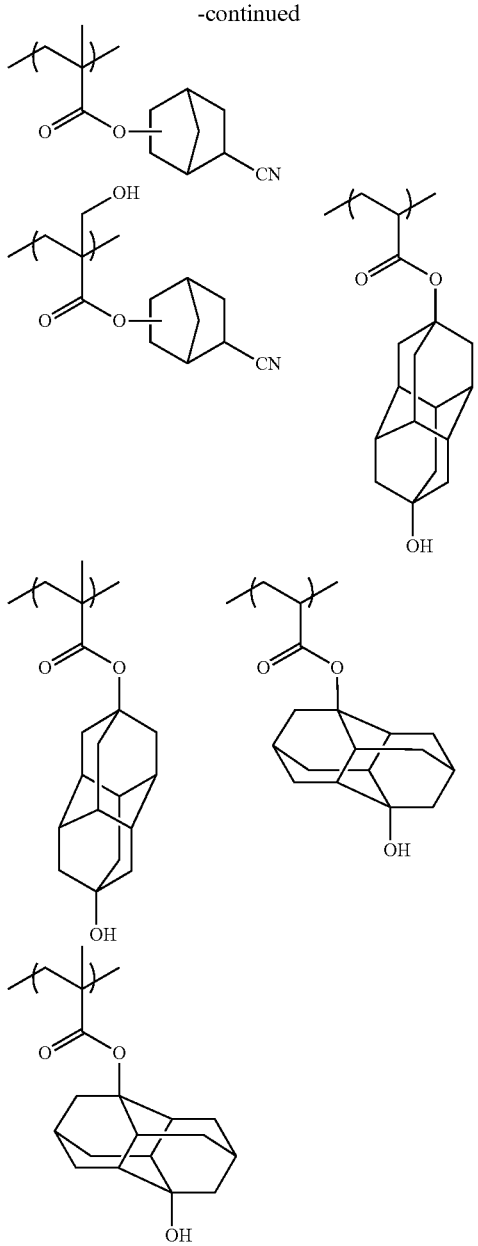

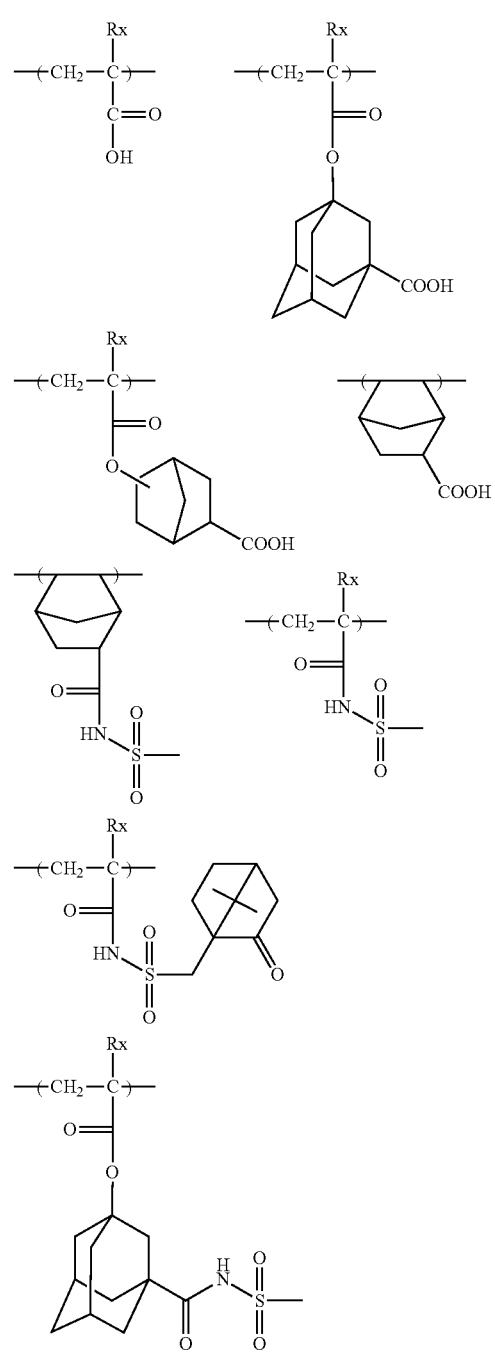

The resin (A) preferably contains a repeating unit having an alkali-soluble group.

The alkali-soluble group includes a carboxyl group, a sulfonamide group, a sulfonylimide group, a bisulfonylimide group, and an aliphatic alcohol with the α-position being substituted by an electron-withdrawing group, such as hexafluoroisopropanol group. A repeating unit having a carboxyl group is more preferred. By virtue of containing a repeating unit having an alkali-soluble group, the resolution increases in the usage of forming contact holes. As for the repeating unit having an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred. The linking group may have a monocyclic or polycyclic cyclohydrocarbon structure. In particular, a repeating unit by an acrylic acid or a methacrylic acid is preferred.

The content of the repeating unit having an alkali-soluble group is preferably from 1 to 20 mol %, more preferably from 3 to 15 mol %, still more preferably from 5 to 10 mol %, based on all repeating units in the polymer.

Specific examples of the repeating unit having an alkali-soluble group are set forth below, but the present invention is not limited thereto.

(In the formulae, Rx is H, $CH_3$, $CF_3$ or $CH_2OH$.)

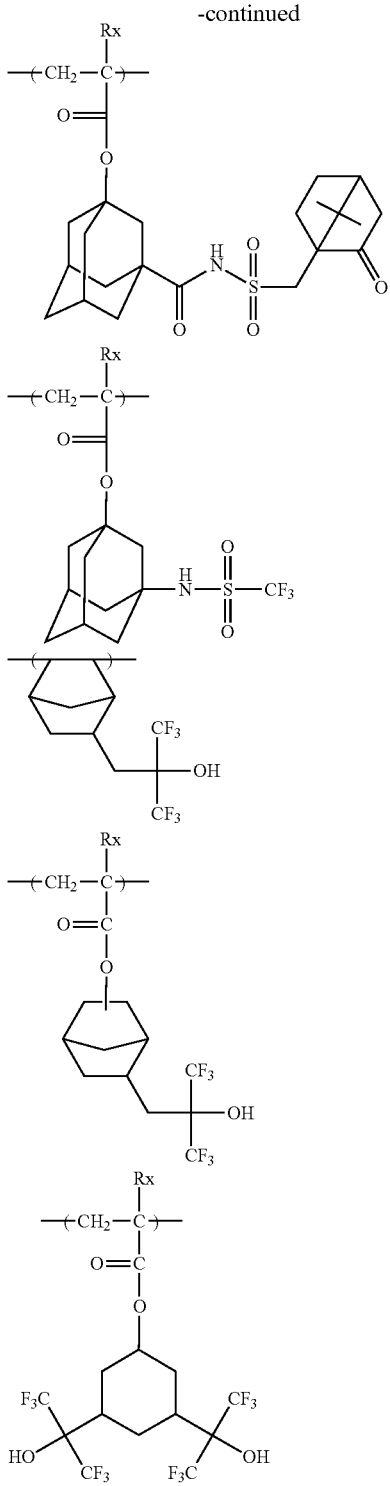

-continued

The repeating unit having at least one kind of a group selected from a lactone group, a hydroxyl group, a cyano group and an alkali-soluble group is more preferably a repeating unit having at least two groups selected from a lactone group, a hydroxyl group, a cyano group and an alkali-soluble group, still more preferably a repeating unit having a cyano group and a lactone group, yet still more preferably a repeat-ing unit having a structure where a cyano group is substituted to the lactone structure of (LCI-4) above.

The resin (A) may further contain a repeating unit having an alicyclic hydrocarbon structure and not exhibiting acid decomposability. By containing such a repeating unit, the dissolving out of low molecular components from the resist film to the immersion liquid at the immersion exposure can be reduced. Examples of such a repeating unit include repeating units by 1-adamantyl (meth)acrylate, diamantyl (meth)acrylate, tricyclodecanyl (meth)acrylate and cyclohexyl (meth)acrylate.

The resin (A) may further contain, in addition to the above-described repeating units, various repeating structural units for the purpose of controlling dry etching resistance, suitability for standard developer, adherence to substrate, resist profile and properties generally required of the resist, such as resolution, heat resistance and sensitivity.

Examples of such a repeating structural unit include, but are not limited to, repeating structural units corresponding to the monomers described below.

By virtue of such a repeating structural unit, the performance required of the resin (A), particularly, (1) solubility in coating solvent, (2) film-forming property (glass transition point), (3) alkali developability, (4) film loss (selection of hydrophilic, hydrophobic or alkali-soluble group), (5) adherence of unexposed area to substrate, (6) dry etching resistance and the like, can be subtly controlled.

Examples of such a monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the resin (A), the molar ratio of respective repeating structural units contained is appropriately determined to control the dry etching resistance of resist, suitability for standard developer, adherence to substrate, resist profile and performances generally required of the resist, such as resolution, heat resistance and sensitivity.

In the case of use for KrF, electron beam, X-ray or EUV exposure, the resin (A) preferably has a repeating unit represented by formula (A1).

In the case of use for KrF, electron beam, X-ray or EUV exposure, the resin (A) preferably has a hydroxystyrene repeating unit represented. The resin is more preferably a copolymer having a hydroxystyrene repeating unit/a hydroxystyrene repeating unit protected by an acid-decomposable group, or a copolymer having a hydroxystyrene repeating unit/a (meth)acrylic acid ester repeating unit protected by an acid-decomposable group.

Specific examples of the Resin (A) for KrF, electron beam, X-ray or EUV exposure are set forth below, but the present invention is not limited thereto.

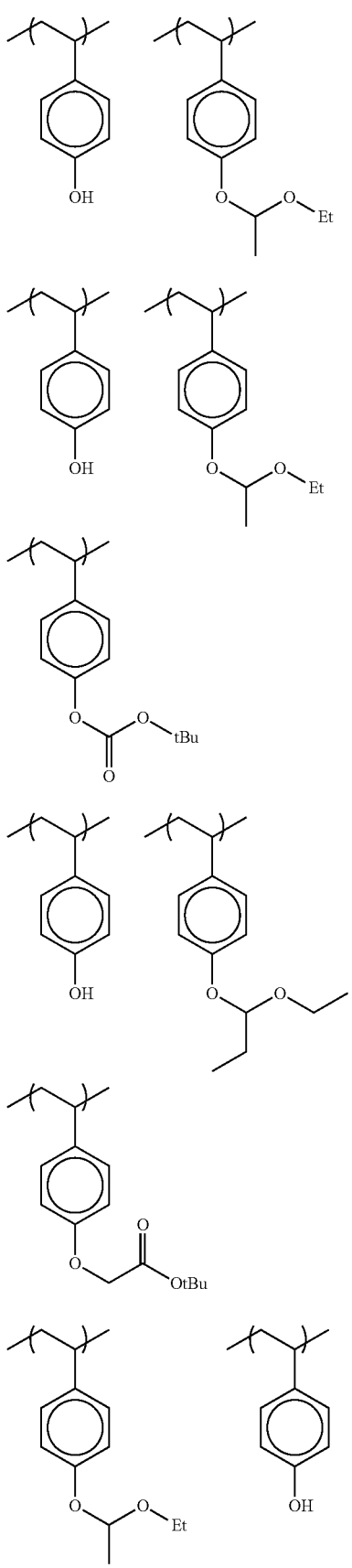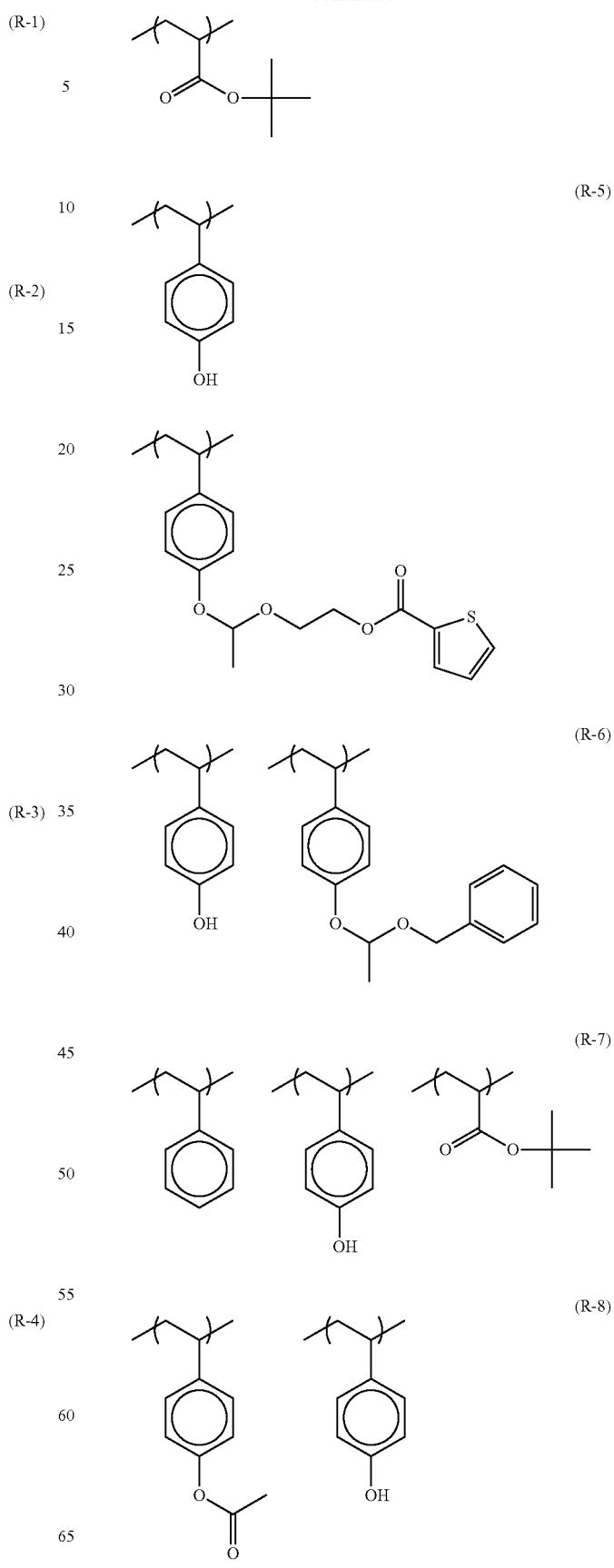

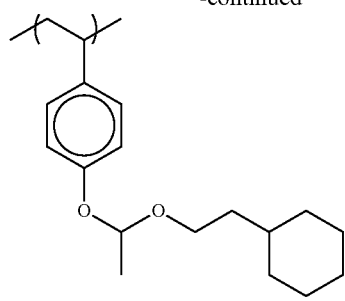
(R-9)
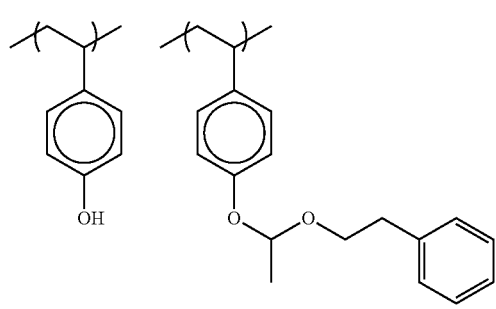
(R-10)
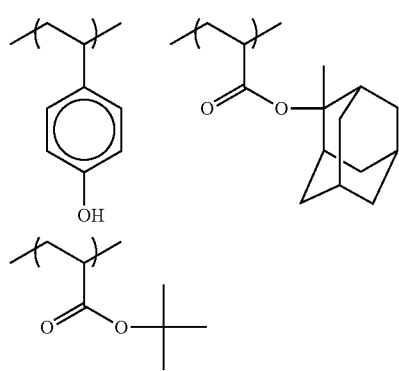
(R-11)
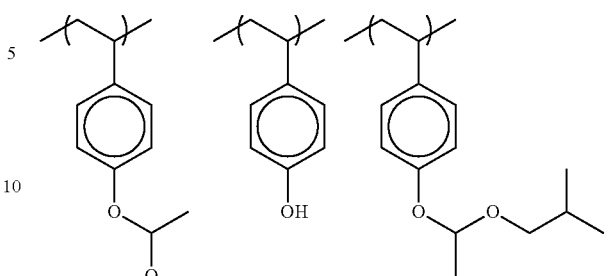
(R-12)
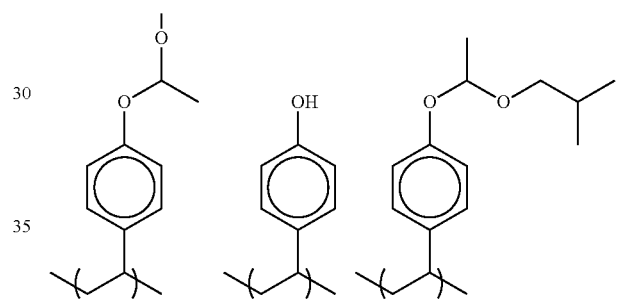
(R-13)
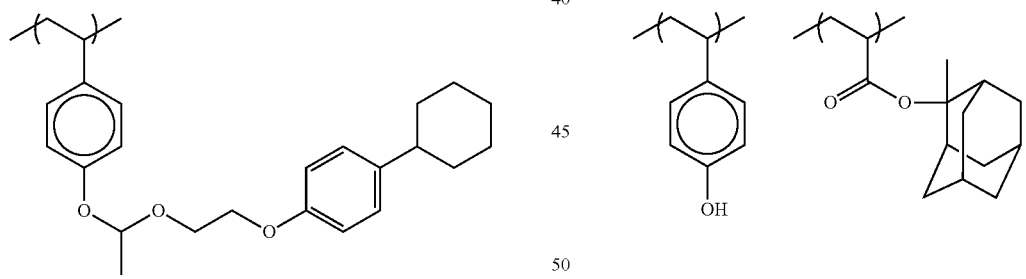
(R-14)

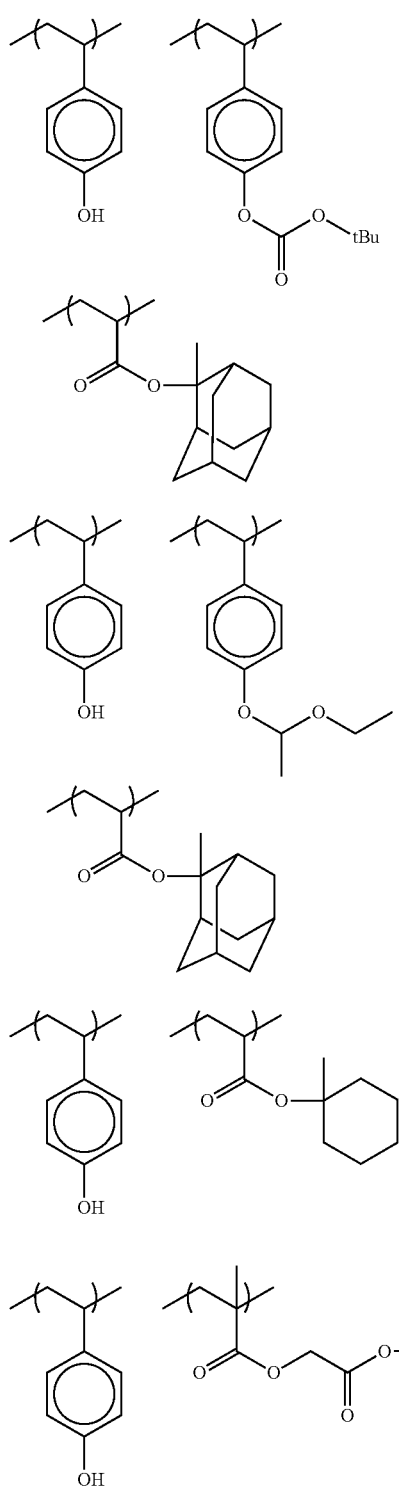

In specific examples above, tBu indicates a tert-butyl group.

In the case of use for ArF exposure, the resin (A) preferably has a repeating unit represented by formula (A2).

In the case of using the resist composition of the present invention for ArF exposure, the resin (A) preferably has no aromatic group in view of transparency to ArF light.

In use for ArF exposure, the resin (A) is preferably a resin obtained by copolymerizing a methacrylate or acrylate having a hydrophilic group such as lactone.

Specific examples of the resin (A) for use with ArF are set forth below, but the present invention is not limited thereto.

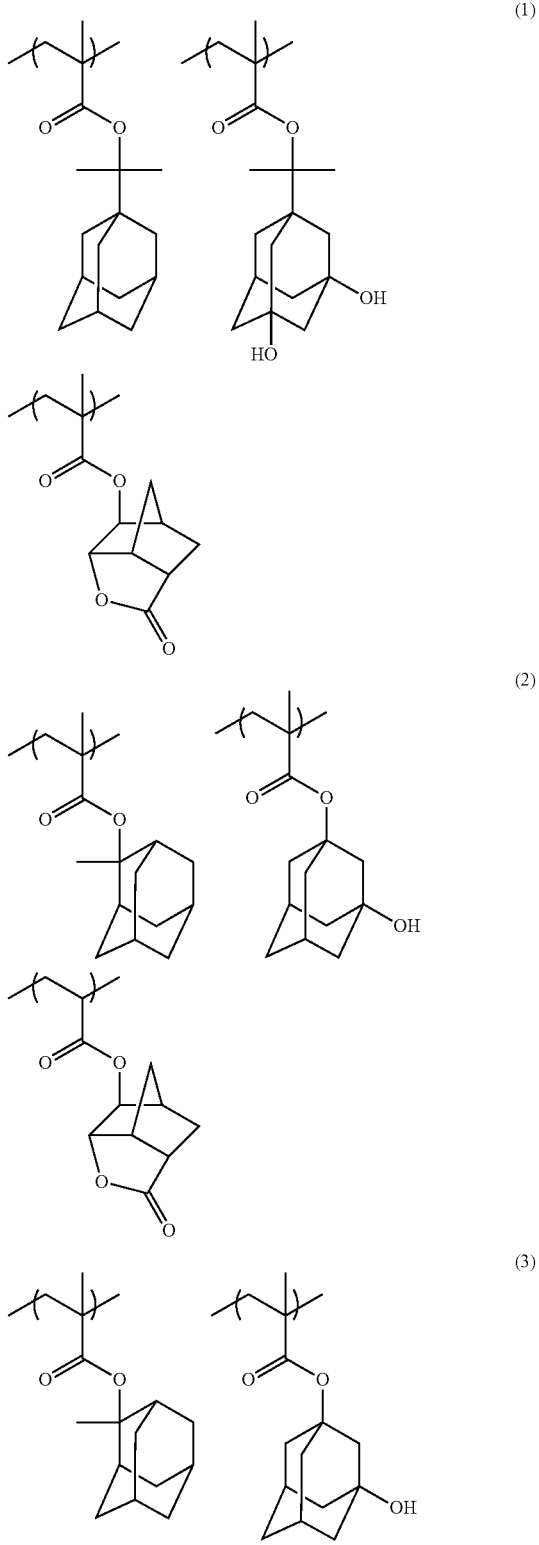

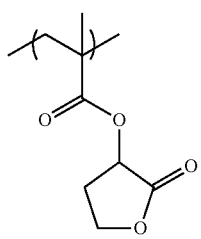
(4)
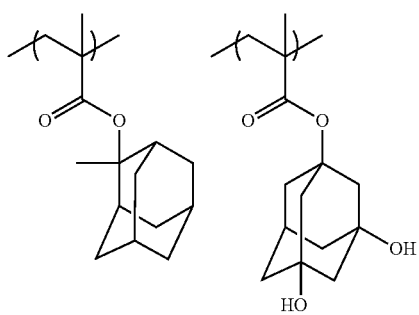
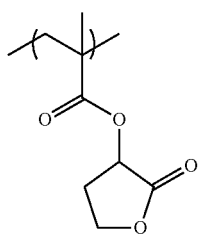
(5)
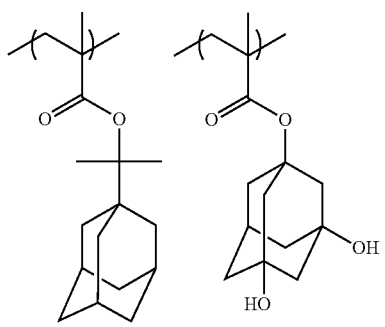
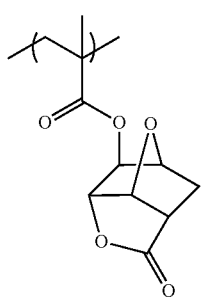
(6)
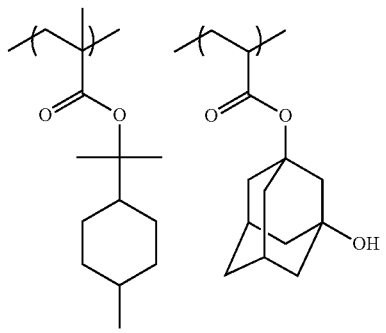
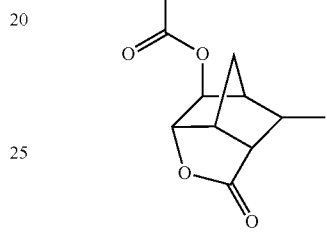
(7)
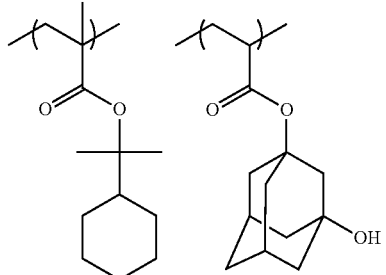
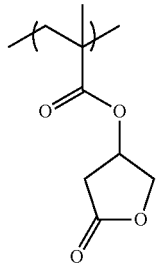
(8)
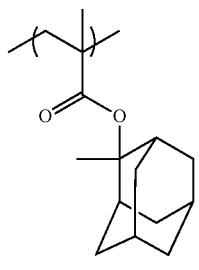

-continued
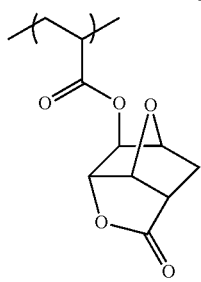
(9)
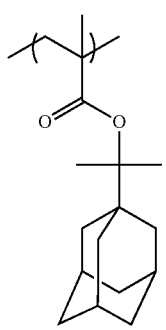
(10)
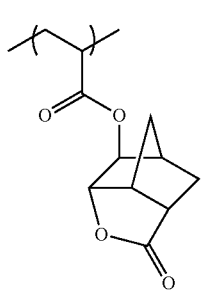
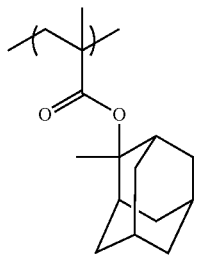
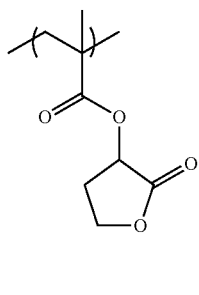
-continued
(11)
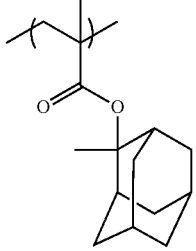
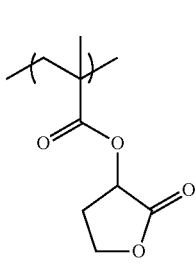
(12)
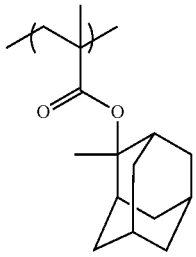
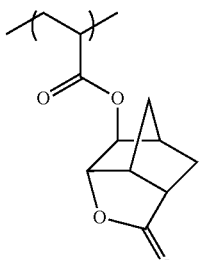
(13)
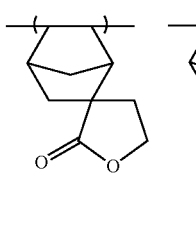

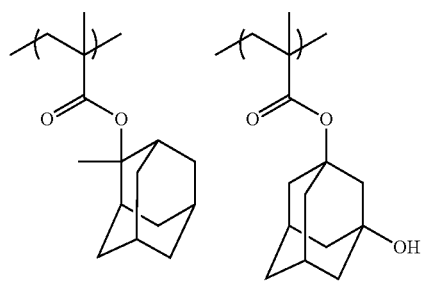
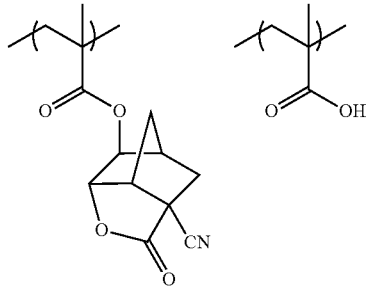
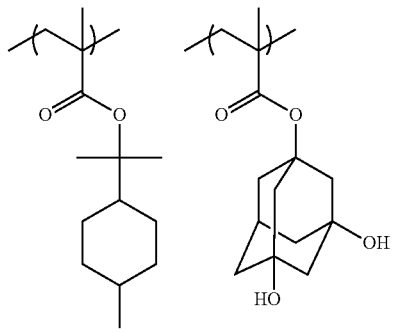
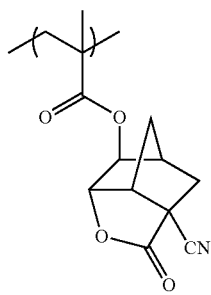
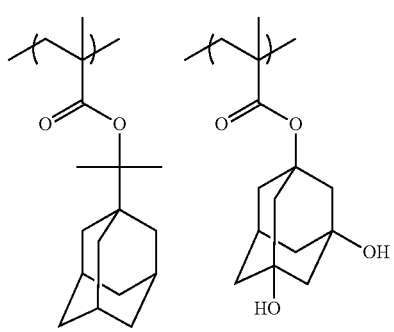
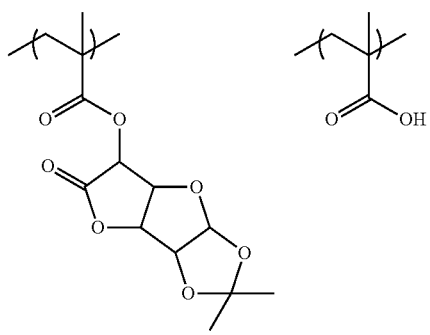

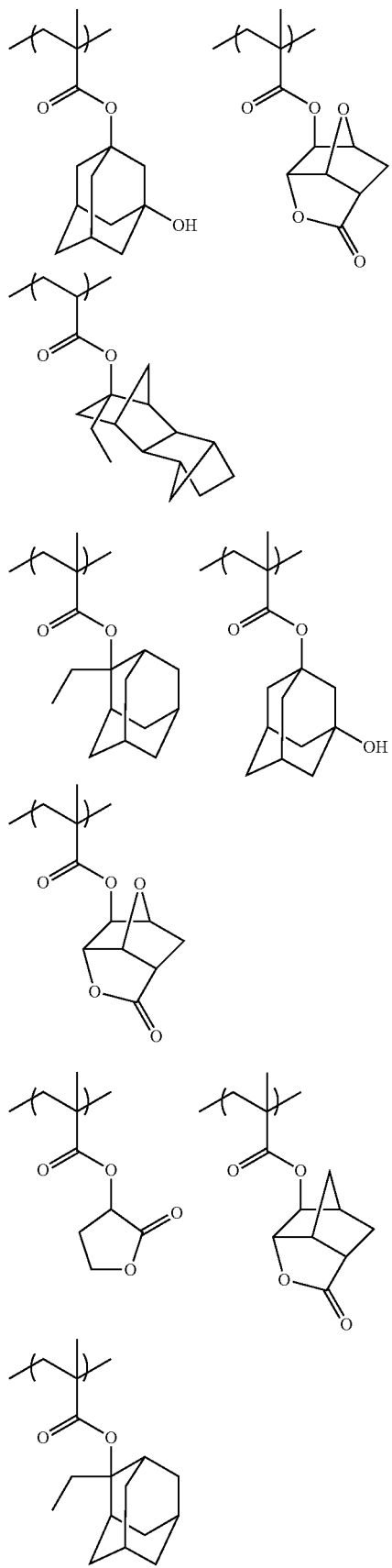
(19)
(20)
(21)
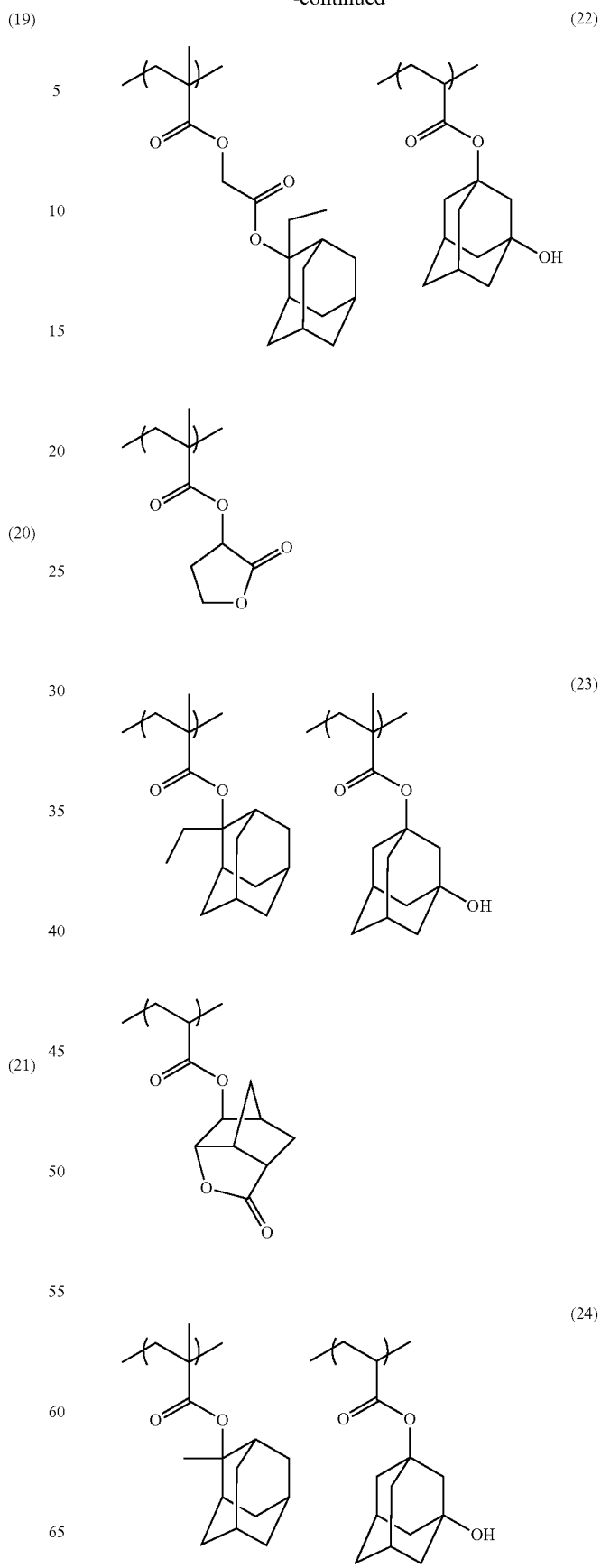
(22)
(23)
(24)

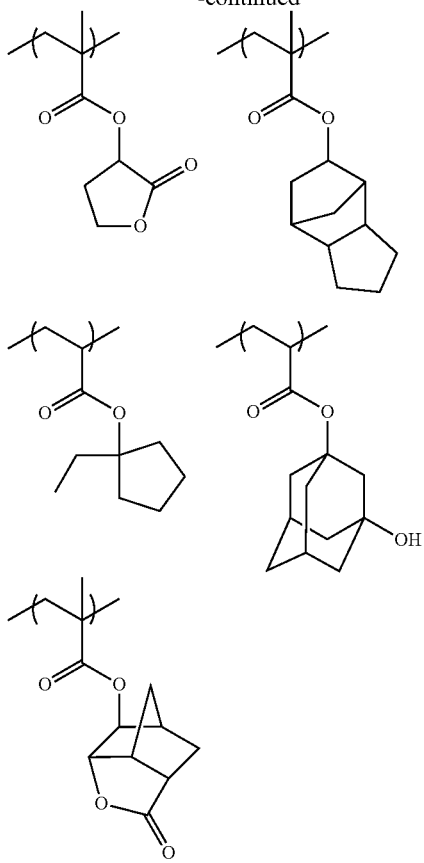

(25)

In the resin (A), the content of the repeating unit represented by formula (A1) is preferably from 2 to 75 mol %, more preferably from 3 to 50 mol %, still more preferably from 10 to 40 mol %, based on all repeating units constituting the resin.

In the resin (A), the content of the repeating unit represented by formula (A2) is preferably from 2 to 75 mol %, more preferably from 3 to 50 mol %, still more preferably from 10 to 40 mol %, based on all repeating units constituting the resin.

The content of the group that decomposes by the action of an acid is expressed by B/(B+S) using the number (B) of groups that decomposes by the action of an acid and the number (S) of alkali-soluble groups not protected by a group that leaves by the action of an acid, in the resin (A). The content is preferably from 0.01 to 0.7, more preferably from 0.05 to 0.50.

The resin (A) may be synthesized by an ordinary method (for example, radical polymerization)). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the resist composition of the present invention. By the use of the same solvent, production of particles during storage can be suppressed.

The polymerization reaction is preferably performed in an inert gas atmosphere such as nitrogen and argon. As for the polymerization initiator, the polymerization is initiated using a commercially available radical initiator (e.g., azo-based initiator, peroxide). The radical initiator is preferably an azo-based initiator, and an azo-based initiator having an ester group, a cyano group or a carboxyl group is preferred. Preferred examples of the polymerization initiator include azobisisobutyronitrile, azobisdimethylvaleronitrile and dimethyl 2,2'-azobis(2-methylpropionate). Together with the polymerization initiator, a chain transfer agent such as thiol compound may be used in combination. The polymerization initiator is added additionally or in parts, if desired. After the completion of reaction, the reaction product is charged into a solvent, and the desired polymer is recovered by a powder or solid recovery method or the like. The reaction concentration is from 5 to 50 mass %, preferably from 10 to 30 mass %, and the reaction temperature is usually from 10 to 150° C., preferably from 30 to 120° C., more preferably from 60 to 100° C.

The weight average molecular weight (Mw) of the resin (A) is preferably from 1,000 to 200,000, more preferably from 1,000 to 100,000, still more preferably from 1,000 to 50,000, yet still more preferably from 1,000 to 30,000.

The weight average molecular weight here is defined as a polystyrene-reduced value determined by gel permeation chromatography.

The dispersity (Mw/Mn) of the resin (A) is preferably from 1.0 to 3.0, more preferably from 1.0 to 2.5, still more preferably from 1.0 to 2.0. A resin (A) having a dispersity of 1.3 to 2.0 can be synthesized by radical polymerization using an azo-based polymerization initiator. Also, a resin (A) having a dispersity of 1.0 to 1.5 can be synthesized by living radical polymerization.

The weight average molecular weight of the resin (A) is preferably 200,000 or less in view of dissolution rate in an alkali and sensitivity.

Two or more kinds of the resin (A) may be used in combination, or the resin may be used in combination another resin that decomposes under the effect of an acid to increase the solubility in an alkali developer.

The amount of the resin (A) added is, as the total amount, usually from 10 to 99 mass %, preferably from 20 to 98 mass %, more preferably from 50 to 97 mass %, based on the entire solid content of the resist composition.

(B) Compound Capable of Generating an Acid Upon Irradiation with Actinic Rays or Radiation The resist composition of the present invention contains a compound capable of generating an acid upon irradiation with actinic rays or radiation (hereinafter sometimes referred to as a "photoacid generator").

The photoacid generator which can be used may be appropriately selected from a photoinitiator for cationic photopolymerization, a photoinitiator for radical photopolymerization, a photodecoloring agent for dyes, a photodiscoloring agent, a known compound used for microresist or the like and capable of generating an acid upon irradiation with actinic rays or radiation, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where such a group or compound capable of generating an acid upon irradiation with actinic rays or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the compounds capable of generating an acid upon irradiation with actinic rays or radiation, preferred are the compounds represented by the following formulae (ZI), (ZII) and (ZIII):

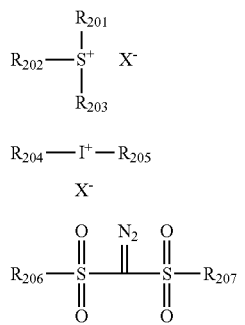

In formula (ZI), $R_{201}$, $R_{202}$ and $R_{203}$ each independently represents an organic group.

$X^-$ represents a non-nucleophilic anion.

In formula (ZI), preferred examples of $X^-$ include sulfonate anion, carboxylate anion, bis(alkylsulfonyl)amide anion, tris(alkylsulfonyl)methide anion, $BF_4^-$, $PF_6^-$ and $SbF_6^-$. The anion is preferably an organic anion containing a carbon atom.

Preferred organic anions include organic anions represented by the following formulae (AN1) to (AN4):

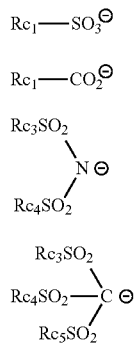

In formulae (AN1) and (AN2), $Rc_1$ represents an organic group.

The organic group in $Rc_1$ includes an organic group having a carbon number of 1 to 30 and is preferably an alkyl or aryl group which may be substituted, or a group where a plurality of such groups are connected through a single bond or a linking group such as —O—, —CO$_2$—, —S—, —SO$_3$— and —SO$_2$N(Rd$_1$)—.

$Rd_1$ represents a hydrogen atom or an alkyl group and may form a ring structure together with the alkyl or aryl group to which $Rd_1$ is bonded.

The organic group of $Rc_1$ is more preferably an alkyl group substituted by a fluorine atom or a fluoroalkyl group at the 1-position, or a phenyl group substituted by a fluorine atom or a fluoroalkyl group. By virtue of having a fluorine atom or a fluoroalkyl group, the acidity of the acid generated upon irradiation with light increases and the sensitivity is enhanced. When $Rc_1$ has 5 or more carbon atoms, at least one carbon atom is preferably such that a part of hydrogen atoms remain without replacing all hydrogen atoms by a fluorine atom, and more preferably such that the number of hydrogen atoms is larger than the number of fluorine atoms. The absence of a perfluoroalkyl group having a carbon number of 5 or more enables reduction in the toxicity to ecology.

A still more preferred embodiment of $Rc_1$ is a group represented by the following formula.

$$Rc_7\text{-}Ax\text{-}Rc_6\text{—}$$

In the formula, $Rc_6$ represents a perfluoroalkylene group having a carbon number of 4 or less, preferably from 2 to 4, more preferably 2 or 3, or a phenylene group substituted by from 1 to 4 fluorine atoms and/or from 1 to 3 fluoroalkyl groups.

Ax represents a single bond or a linking group (preferably —O—, —CO$_2$—, —S—, —SO$_3$— or —SO$_2$N(Rd$_1$)—). $Rd_1$ represents a hydrogen atom or an alkyl group and may combine with $Rc_7$ to form a ring structure.

$Rc_7$ represents a hydrogen atom, a fluorine atom, a linear or branched alkyl group which may be substituted, a monocyclic or polycyclic cycloalkyl group which may be substituted, or an aryl group which may be substituted. The alkyl group, cycloalkyl group and aryl group each preferably contains no fluorine atom as the substituent.

In formulae (AN3) and (AN4), $Rc_3$, $Rc_4$ and $Rc_5$ each independently represents an organic group.

Preferred organic groups for $Rc_3$, $Rc_4$ and $Rc_5$ in formulae (AN3) and (AN4) are the same as preferred organic groups in $Rc_1$.

$Rc_3$ and $Rc_4$ may combine to form a ring.

The group formed by combining $Rc_3$ and $Rc_4$ includes an alkylene group and an arylene group and is preferably a perfluoroalkylene group having a carbon number of 2 to 4. When $Rc_3$ and $Rc_4$ combine to form a ring, this is preferred because the acidity of the acid generated upon irradiation with light increases and the sensitivity is enhanced.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group.

Examples of the group formed by combining two members out of $R_{201}$ to $R_{203}$ include an alkylene group (e.g., butylene, pentylene).

Specific examples of the organic group as $R_{201}$, $R_{202}$ and $R_{203}$ include corresponding groups in the compounds (ZI-1), (ZI-2) and (ZI-3) which are described later.

The compound may be a compound having a plurality of structures represented by formula (ZI). For example, the compound may be a compound having a structure that at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same or different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below.

The compound (ZI-2) is a compound where $R_{201}$ to $R_{203}$ in formula (ZI) each independently represents an aromatic ring-free organic group. The aromatic ring as used herein includes an aromatic ring containing a heteroatom.

The aromatic ring-free organic group as $R_{201}$ to $R_{203}$ generally has a carbon number of 1 to 30, preferably from 1 to 20.

$R_{201}$ to $R_{203}$ each is independently preferably an alkyl group, a cycloalkyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group as $R_{201}$ to $R_{203}$ may be either linear or branched and includes a linear or branched alkyl group preferably having a carbon number of 1 to 10 (e.g., methyl, ethyl, propyl, butyl, pentyl). The alkyl group as $R_{201}$ to $R_{203}$ is preferably a linear or branched 2-oxoalkyl group or an alkoxycarbonylmethyl group.

The cycloalkyl group as $R_{201}$ to $R_{203}$ includes a cycloalkyl group preferably having a carbon number of 3 to 10 (e.g., cyclopentyl, cyclohexyl, norbornyl). The cycloalkyl group as $R_{201}$ to $R_{203}$ is preferably a cyclic 2-oxoalkyl group.

The 2-oxoalkyl group as $R_{201}$ to $R_{203}$ may be linear, branched or cyclic and is preferably a group having >C=O at the 2-position of the above-described alkyl or cycloalkyl group.

The alkoxy group in the alkoxycarbonylmethyl group as $R_{201}$ to $R_{203}$ includes an alkoxy group preferably having a carbon number of 1 to 5 (e.g., methoxy, ethoxy, propoxy, butoxy, pentoxy).

$R_{201}$ to $R_{203}$ each may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

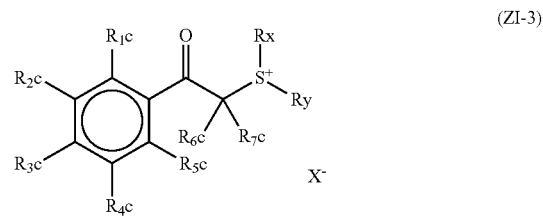

(ZI-3)

In formula (ZI-3), $R_{1c}$ to $R_{5c}$ each independently represents a hydrogen atom, an alkyl group, a cycloalkyl group, an alkoxy group or a halogen atom.

$R_{6c}$ and $R_{7c}$ each independently represents a hydrogen atom, an alkyl group or a cycloalkyl group.

$R_x$ and $R_y$ each independently represents an alkyl group, a cycloalkyl group, an allyl group or a vinyl group.

Any two or more members out of $R_{1c}$ to $R_{7c}$ or a pair of $R_x$ and $R_y$ may combine together to form a ring structure, and the ring structure may contain an oxygen atom, a sulfur atom, an ester bond or an amide bond. Examples of the group formed by combining any two or more members out of $R_{1c}$ to $R_{7c}$ or a pair of $R_x$ and $R_y$ include a butylene group and a pentylene group.

$X^-$ represents a non-nucleophilic anion, and examples thereof are the same as those of $X^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (for example, a methyl group, an ethyl group, a linear or branched propyl group, a linear or branched butyl group, or a linear or branched pentyl group).

The cycloalkyl group as $R_{1c}$ to $R_{7c}$ is preferably a cycloalkyl group having a carbon number of 3 to 8 (for example, a cyclopentyl group or a cyclohexyl group).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (for example, a methoxy group, an ethoxy group, a linear or branched propoxy group, a linear or branched butoxy group, or a linear or branched pentoxy group), or a cyclic alkoxy group having a carbon number of 3 to 8 (for example, a cyclopentyloxy group or a cyclohexyloxy group).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. By virtue of this construction, the solvent solubility is more enhanced and generation of particles during storage is suppressed.

The alkyl group as $R_x$ and $R_y$ is the same as the alkyl group of $R_{1c}$ to $R_{7c}$. The alkyl group as $R_x$ and $R_y$ is preferably a linear or branched 2-oxoalkyl group or an alkoxycarbonylmethyl group.

The cycloalkyl group as $R_x$ and $R_y$ is the same as the cycloalkyl group of $R_{1c}$ to $R_{7c}$. The cycloalkyl group as $R_x$ to $R_y$ is preferably a cyclic 2-oxoalkyl group.

The linear, branched or cyclic 2-oxoalkyl group includes a group having >C=O at the 2-position of the alkyl group or cycloalkyl group as $R_{1c}$ to $R_{7c}$.

The alkoxy group in the alkoxycarbonylmethyl group is the same as the alkoxy group of $R_{1c}$ to $R_{5c}$.

$R_x$ and $R_y$ each is preferably an alkyl group having a carbon number of 4 or more, more preferably 6 or more, still more preferably 8 or more.

In formulae (ZII) and (ZIII), $R_{204}$ to $R_{207}$ each independently represents an aryl group which may have a substituent, an alkyl group which may have a substituent, or a cycloalkyl group which may have a substituent.

The aryl group of $R_{204}$ to $R_{207}$ is preferably a phenyl group or a naphthyl group, more preferably a phenyl group.

The alkyl group of $R_{204}$ to $R_{207}$ may be either linear or branched and is preferably a linear or branched alkyl group having a carbon number of 1 to 10 (e.g., methyl, ethyl, propyl, butyl, pentyl).

The cycloalkyl group of $R_{204}$ to $R_{207}$ is preferably a cycloalkyl group having a carbon number of 3 to 10 (e.g., cyclopentyl, cyclohexyl, norbornyl).

Examples of the substituent which $R_{204}$ to $R_{207}$ each may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion and is the same as the non-nucleophilic anion of $X^-$ in formula (ZI).

Out of the compounds capable of generating an acid upon irradiation with actinic rays or radiation, preferred compounds further include the compounds represented by the following formulae (ZIV), (ZV) and (ZVI):

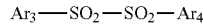

ZIV

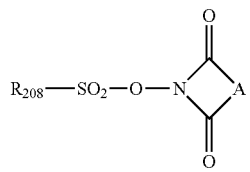

ZV

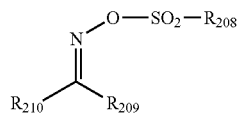

ZVI

In formulae (ZIV) to (ZVI), $Ar_3$ and $Ar_4$ each independently represents a substituted or unsubstituted aryl group.

$R_{208}$ represents a substituted or unsubstituted alkyl group, a substituted or unsubstituted cycloalkyl group, or a substituted or unsubstituted aryl group.

$R_{209}$ and $R_{210}$ each represents a substituted or unsubstituted alkyl group, a substituted or unsubstituted cycloalkyl group, a substituted or unsubstituted aryl group, or an electron-withdrawing group. $R_{209}$ is preferably a substituted or unsubstituted aryl group, and $R_{210}$ is preferably an electron-withdrawing group, more preferably a cyano group or a fluoroalkyl group.

A represents a substituted or unsubstituted alkylene group, a substituted or unsubstituted alkenylene group, or a substituted or unsubstituted arylene group.

Out of the compounds capable of generating an acid upon irradiation with actinic rays or radiation, particularly preferred examples are set forth below.

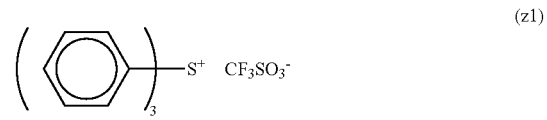
(z1)

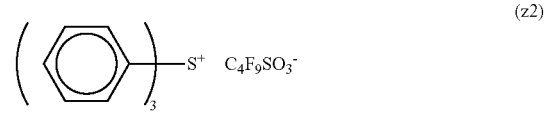
(z2)

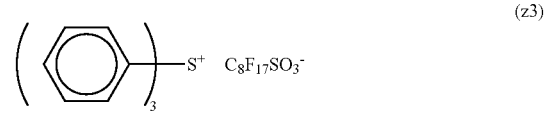
(z3)

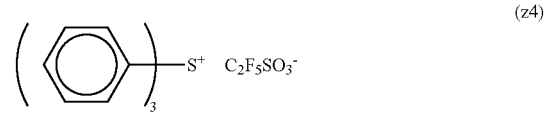
(z4)

(z5)

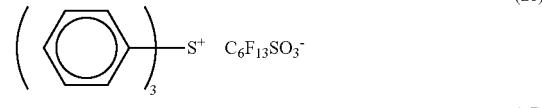
(z6)

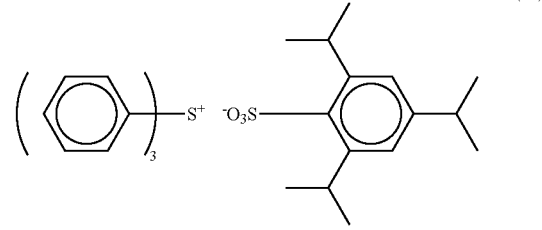
(z7)

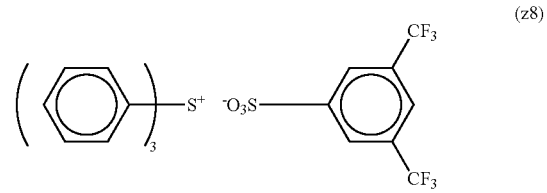
(z8)

-continued
(z9)
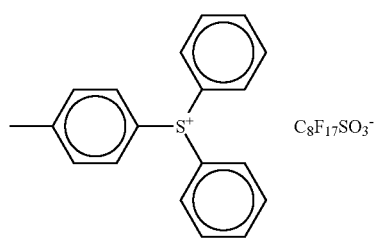
(z10)
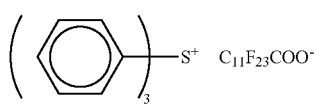
(z11)
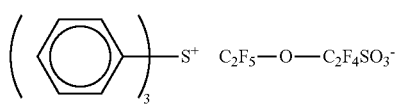
(z11)
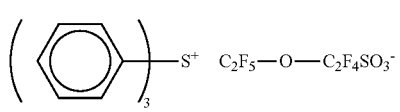
(z12)
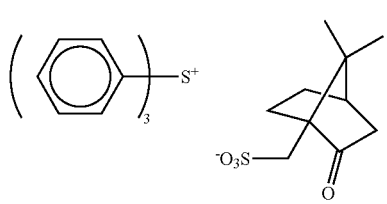
(z13)
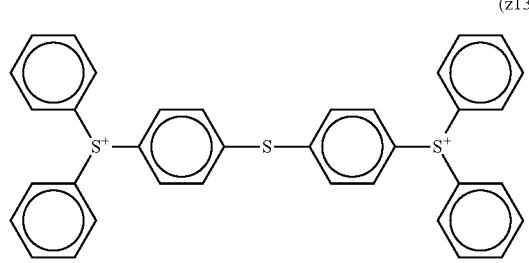
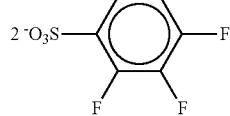
(z14)
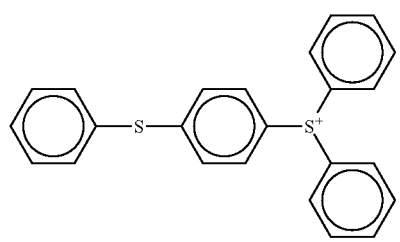
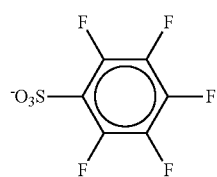
-continued
(z15)
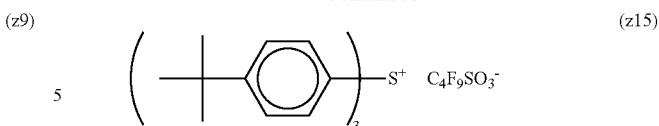
(z16)
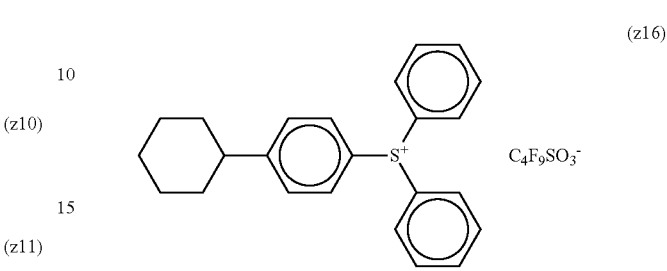
(z17)
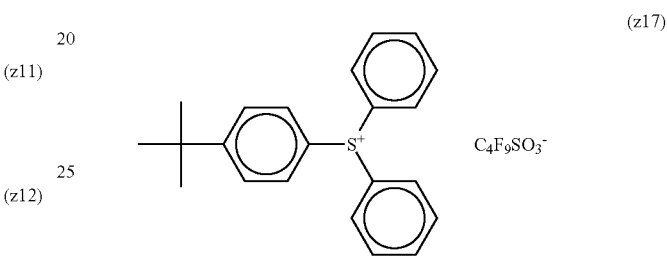
(z18)
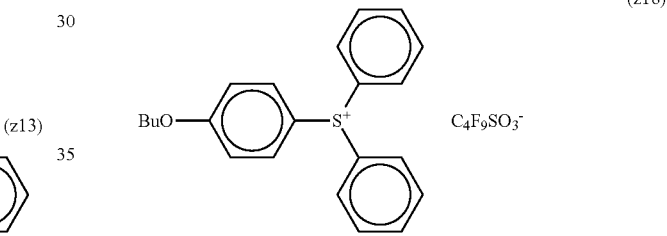
(z19)
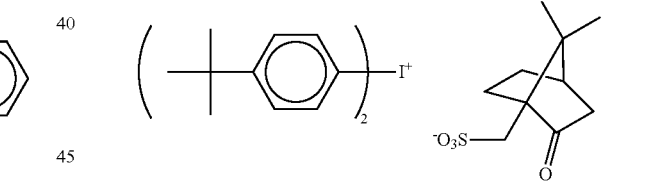
(z20)
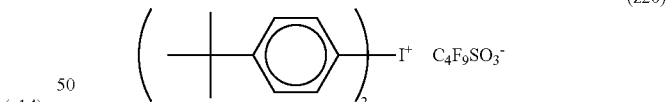
(z21)
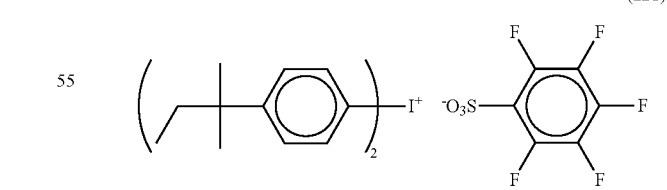
(z22)
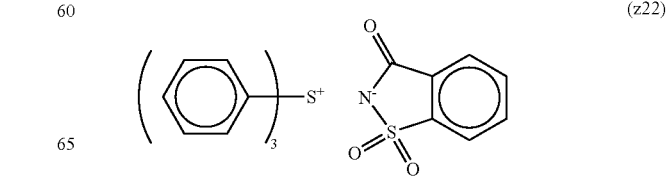

-continued
(z23) 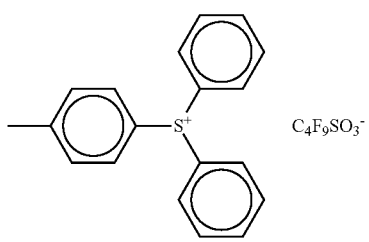
(z24) 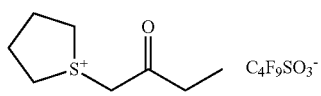
(z25) 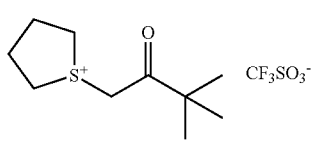
(z26) 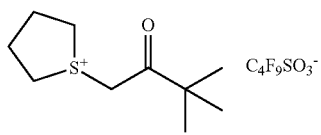
(z27) 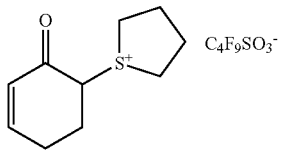
(z28) 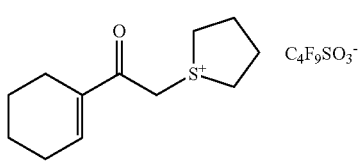
(z29) 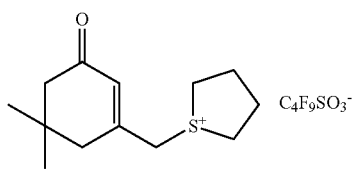
(z30) 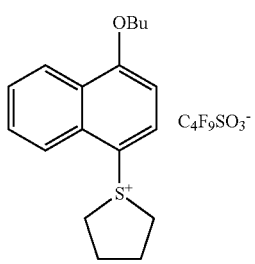
(z31) 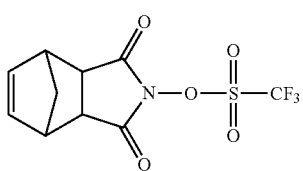
-continued
(z32) 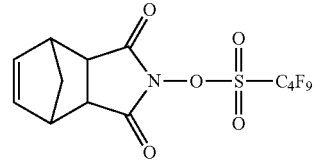
(z33) 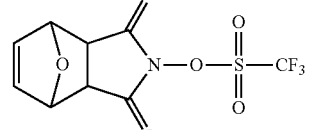
(z34) 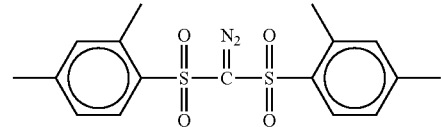
(z35) 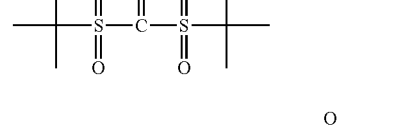
(z36) 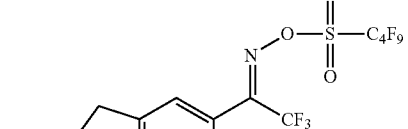
(z37) 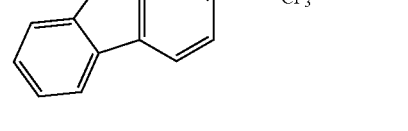
(z38) 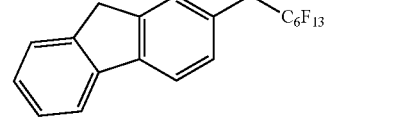
(z39) 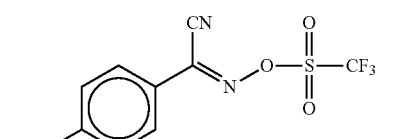
(z40) 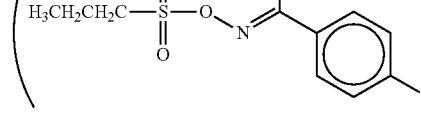

-continued
(z41) 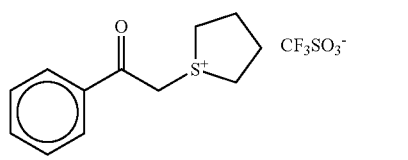
(z42) 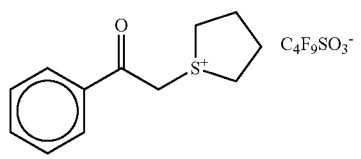
(z43) 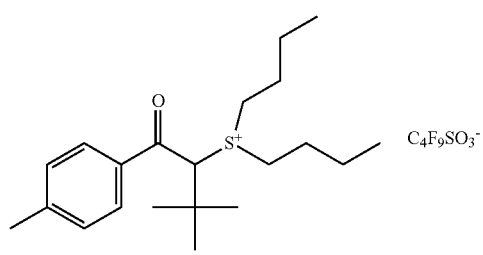
(z44) 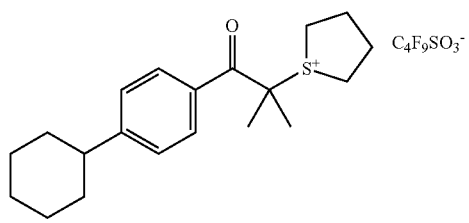
(z45) 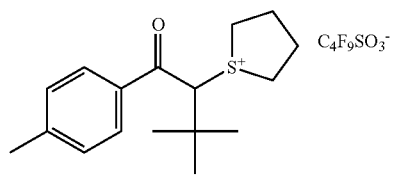
(z46) 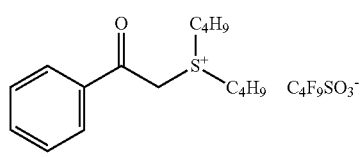
(z47) 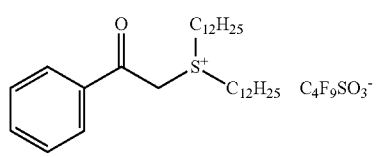
(z48) 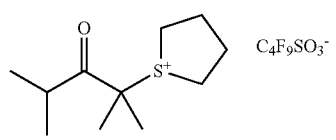
-continued
(z49) 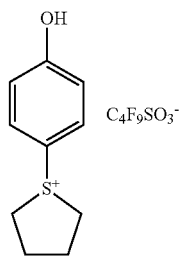
(z50) 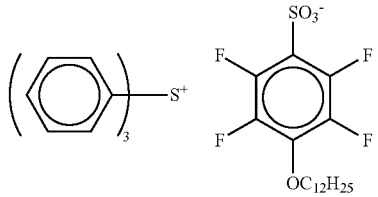
(z51) 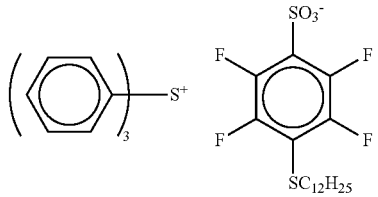
(z52) 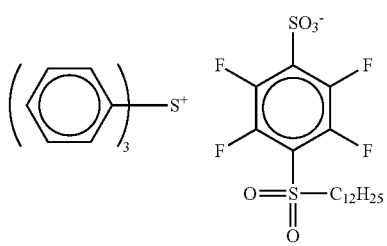
(z53) 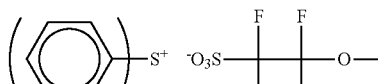 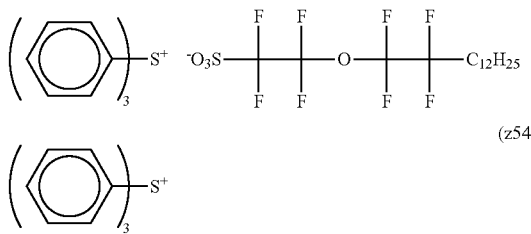
(z54) 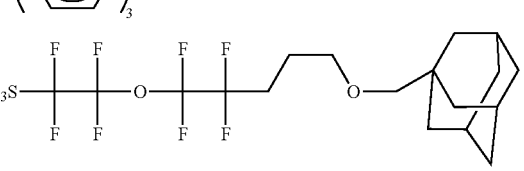
(z55) 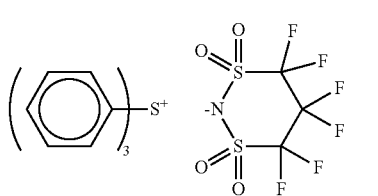

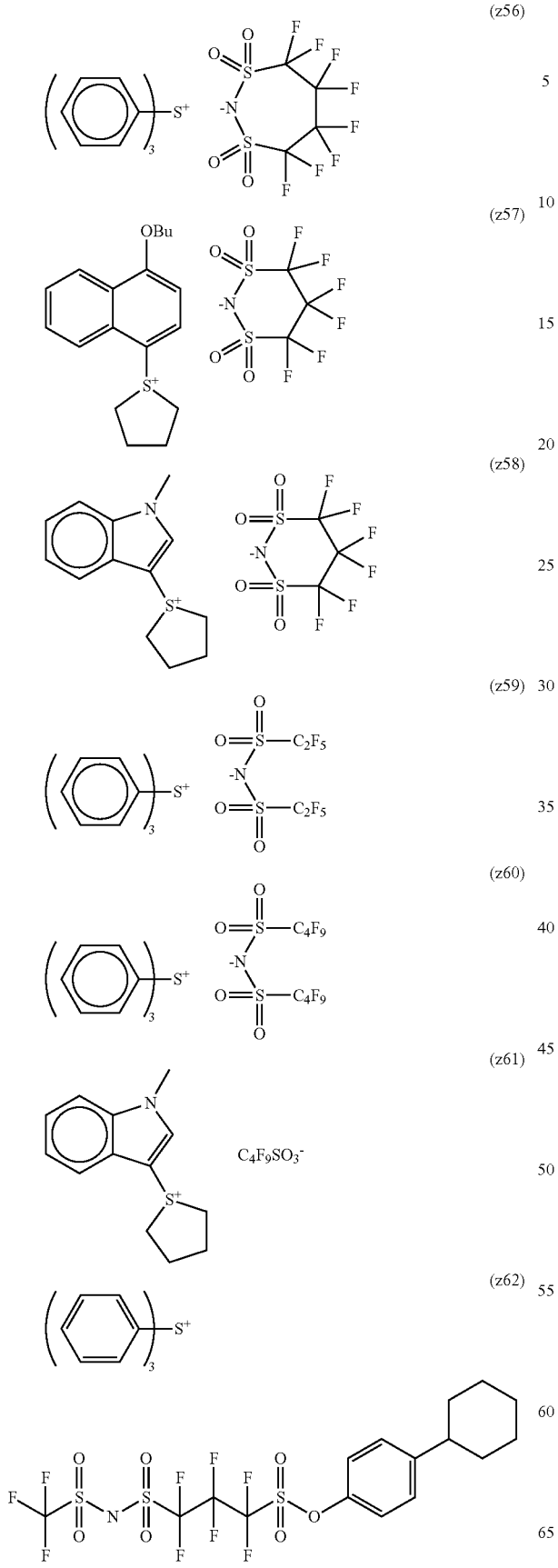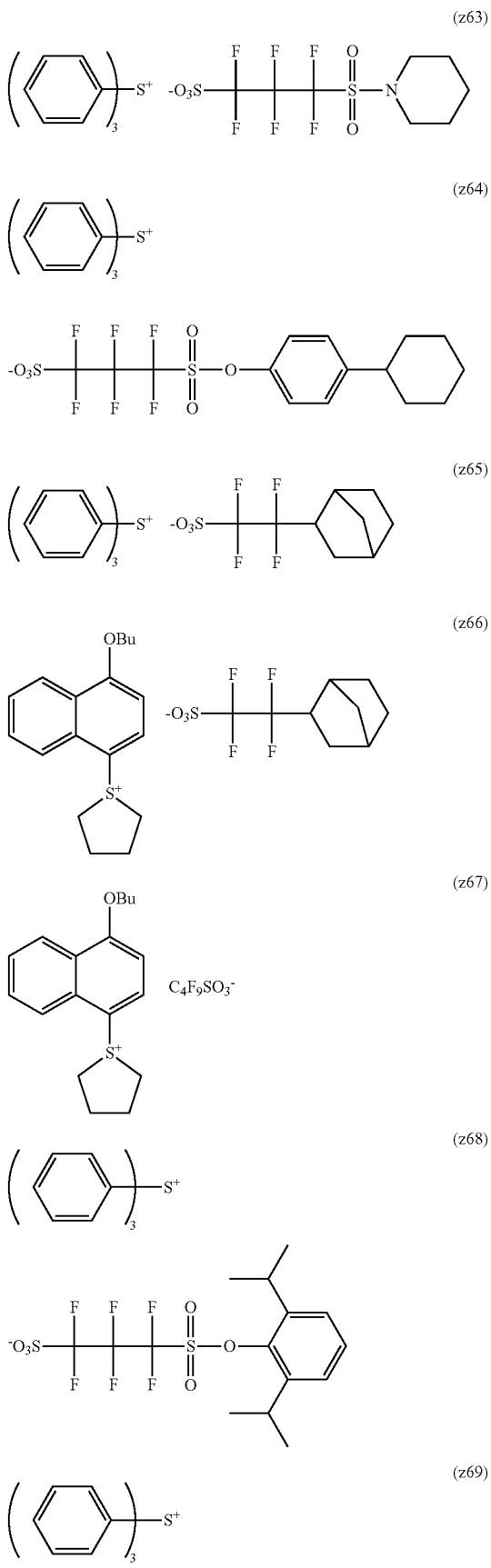

-continued
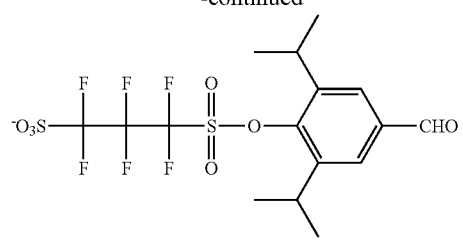
(z70)
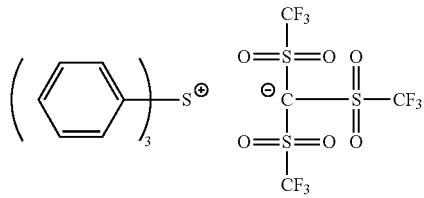
(z71)
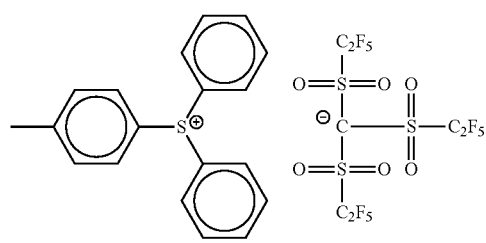
(z72)
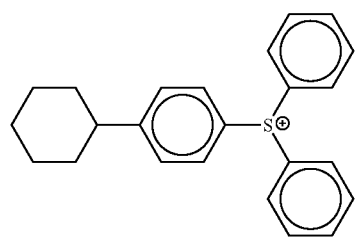
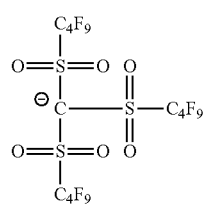
(z73)
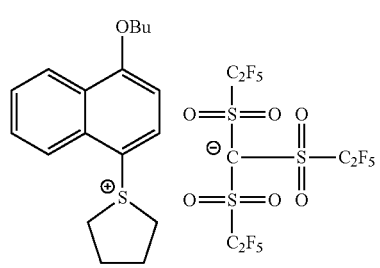
(z74)
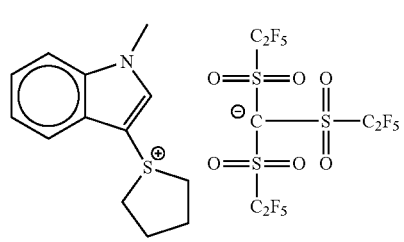
-continued
(z75)
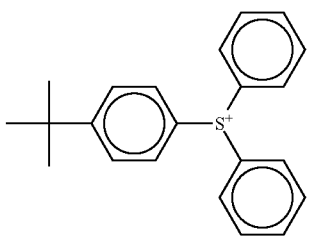
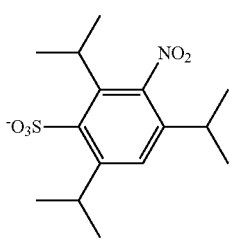
(z76)
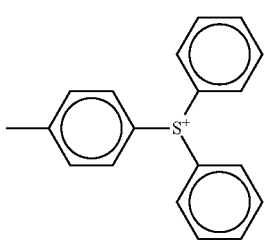
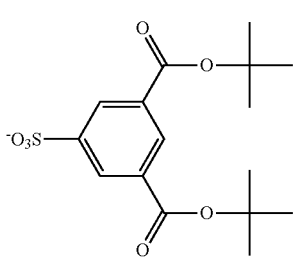
(z77)
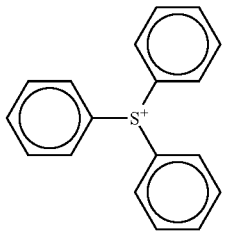
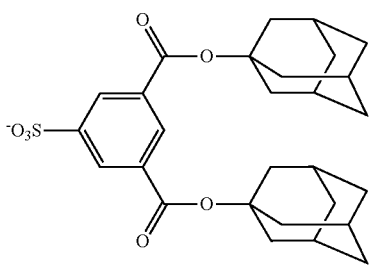

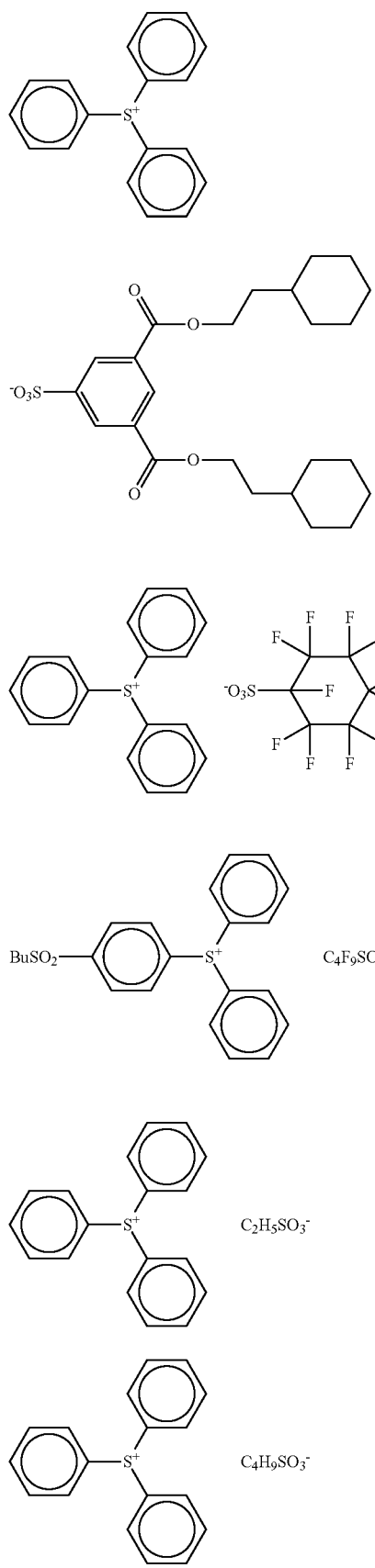

Preferably, a triarylsulfonium salt where in formula (ZI), $R_{201}$ to $R_{203}$ are an aryl group, a diazodisulfone derivative represented by formula (ZIII), or an oxime ester of organic sulfonic acid represented by formula (ZVI) is used as the compound capable of generating an acid upon irradiation with actinic rays or radiation.

More preferably, at least one kind of a compound selected from the group consisting of triarylsulfonium salts and at least one kind of a compound selected from the group consisting of diazodisulfone derivatives and oxime esters of an organic sulfonic acid are used as the compound capable of generating an acid upon irradiation with actinic rays or radiation.

One of these acid generators may be used alone, or two or more thereof may be used in combination. In the case of using two or more in combination, compounds capable of generating two kinds of organic acids differing in the total atom number except for hydrogen atom by 2 or more are preferably combined.

The content of the acid generator in the composition is preferably from 0.1 to 20 mass %, more preferably from 0.5 to 10 mass %, still more preferably from 1 to 7 mass %, based on the entire solid content of the resist composition.

Carboxylic Acid Generator:

A compound capable of generating a carboxylic acid upon irradiation with actinic rays or radiation (hereinafter, sometimes referred to as a "carboxylic acid generator") may also be used.

The carboxylic acid generator is preferably a compound represented by the following formula (C):

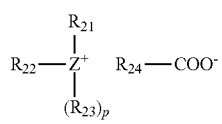

(C)

In formula (C), $R_{21}$ to $R_{23}$ each independently represents an alkyl group, a cycloalkyl group, an alkenyl group or an aryl group, $R_{24}$ represents a hydrogen atom, an alkyl group, a cycloalkyl group, an alkenyl group or an aryl group, and Z represents a sulfur atom or an iodine atom. When Z is a sulfur atom, p is 1, and when Z is an iodine atom, p is 0.

In formula (C), $R_{21}$ to $R_{23}$ each independently represents an alkyl group, a cycloalkyl group, an alkenyl group or an aryl group, and these groups each may have a substituent.

Examples of the substituent which the alkyl group, cycloalkyl group and alkenyl group each may have include a halogen atom (e.g., chlorine, bromine, fluorine), an aryl group (e.g., phenyl, naphthyl), a hydroxy group and an alkoxy group (e.g., methoxy, ethoxy, butoxy).

Examples of the substituent which the aryl group may have include a halogen atom (e.g., chlorine, bromine, fluorine), a nitro group, a cyano group, an alkyl group (e.g., methyl, ethyl, tert-butyl, tert-amyl, octyl), a hydroxy group and an alkoxy group (e.g., methoxy, ethoxy, butoxy).

$R_{21}$ to $R_{23}$ each is, independently, preferably an alkyl group having a carbon number of 1 to 12, a cycloalkyl group having a carbon number of 3 to 12, an alkenyl group having a carbon number of 2 to 12, or an aryl group having a carbon number of 6 to 24, more preferably an alkyl group having a carbon number of 1 to 6, a cycloalkyl group having a carbon number of 3 to 6, or an aryl group having a carbon number of 6 to 18, still more preferably an aryl group having a carbon number of 6 to 15, and these groups each may have a substituent.

$R_{24}$ represents a hydrogen atom, an alkyl group, a cycloalkyl group, an alkenyl group or an aryl group.

Examples of the substituent which the alkyl group, cycloalkyl group and alkenyl group each may have are the same as those of the substituent described above when $R_{21}$ is an alkyl group. Examples of the substituent of the aryl group are the same as those of the substituent described above when $R_{21}$ is an aryl group.

$R_{24}$ is preferably a hydrogen atom, an alkyl group having a carbon number of 1 to 30, a cycloalkyl group having a carbon number of 3 to 30, an alkenyl group having a carbon number of 2 to 30, or an aryl group having a carbon number of 6 to 24, more preferably an alkyl group having a carbon number of 1 to 18, a cycloalkyl group having a carbon number of 3 to 18, or an aryl group having a carbon number of 6 to 18, still more preferably an alkyl group having a carbon number of 1 to 12, a cycloalkyl group having a carbon number of 3 to 12, or an aryl group having a carbon number of 6 to 15. These groups each may have a substituent.

Z represents a sulfur atom or an iodine atom. p is 1 when Z is a sulfur atom, and p is 0 when Z is an iodine atom.

Incidentally, two or more cation moieties of formula (C) may combine through a single bond or a linking group (e.g., —S—, —O—) to form a cation structure having a plurality of cation moieties of formula (C).

Specific preferred examples of the carboxylic acid generator are set forth below, but the present invention is of course not limited thereto.

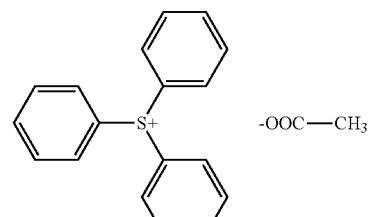

C-1

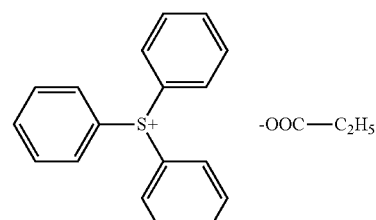

C-2

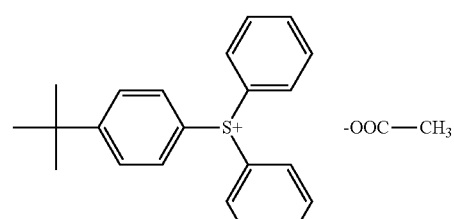

C-3

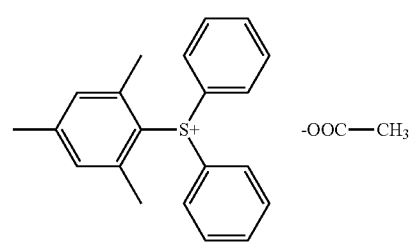

C-4

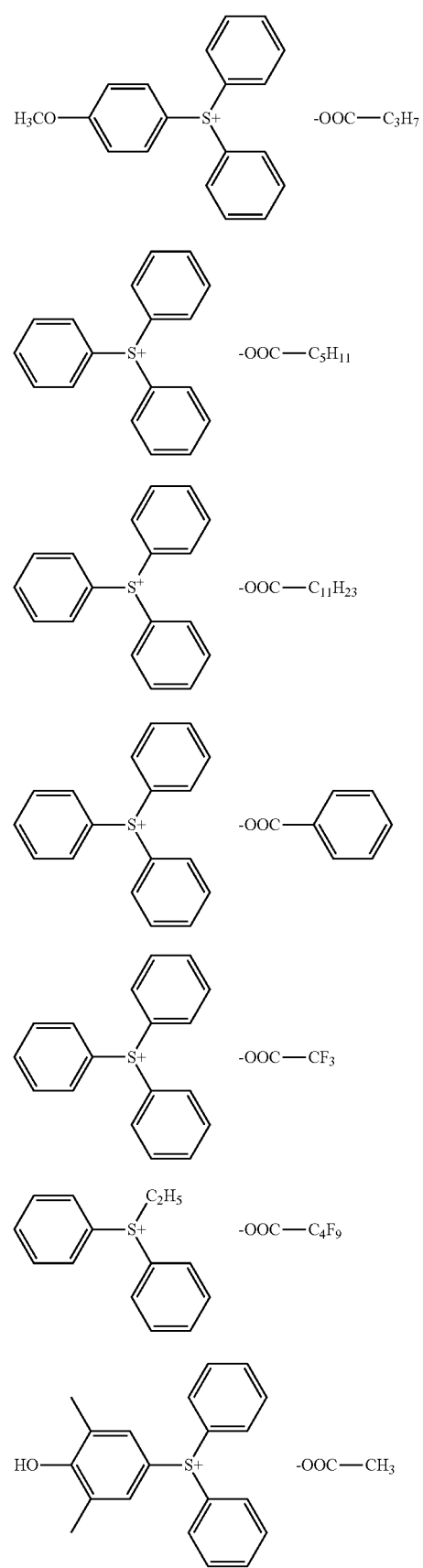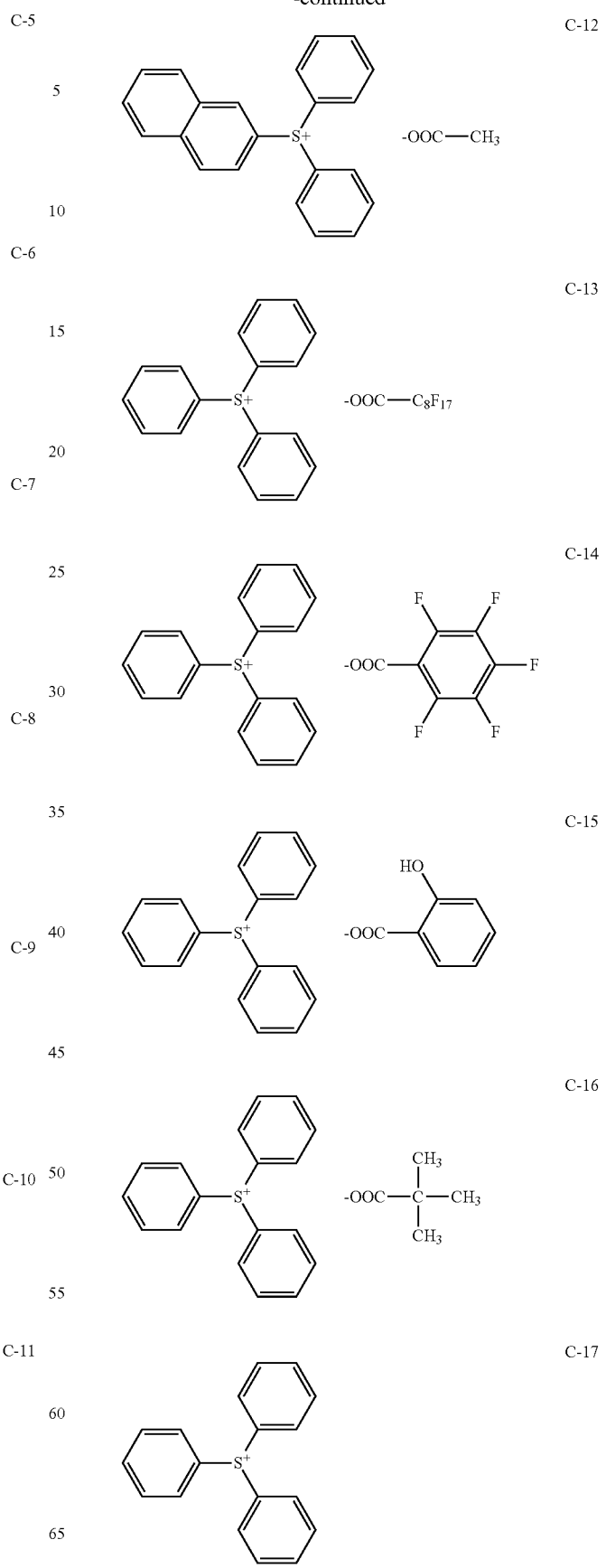

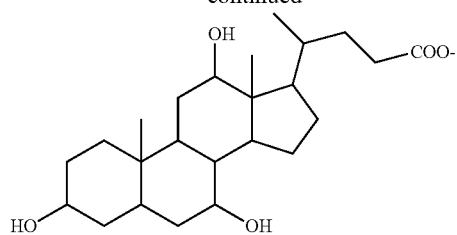
C-18

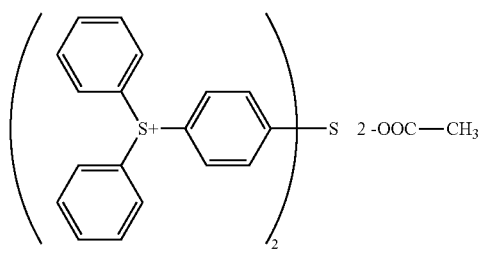
C-19

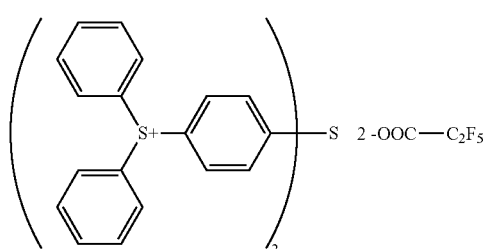
C-20

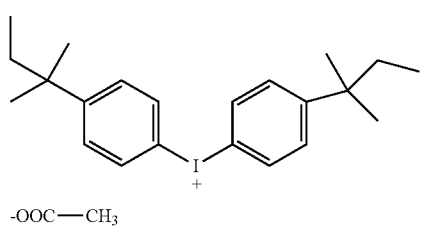
C-21

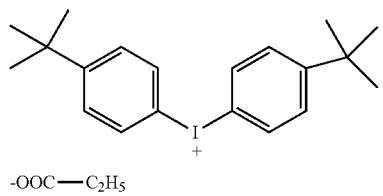
C-22

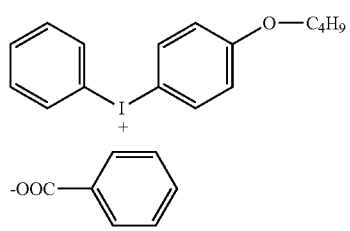
C-23

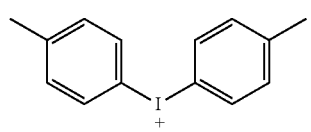

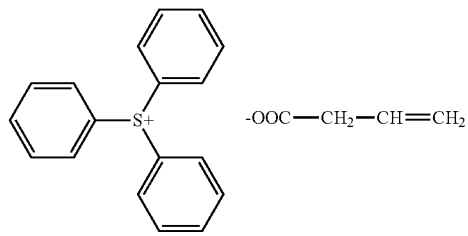
C-24

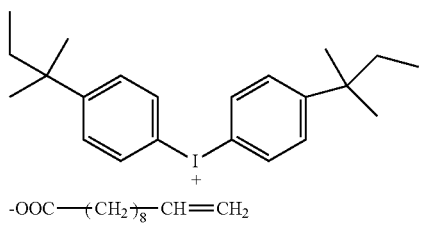
C-25

The content of the carboxylic acid generator in the resist composition of the present invention is preferably from 0.01 to 10 mass %, more preferably from 0.03 to 5 mass %, still more preferably from 0.05 to 3 mass %, based on the entire solid content of the composition. One kind of a carboxylic acid generator may be used, or two or more kinds thereof may be mixed and used.

The carboxylic acid generator can be synthesized by a known method such as synthesis method described in JP-A-2002-27806.

In the case of using a sulfonic acid generator and a carboxylic acid generator in combination, the ratio (by mass) of carboxylic acid generator/sulfonic acid generator is usually from 99.9/0.1 to 50/50, preferably from 99/1 to 60/40, more preferably from 98/2 to 70/30.

Organic Basic Compound:

The resist composition of the present invention may further contain an organic basic compound, other than the compound represented by formula (C1). By the use in combination, the effects of the present invention can be more enhanced.

The organic basic compound for use in the present invention is preferably an organic basic compound having basicity stronger than that of phenol.

Preferred organic basic compounds are, in terms of preferred chemical environment, compounds having a structure of the following formulae (A) to (E). The structure of formulae (B) to (E) may be a part of a ring structure.

(A)

(B)

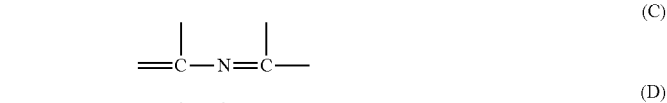
(C)

(D)

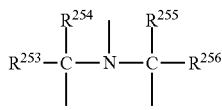

(E)

In formula (A), $R^{250}$, $R^{251}$ and $R^{252}$ each independently represents a hydrogen atom, an alkyl group having a carbon number of 1 to 20, a cycloalkyl group having a carbon number of 3 to 20 or an aryl group having a carbon number of 6 to 20, and $R^{250}$ and $R^{251}$ may combine together to form a ring. These groups each may have a substituent. The alkyl group or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20. Also, these groups each may contain an oxygen atom, a sulfur atom or a nitrogen atom in the alkyl chain.

In formula (E), $R^{253}$, $R^{254}$, $R^{255}$ and $R^{256}$ each independently represents an alkyl group having a carbon number of 1 to 6 or a cycloalkyl group having a carbon number of 3 to 6.

An amine compound having a sulfonic acid ester group, or an ammonium salt compound having a sulfonic acid ester group may be used as the organic basic compound.

The sulfonic acid ester group in the amine compound having a sulfonic acid ester group and the ammonium salt compound having a sulfonic acid ester group may be any of an alkylsulfonic acid ester, a cycloalkylsulfonic acid ester and an arylsulfonic acid ester. In the case of an alkylsulfonic acid ester, the alkyl group preferably has a carbon number of 1 to 20; in the case of a cycloalkylsulfonic acid ester, the cycloalkyl group preferably has a carbon number of 3 to 20; and in the case of an arylsulfonic acid ester, the aryl group preferably has a carbon number of 6 to 12. The alkylsulfonic acid ester, cycloalkylsulfonic acid ester and arylsulfonic acid ester each may have a substituent, and the substituent is preferably a halogen atom, a cyano group, a nitro group, a carboxyl group, a carboxylic acid ester group or a sulfonic acid ester group.

The compound preferably has at least one oxyalkylene group between the sulfonic acid ester group and the nitrogen atom. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

Preferred examples of the organic basic compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole.

Examples of the compound having a diazabicyclo structure include 1,4-diazabicyclo[2,2,2]octane, 1,5-diazabicyclo[4,3,0]non-5-ene and 1,8-diazabicyclo-[5,4,0]undec-7-ene.

Examples of the compound having an onium hydroxide structure include triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide.

Examples of the compound having an onium carboxylate structure include a compound where the anion moiety of the compound having an onium hydroxide structure becomes a carboxylate, such as acetate, adamantane-1-carboxylate and perfluoroalkyl carboxylate.

Examples of the compound having a trialkylamine structure include tri(n-butyl)amine, tri(n-octyl)amine, tri(n-dodecyl)amine, dicyclomethylamine and dicycloethylamine.

Examples of the aniline compound include 2,6-diisopropylaniline and N,N-dimethylaniline.

Examples of the alkylamine derivative having a hydroxyl group and/or an ether bond include ethanolamine, diethanolamine, triethanolamine and tris(methoxyethoxyethyl)amine.

Examples of the aniline derivative having a hydroxyl group and/or an ether bond include N,N-bis(hydroxyethyl)aniline.

The organic basic compound further includes an amine compound having a phenoxy group, and an ammonium salt compound having a phenoxy group.

As for the amine compound, a primary, secondary or tertiary amine compound can be used, and an amine compound where at least one alkyl group is bonded to the nitrogen atom is preferred. The amine compound is more preferably a tertiary amine compound. In the amine compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The amine compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

As for the ammonium salt compound, a primary, secondary, tertiary or quaternary ammonium salt compound can be used, and an ammonium salt compound where at least one alkyl group is bonded to the nitrogen atom is preferred. In the ammonium salt compound, as long as at least one alkyl group (preferably having a carbon number of 1 to 20) is bonded to the nitrogen atom, a cycloalkyl group (preferably having a carbon number of 3 to 20) or an aryl group (preferably having a carbon number of 6 to 12) may be bonded to the nitrogen atom in addition to the alkyl group. The ammonium salt compound preferably has an oxygen atom in the alkyl chain to form an oxyalkylene group. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

Examples of the anion of the ammonium salt compound include a halogen atom, a sulfonate, a borate and a phosphate, with a halogen atom and a sulfonate being preferred. The halogen atom is preferably chloride, bromide or iodide, and the sulfonate is preferably an organic sulfonate having a carbon number of 1 to 20. Examples of the organic sulfonate include an alkylsulfonate having a carbon number of 1 to 20 and an arylsulfonate. The alkyl group of the alkylsulfonate may have a substituent, and examples of the substituent include fluorine, chlorine, bromine, an alkoxy group, an acyl group and an aryl group. Specific examples of the alkylsulfonate include methanesulfonate, ethanesulfonate, butanesulfonate, hexanesulfonate, octanesulfonate, benzylsulfonate, trifluoromethanesulfonate, pentafluoroethanesulfonate and nonafluorobutanesulfonate. The aryl group of the arylsulfonate includes a benzene ring, a naphthalene ring and an anthracene ring. The benzene ring, naphthalene ring and anthracene ring each may have a substituent, and the substituent is preferably a linear or branched alkyl group having a carbon number of 1 to 6, or a cycloalkyl group having a carbon number of 3 to 6. Specific examples of the linear or branched alkyl group and the cycloalkyl group include methyl, ethyl, n-propyl, isopropyl, n-butyl, i-butyl, tert-butyl, n-hexyl and cyclohexyl. Other examples of the substituent include an alkoxy group having a carbon number of 1 to 6, a halogen atom, cyano, nitro, an acyl group and an acyloxy group.

The amine compound having a phenoxy group and the ammonium salt compound having a phenoxy group are a compound where the alkyl group of an amine compound or ammonium salt compound has a phenoxy group at the terminal opposite the nitrogen atom. The phenoxy group may have a substituent. Examples of the substituent of the phenoxy group include an alkyl group, an alkoxy group, a halogen atom, a cyano group, a nitro group, a carboxyl group, a carboxylic acid ester group, a sulfonic acid ester group, an aryl group, an aralkyl group, an acyloxy group and an aryloxy group. The substitution site of the substituent may be any of 2- to 6-positions, and the number of substituents may be any in the range from 1 to 5.

The compound preferably has at least one oxyalkylene group between the phenoxy group and the nitrogen atom. The number of oxyalkylene groups within the molecule is 1 or more, preferably from 3 to 9, more preferably from 4 to 6. Among oxyalkylene groups, an oxyethylene group (—$CH_2CH_2O$—) and an oxypropylene group (—$CH(CH_3)CH_2O$— or —$CH_2CH_2CH_2O$—) are preferred, and an oxyethylene group is more preferred.

A tetraalkylammonium salt-type nitrogen-containing basic compound may also be used. Among these compounds, a tetraalkylammonium hydroxide having a carbon number of 1 to 8 (e.g., tetramethylammonium hydroxide, tetraethylammonium hydroxide, tetra-( n-butyl)ammonium hydroxide) is preferred. One of these nitrogen-containing basic compounds is used alone, or two or more thereof are used in combination.

The organic basic compound capable of more enhancing the effects by combining it with the compound represented by formula (C1) includes a basic compound represented by the following formula (C3) or (C4):

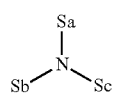

(C3)

In formula (C3), Sa, Sb and Sc each independently represents an alkyl group, a cycloalkyl group, an aryl group or an aralkyl group, and Sa and Sb may combine together to fond a ring.

The basic compound represented by formula (C3) is preferably tri(n-butyl)amine, tri(n-octyl)amine, tri(n-dodecyl)amine, dicyclomethylamine or dicycloethylamine.

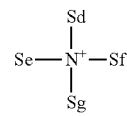

(C4)

In formula (C4), Sd, Se, Sf and Sg each independently represents an alkyl group, a cycloalkyl group, an aryl group or an aralkyl group, and Sd and Se may combine together to form a ring.

The basic compound represented by formula (C4) is preferably a tetraalkylammonium hydroxide, more preferably tetra-(n-butyl)ammonium hydroxide or tetra-(n-octyl)ammonium hydroxide.

The content of the organic basic compound is usually from 0.001 to 10 mass %, preferably from 0.01 to 5 mass %, based on the solid content of the resist composition.

The ratio between the acid generator and the organic basic compound used in the composition is preferably acid generator/organic basic compound (by mol)=from 1.0 to 300. That is, the molar ratio is preferably 1.0 or more in view of sensitivity and resolution and preferably 300 or less from the standpoint of suppressing the reduction in resolution due to thickening of the resist pattern with aging after exposure until heat treatment. The acid generator/basic compound (by mol) is more preferably from 1.5 to 200, still more preferably from 2.0 to 150.

Surfactant:

The resist composition of the present invention preferably further contains any one of fluorine-containing and/or silicon-containing surfactants (a fluorine-containing surfactant, a silicon-containing surfactant and a surfactant containing both a fluorine atom and a silicon atom), or two or more thereof.

By incorporating a fluorine- and/or silicon-containing surfactant into the resist composition of the present invention, a resist pattern with good sensitivity, resolution and adherence as well as less development defects can be obtained when using an exposure light source of 250 nm or less, particularly 220 nm or less.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing surfactant and a silicon-containing surfactant, such as EFtop EF301 and EF303 (produced by Shin-Akita Kasei K.K.); Florad FC430 and 431 (produced by Sumitomo 3M Inc.); Megaface F171, F173, F176, F189 and R08 (produced by Dainippon Ink & Chemicals, Inc.); Surflon S-382, SC101, 102, 103, 104, 105 and 106 (produced by Asahi Glass Co., Ltd.); and Troysol S-366 (produced by Troy Chemical). In addition, polysiloxane polymer KP-341 (produced by Shin-Etsu Chemical Co., Ltd.) may also be used as a silicon-containing surfactant.

Other than these known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene)) acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), a copolymer of a $C_6F_{13}$ group-containing acrylate (or methacrylate) with a (poly(oxyethylene)) acrylate (or methacrylate) and a (poly(oxypropylene)) acrylate (or methacrylate), a copolymer of a $C_8F_{17}$ group-containing acrylate (or methacrylate) with a (poly(oxyalkylene)) acrylate (or methacrylate), and a copolymer of a $C_8F_{17}$ group-containing acrylate (or methacrylate) with a (poly(oxyethylene)) acrylate (or methacrylate) and a (poly(oxypropylene)) acrylate (or methacrylate).

The preferred surfactant includes a surfactant represented by the following formula (Da):

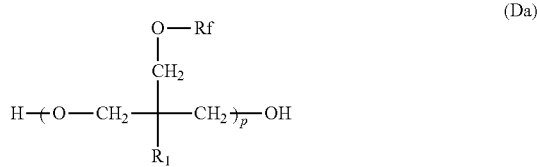

(Da)

In formula (Da), Rf represents a fluoroalkyl group.
$R_1$ represents a hydrogen atom or an alkyl group.
p represents an integer of 1 to 30.

In formula (Da), the fluoroalkyl group of Rf is preferably a fluoroalkyl group having a carbon number of 1 to 10. In the fluoroalkyl group, all hydrogen atoms may be substituted by a fluorine atom, or a part of hydrogen atoms may be substituted by a fluorine atom. The fluoroalkyl group may have an oxy group midway in the alkyl group. Examples of the fluoroalkyl group of Rf include —$CF_3$, —$C_2F_5$, —$C_3F_7$, —$C_4F_9$, —$CH_2CF_3$, —$CH_2C_2F_{53}$—$CH_2C_3F_7$, —$CH_2C_4F_9$, —$CH_2C_6F_{13}$, —$C_2H_4CF_3$, —$C_2H_4C_2F_5$, —$C_2H_4C_4F_9$, —$C_2H_4C_6F_{13}$, —$C_2H_4C_8F_{17}$, —$CH_2CH(CH_3)CF_3$, —$CH_2CH(CF_3)_2$, —$CH_2CF(CF_3)_2$, —$CH_2CH(CF_3)_2$, —$CF_2CF(CF_3)OCF_3$, —$CF_2CF(CF_3)OC_3F_7$, —$C_2H_4OCF_2CF(CF_3)OCF_3$, —$C_2H_4OCF_2CF(CF_3)OC_3F_7$ and —$C(CF_3)$=$C(CF(CF_3)_2)_2$.

The alkyl group of $R_1$ is preferably a linear alkyl group having a carbon number of 1 to 5.

Specific examples of the surfactant represented by formula (Da) are set forth below, but the present invention is not limited thereto.

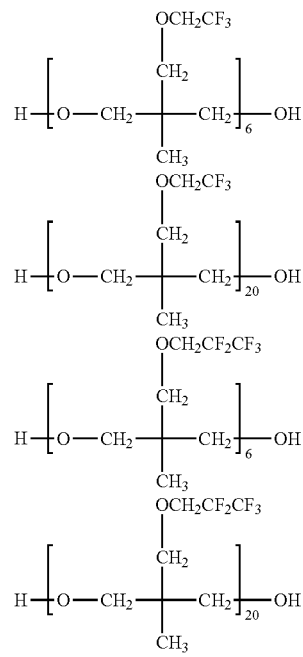

The amount added of the surfactant is preferably from 0.0001 to 2 mass %, more preferably from 0.001 to 1 mass %, based on the entire amount (excluding the solvent) of the resist composition.

Compound having a proton acceptor functional group and undergoing decomposition upon irradiation with actinic rays or radiation to generate a compound reduced in or deprived of the proton acceptor property or changed to be acidic from being proton acceptor-functioning In the resist composition of the present invention, a compound having a proton acceptor functional group and undergoing decomposition upon irradiation with actinic rays or radiation to generate a compound reduced in or deprived of the proton acceptor property or changed to be acidic from being proton acceptor-functioning (hereinafter sometimes referred to as a "compound (PA)") may be used in view of sensitivity, resolution and line width roughness.

The compound reduced in or deprived of the proton acceptor property or changed to be acidic from being proton acceptor-functioning, which is generated resulting from decomposition of the compound (PA) upon irradiation with actinic rays or radiation, includes a compound represented by the following formula (PA-I):

Q-A-(X)$_n$—B—R    (PA-I)

In formula (PA-I), Q represents a sulfo group (—$SO_3H$) or a carboxyl group (—$CO_2H$).
A represents a divalent linking group.
X represents —$SO_2$— or —CO—.
n represents 0 or 1.
B represents a single bond, an oxygen atom or —N(Rx)-.
Rx represents a hydrogen atom or a monovalent organic group.
R represents a monovalent organic group having a proton acceptor functional group, or a monovalent organic group having an ammonium group.

The divalent linking group of A is preferably a divalent linking group having a carbon number of 2 to 12, such as alkylene group and phenylene group, more preferably an alkylene group having at least one fluorine atom, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is replaced by a fluorine atom, more preferably an alkylene group where the carbon atom bonded to the Q site has a fluorine atom, still more preferably a perfluoroalkylene group, yet still more preferably a perfluoroethylene group, a perfluoropropylene group or a perfluorobutylene group.

The monovalent organic group of Rx is preferably a monovalent organic group having a carbon number of 4 to 30, and examples thereof include an alkyl group, a cycloalkyl group, an aryl group, an aralkyl group and an alkenyl group.

The alkyl group of Rx, which may have a substituent, is preferably a linear or branched alkyl group having a carbon number of 1 to 20 and may contain an oxygen atom, a sulfur atom or a nitrogen atom in the alkyl chain. Specific examples thereof include a linear alkyl group such as methyl group, ethyl group, n-propyl group, n-butyl group, n-pentyl group, n-hexyl group, n-octyl group, n-dodecyl group, n-tetradecyl group and n-octadecyl group; and a branched alkyl group such as isopropyl group, isobutyl group, tert-butyl group, neopentyl group and 2-ethylhexyl group.

The alkyl group having a substituent includes, particularly, a group where a cycloalkyl group is substituted to a linear or branched alkyl group, such as adamantylmethyl group, adamantylethyl group, cyclohexylethyl group and camphor residue.

The cycloalkyl group of Rx, which may have a substituent, is preferably a cycloalkyl group having a carbon number of 3 to 20 and may contain an oxygen atom in the ring. Specific examples thereof include a cyclopropyl group, a cyclopentyl group, a cyclohexyl group, a norbornyl group and an adamantyl group.

The aryl group of Rx, which may have a substituent, is preferably an aryl group having a carbon number of 6 to 14, and examples thereof include a phenyl group and a naphthyl group.

The aralkyl group of Rx, which may have a substituent, is preferably an aralkyl group having a carbon number of 7 to 20, and examples thereof include a benzyl group, a phenethyl group, a naphthylmethyl group and a naphthylethyl group.

The alkenyl group of Rx, which may have a substituent, includes, for example, a group having a double bond at an arbitrary position of the alkyl group described as Rx.

The proton acceptor functional group of R is a functional group having a group or electron capable of electrostatically interacting with a proton and indicates, for example, a functional group having a macrocyclic structure such as cyclic polyether, or a functional group containing a nitrogen atom having a lone electron pair not contributing to π-conjugation. The nitrogen atom having a lone electron pair not contributing to π-conjugation is, for example, a nitrogen atom having a partial structure represented by either one of the following formulae:

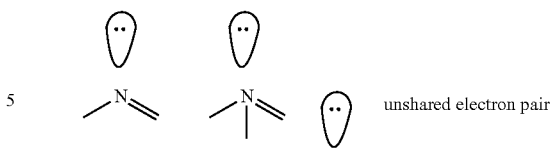

Preferred examples of the partial structure of the proton acceptor functional group include a crown ether structure, an aza-crown ether structure, a tertiary amine structure, a secondary amine structure, a primary amine structure, a pyridine structure, an imidazole structure and a pyrazine structure.

Preferred examples of the partial structure of the ammonium group include a tertiary ammonium structure, a secondary ammonium structure, a primary ammonium structure, a pyridinium structure, an imidazolinium structure and a pyrazinium structure.

The group containing such a structure preferably has a carbon number of 4 to 30, and examples thereof include an alkyl group, a cycloalkyl group, an aryl group, an aralkyl group and an alkenyl group.

The alkyl group, cycloalkyl group, aryl group, aralkyl group and alkenyl group in the alkyl group, cycloalkyl group, aryl group, aralkyl group or alkenyl group as R containing a proton acceptor functional group or an ammonium group are the same as the alkyl group, cycloalkyl group, aryl group, aralkyl group and alkenyl group described for Rx.

Examples of the substituent which the above-described groups each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). As for the cyclic structure in the aryl group, cycloalkyl group and the like, examples of the substituent further include an alkyl group (preferably having a carbon number of 1 to 20). As for the aminoacyl group, examples of the substituent further include one or two alkyl groups (preferably having a carbon number of 1 to 20).

When B is —N(Rx)-, R and Rx preferably combine together to form a ring. By forming a ring structure, the stability is enhanced and the composition using this compound is also increased in the storage stability. The number of carbons constituting the ring is preferably from 4 to 20, and the ring may be monocyclic or polycyclic and may contain an oxygen atom, a sulfur atom or a nitrogen atom.

Examples of the monocyclic structure include a 4-membered ring, a 5-membered ring, a 6-membered ring, a 7-membered ring and a 8-membered ring each containing a nitrogen atom. Examples of the polycyclic structure include a structure comprising a combination of two monocyclic structures or three or more monocyclic structures. The monocyclic structure and polycyclic structure each may have a substituent, and preferred examples of the substituent include a halogen atom, a hydroxyl group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 15), an acyloxy group (preferably having a carbon number of 2 to 15), an alkoxycarbonyl group (preferably having a carbon number of 2 to 15), and an aminoacyl group (preferably having a carbon number of 2 to 20). As for the cyclic structure in the aryl group, cycloalkyl group and the like, examples of the substituent further include an alkyl group (preferably having a carbon number of 1 to 15). As for the aminoacyl group, examples of the substituent further include one or two alkyl groups (preferably having a carbon number of 1 to 15).

Out of the compounds represented by formula (PA-I), a compound where the Q site is a sulfonic acid can be synthesized using a general sulfonamidation reaction. For example, this compound can be obtained by a method of selectively reacting one sulfonyl halide moiety of a bis-sulfonyl halide compound with an amine compound to form a sulfonamide bond and then hydrolyzing the other sulfonyl halide moiety, or a method of ring-opening a cyclic sulfonic anhydride through reaction with an amine compound.

Specific examples of the compound represented by formula (PA-I) are set forth below, but the present invention is not limited thereto.

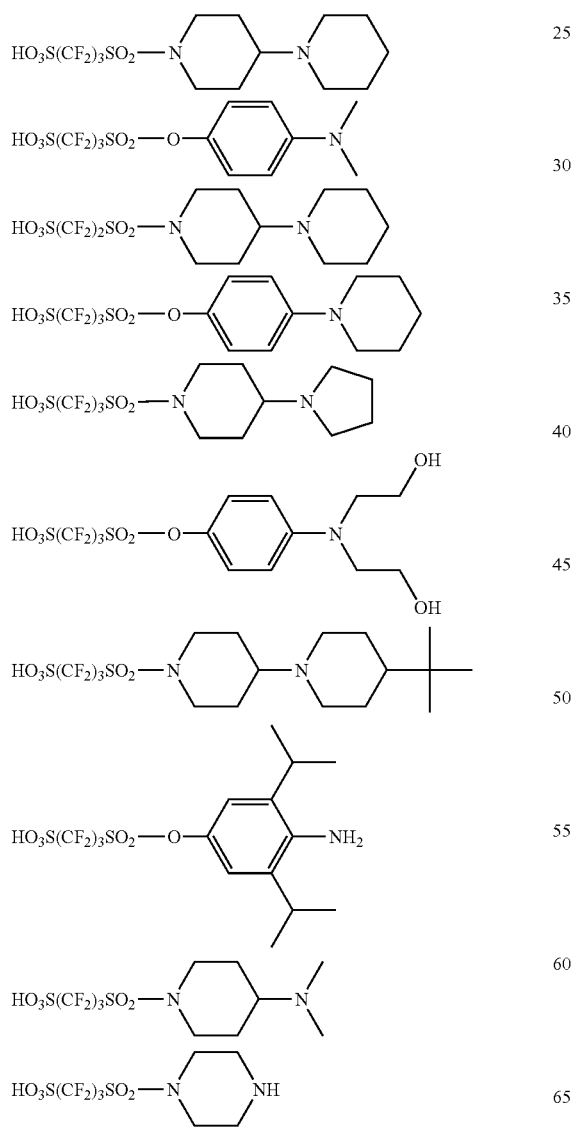

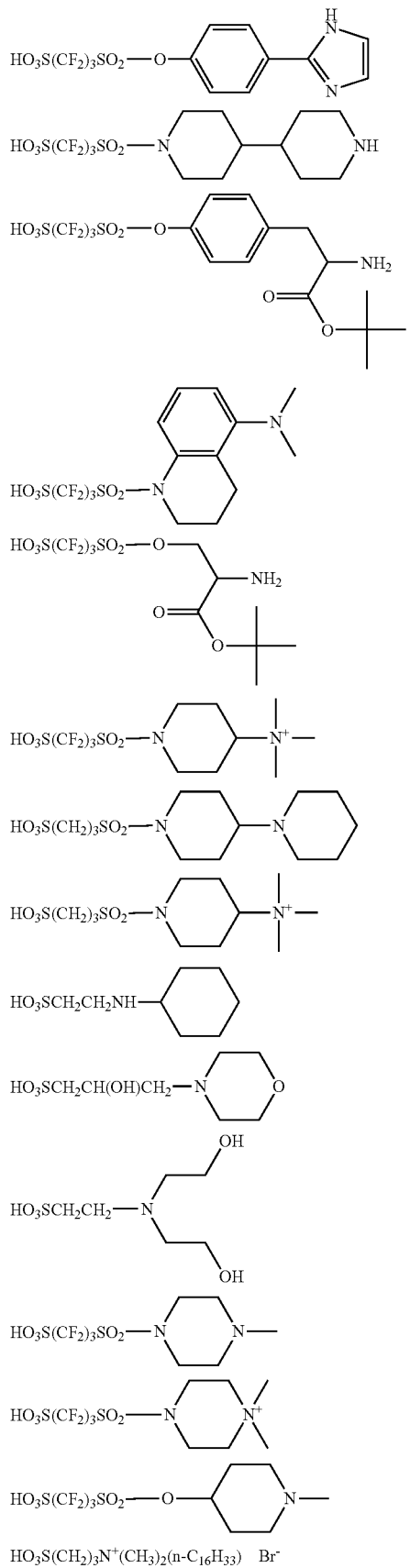

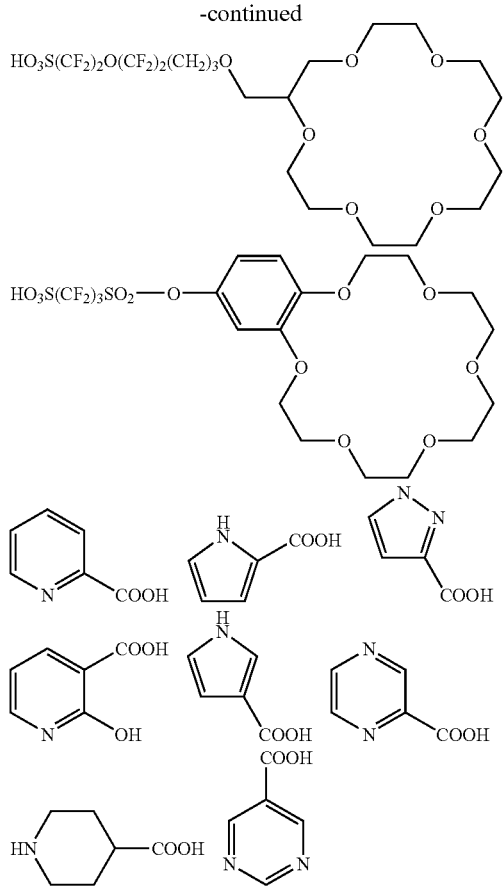

The compound reduced in or deprived of the proton acceptor property or changed to be acidic from being proton acceptor-functioning, which is generated resulting from decomposition of the compound (PA) upon irradiation with actinic rays or radiation, also includes a compound represented by the following formula (PA-II):

$$Q_1\text{-}X_1\text{—NH—}X_2\text{-}Q_2 \quad \text{(PA-II)}$$

In formula (PA-II), $Q_1$ and $Q_2$ each independently represents a monovalent organic group, provided that either one of $Q_1$ and $Q_2$ has a proton acceptor functional group. $Q_1$ and $Q_2$ may combine together to form a ring and the ring formed may have a proton acceptor functional group.

$X_1$ and $X_2$ each independently represents —CO— or —$SO_2$—.

The monovalent organic group of $Q_1$ and $Q_2$ in formula (PA-II) is preferably a monovalent organic group having a carbon number of 1 to 40, and examples thereof include an alkyl group, a cycloalkyl group, an aryl group, an aralkyl group, and an alkenyl group.

The alkyl group of $Q_1$ and $Q_2$, which may have a substituent, is preferably a linear or branched alkyl group having a carbon number of 1 to 30 and may contain an oxygen atom, a sulfur atom or a nitrogen atom in the alkyl chain. Specific examples thereof include a linear alkyl group such as methyl group, ethyl group, n-propyl group, n-butyl group, n-pentyl group, n-hexyl group, n-octyl group, n-dodecyl group, n-tetradecyl group and n-octadecyl group; and a branched alkyl group such as isopropyl group, isobutyl group, tert-butyl group, neopentyl group and 2-ethylhexyl group.

The cycloalkyl group of $Q_1$ and $Q_2$, which may have a substituent, is preferably a cycloalkyl group having a carbon number of 3 to 20 and may contain an oxygen atom or a nitrogen atom in the ring. Specific examples thereof include a cyclopropyl group, a cyclopentyl group, a cyclohexyl group, a norbornyl group and an adamantyl group.

The aryl group of $Q_1$ and $Q_2$, which may have a substituent, is preferably an aryl group having a carbon number of 6 to 14, and examples thereof include a phenyl group and a naphthyl group.

The aralkyl group of $Q_1$ and $Q_2$, which may have a substituent, is preferably an aralkyl group having a carbon number of 7 to 20, and examples thereof include a benzyl group, a phenethyl group, a naphthylmethyl group and a naphthylethyl group.

The alkenyl group of $Q_1$ and $Q_2$, which may have a substituent, includes a group having a double bond at an arbitrary position of the alkyl group above.

Examples of the substituent which these groups each may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 20), an alkoxycarbonyl group (preferably having a carbon number of 2 to 20), and an aminoacyl group (preferably having a carbon number of 2 to 10). As for the cyclic structure in the aryl group, cycloalkyl group and the like, examples of the substituent further include an alkyl group (preferably having a carbon number of 1 to 10). As for the aminoacyl group, examples of the substituent further include an alkyl group (preferably having a carbon number of 1 to 10). Examples of the alkyl group having a substituent include a perfluoroalkyl group such as perfluoromethyl group, perfluoroethyl group, perfluoropropyl group and perfluorobutyl group.

Either one monovalent organic group $Q_1$ or $Q_2$ has a proton acceptor functional group. Examples of the proton acceptor functional group in $Q_1$ and $Q_2$ are the same as those of the proton acceptor functional group in R.

The proton acceptor functional group may be substituted by an organic group having a bond that is breakable by an acid. Examples of the organic group having a bond breakable by an acid include an amido group, an ester group (preferably a tertiary alkyloxycarbonyl group), an acetal group (preferably a 1-alkyloxy-alkyloxy group), a carbamoyl group and a carbonate group.

When $Q_1$ and $Q_2$ combine together to form a ring and the ring formed has a proton acceptor functional group, examples of the structure thereof include a structure where the organic group of $Q_1$ or $Q_2$ is further bonded by an alkylene group, an oxy group, an imino group or the like.

In formula (PA-II), at least either one of $X_1$ and $X_2$ is preferably —$SO_2$—.

The compound represented by formula (PA-II) is preferably a compound represented by the following formula (PA-III):

$$Q_1\text{-}X_1\text{—NH—}X_2\text{-A-}(X_3)_n\text{—B-}Q_3 \quad \text{(PA-III)}$$

In formula (PA-III), $Q_1$ and $Q_3$ each independently represents a monovalent organic group, provided that either one of $Q_1$ and $Q_3$ has a proton acceptor functional group. $Q_1$ and $Q_3$ may combine together to form a ring and the ring formed may have a proton acceptor functional group.

$X_1$, $X_2$ and $X_3$ each independently represents —CO— or —$SO_2$—.

A represents a divalent linking group.

B represents a single bond, an oxygen atom or —N(Qx)-.

Qx represents a hydrogen atom or a monovalent organic group.

When B is —N(Qx)-, $Q_3$ and Qx may combine together to form a ring.

n represents 0 or 1.

$Q_1$ has the same meaning as $Q_1$ in formula (PA-II).

Examples of the organic group of $Q_3$ are the same as those of the organic group of $Q_1$ and $Q_2$ in formula (PA-II).

The divalent linking group of A is preferably a divalent linking group having a carbon number of 1 to 8 and containing a fluorine atom, and examples thereof include a fluorine atom-containing alkylene group having a carbon number of 1 to 8, and a fluorine atom-containing phenylene group. A fluorine atom-containing alkylene group is more preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is replaced by a fluorine atom, more preferably a perfluoroalkylene group, still more preferably a perfluoroethylene group, a perfluoropropylene group, or a perfluorobutylene group.

The monovalent organic group of Qx is preferably an organic group having a carbon number of 4 to 30, and examples thereof include an alkyl group, a cycloalkyl group, an aryl group, an aralkyl group and an alkenyl group. Examples of the alkyl group, cycloalkyl group, aryl group, aralkyl group and alkenyl group are the same as those described above.

In formula (PA-III), $X_1$, $X_2$ and $X_3$ each is preferably —$SO_2$—.

Specific examples of the compound represented by formula (PA-II) are set forth below, but the present invention is not limited thereto.

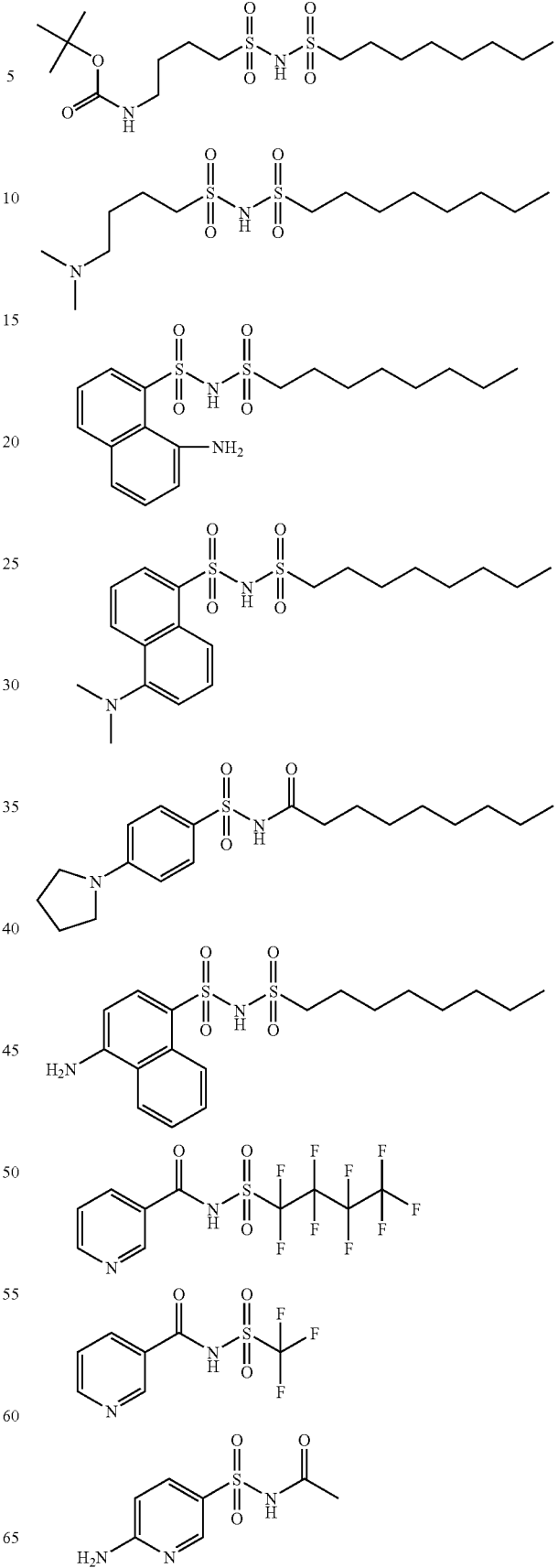

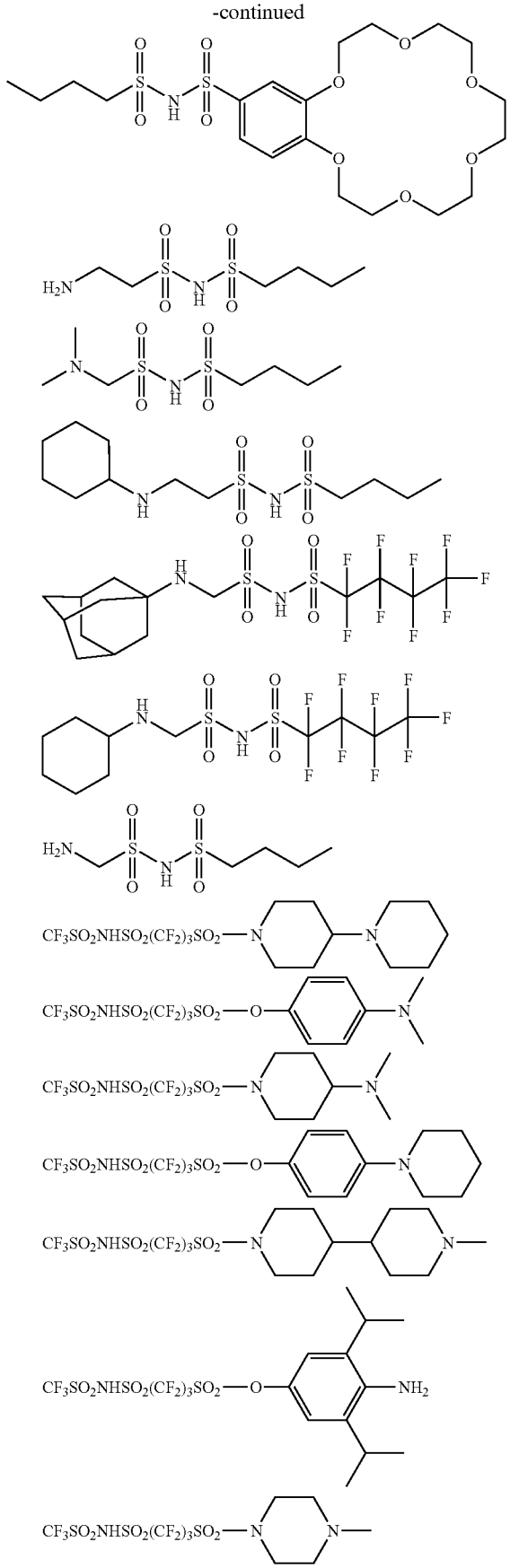

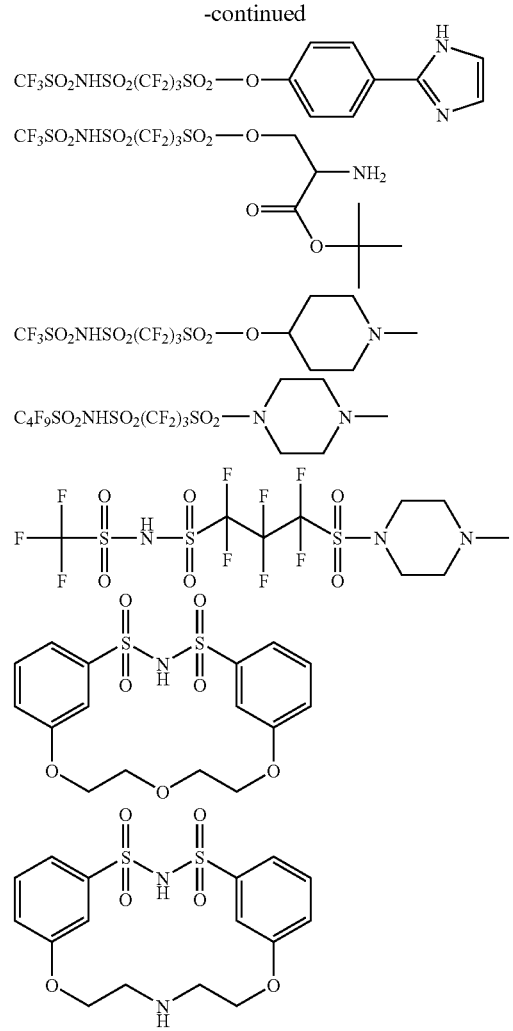

The compound (PA) is preferably a sulfonium salt compound of the compound represented by formula (PA-I), (PA-II) or (PA-III), or an iodonium salt compound of the compound represented by formula (PA-I), (PA-II) or (PA-III), more preferably a compound represented by the following formula (PA1) or (PA2):

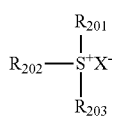

(PA1)

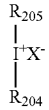

(PA2)

In formula (PA1), $R_{201}$, $R_{202}$ and $R_{203}$ each independently represents an organic group.

$X^-$ represents a sulfonate or carboxylate anion resulting from removal of a hydrogen atom in the —$SO_3H$ moiety or —COOH moiety of the compound represented by formula (PA-I), or an anion of the compound represented by formula (PA-II) or (PA-III).

Specific examples, preferred embodiments and the like of the organic group of $R_{201}$ to $R_{205}$ in formulae (PA1) and (PA2) are the same as the organic group of $R_{201}$ to $R_{205}$ in the above-described formulae (ZI) and (ZII).

The compound (PA) decomposes upon irradiation with actinic rays or radiation to generate, for example, a compound represented by formula (PA-1) or (PA-2).

The compound represented by formula (PA-1) is a compound having a sulfo or carboxyl group together with a proton acceptor functional group and thereby being reduced in or deprived of the proton acceptor property or changed to be acidic from being proton acceptor-functioning as compared with the compound (PA).

The compound represented by formula (PA-2) is a compound having an organic sulfonylimino or organic carbonylimino group together with a proton acceptor functional group and thereby being reduced in or deprived of the proton acceptor property or changed to be acidic from being proton acceptor-functioning as compared with the compound (PA).

In the present invention, the expression "reduced in the acceptor property" means that when a noncovalent bond complex as a proton adduct is produced from a proton acceptor functional group-containing compound and a proton, the equilibrium constant at the chemical equilibrium decreases.

The proton acceptor property can be confirmed by measuring the pH.

Specific examples of the compound (PA) capable of generating a compound represented by formula (PA-I) upon irradiation with actinic rays or radiation are set forth below, but the present invention is not limited thereto.

(PA-1)

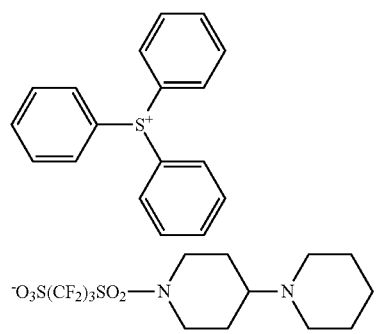

(PA-2)

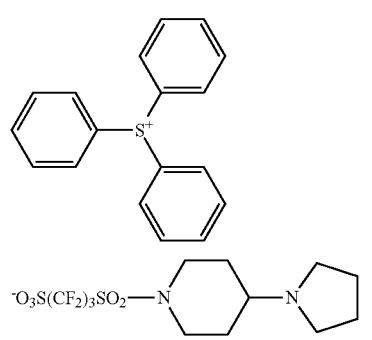

(PA-3)

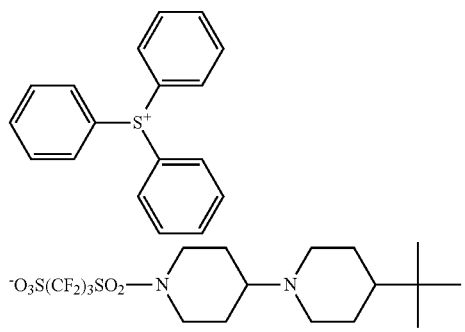

(PA-4)

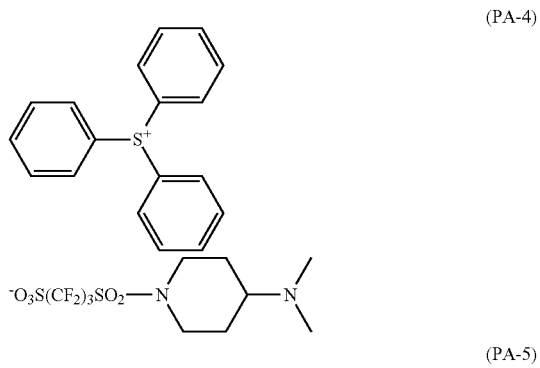

(PA-5)

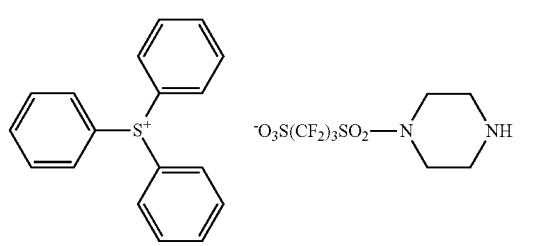

(PA-6)

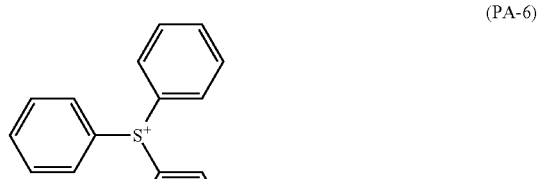

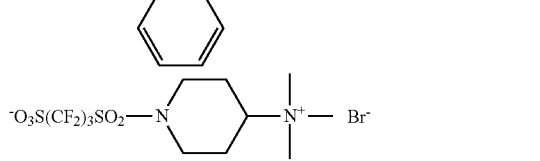

(PA-7)

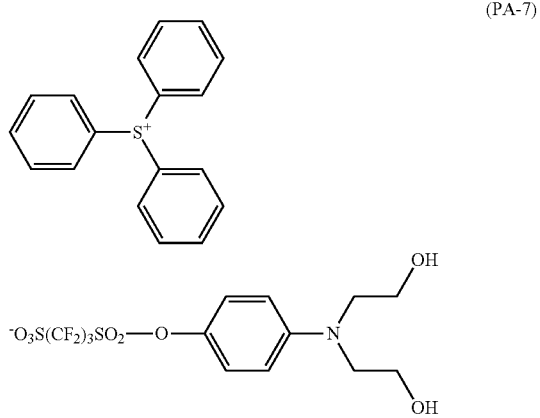

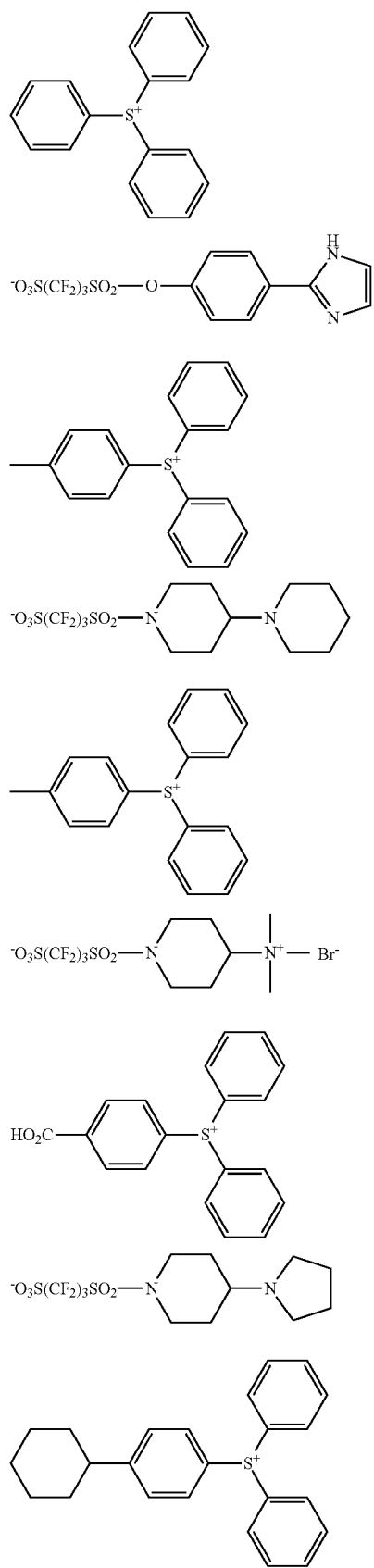
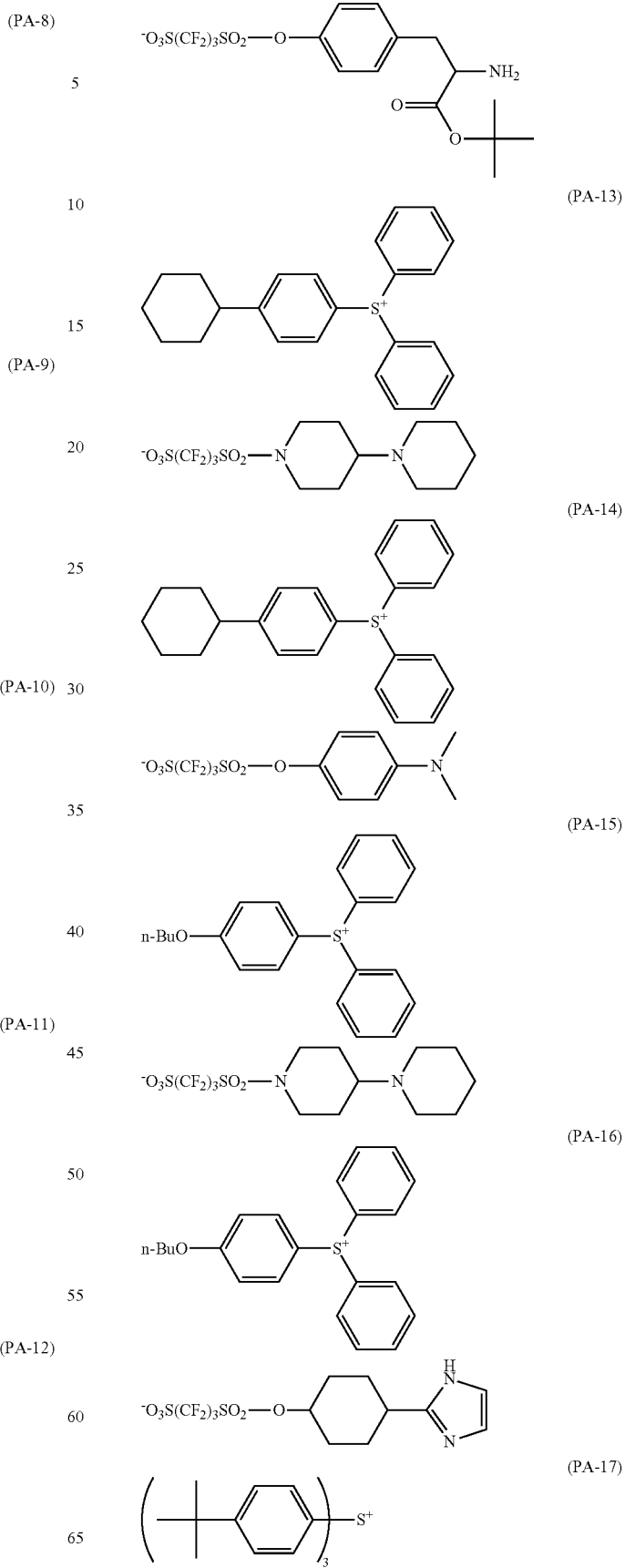

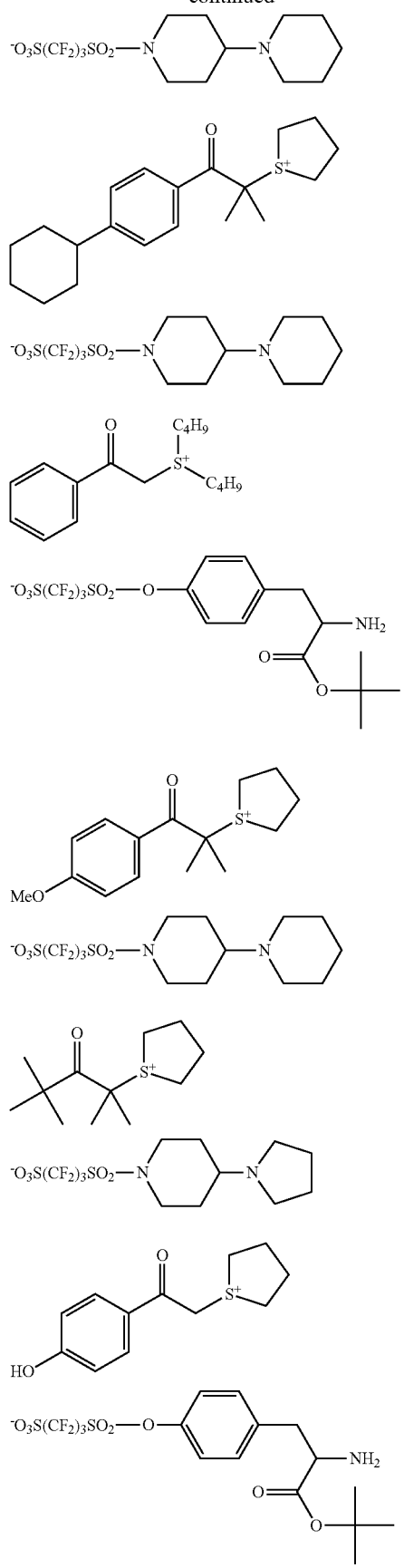
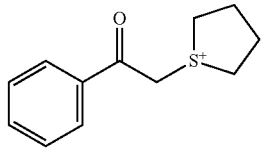
(PA-23)
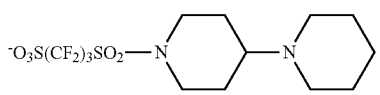
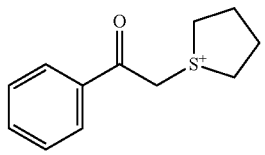
(PA-24)
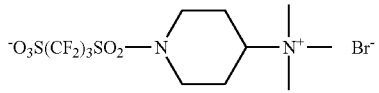
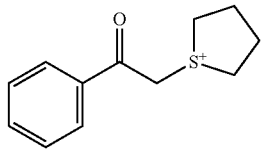
(PA-25)
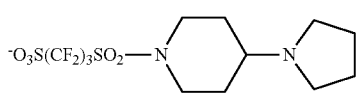
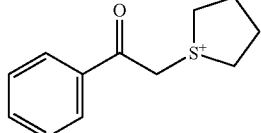
(PA-26)
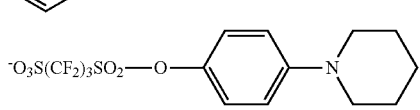
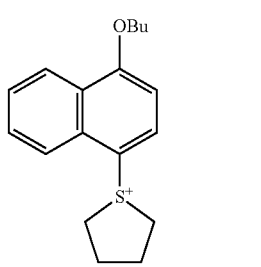
(PA-27)
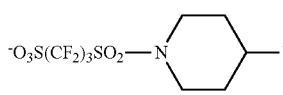
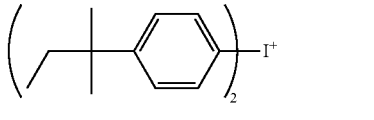
(PA-28)
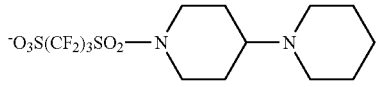

(PA-29)
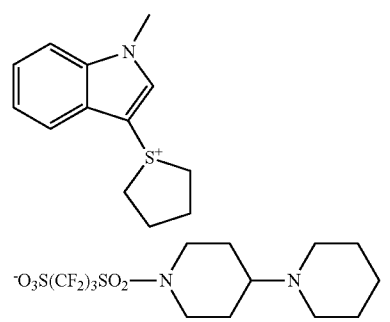
(PA-30)
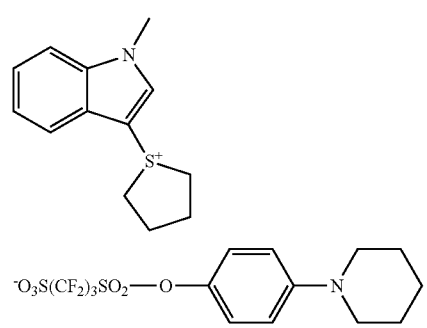
(PA-31)
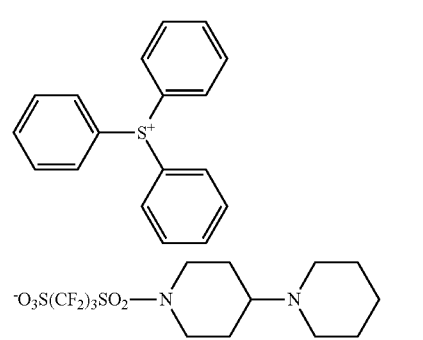
(PA-32)
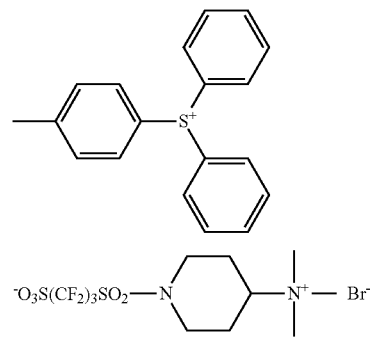
(PA-33)
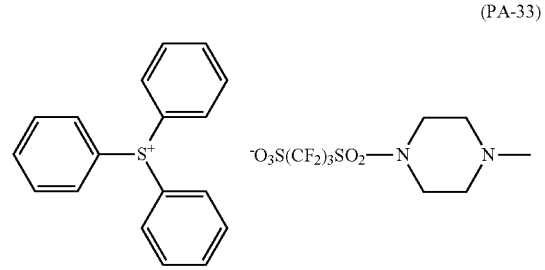
(PA-34)
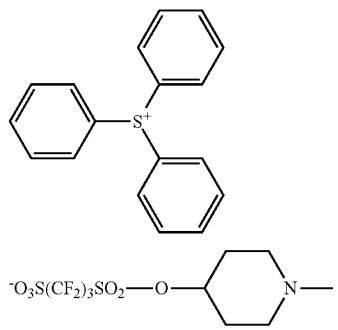
(PA-35)
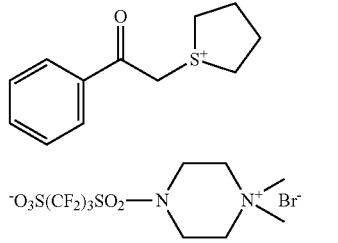
(PA-36)
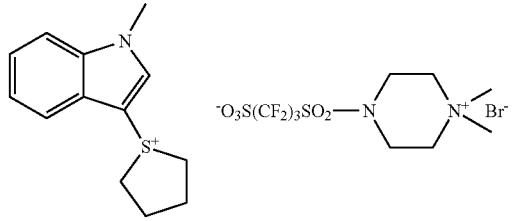
(PA-37)
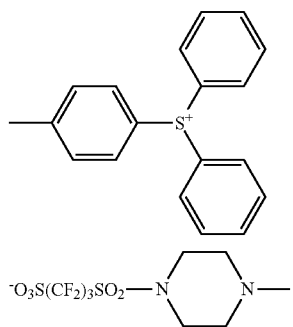
(PA-38)
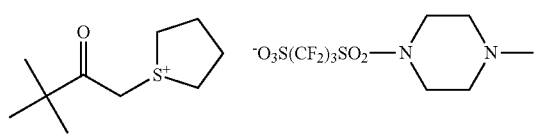
(PA-39)
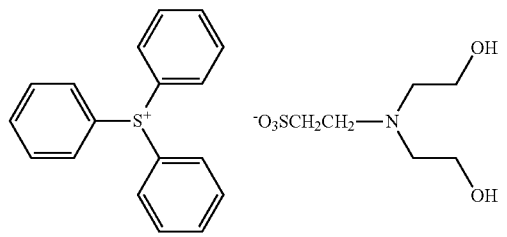

(PA-40)
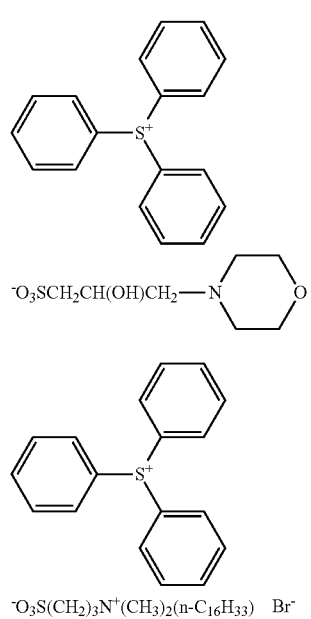
(PA-41)
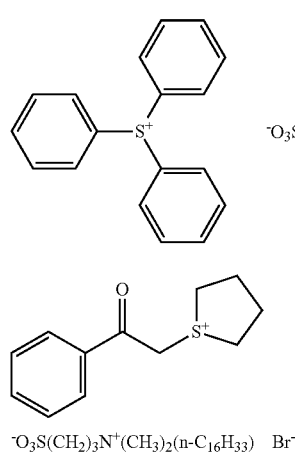
(PA-42)
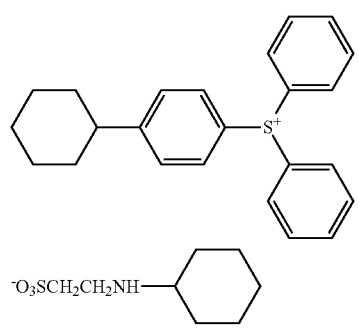
(PA-43)
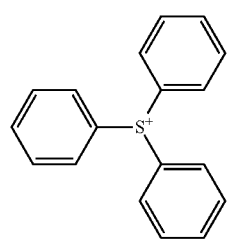
(PA-44)
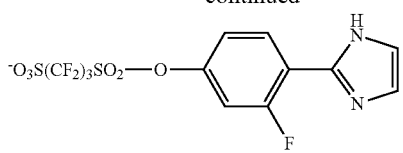
(PA-45)
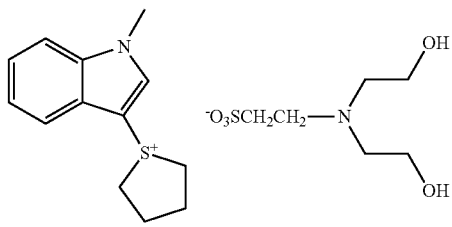
(PA-46)
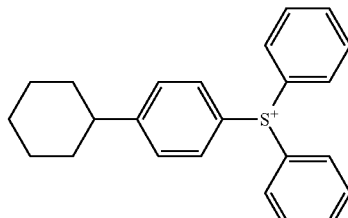
(PA-47)
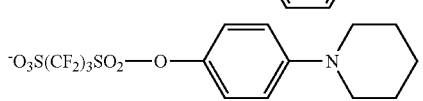
(PA-48)
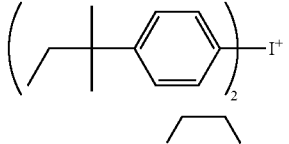
(PA-49)
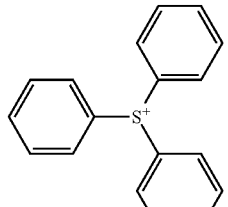
(PA-50)
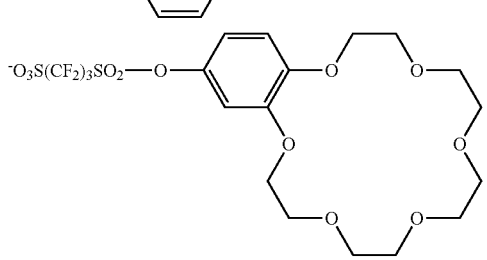
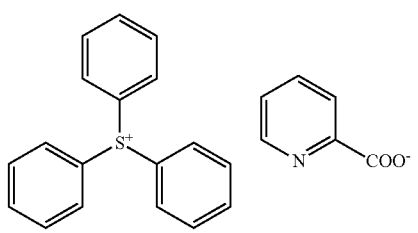

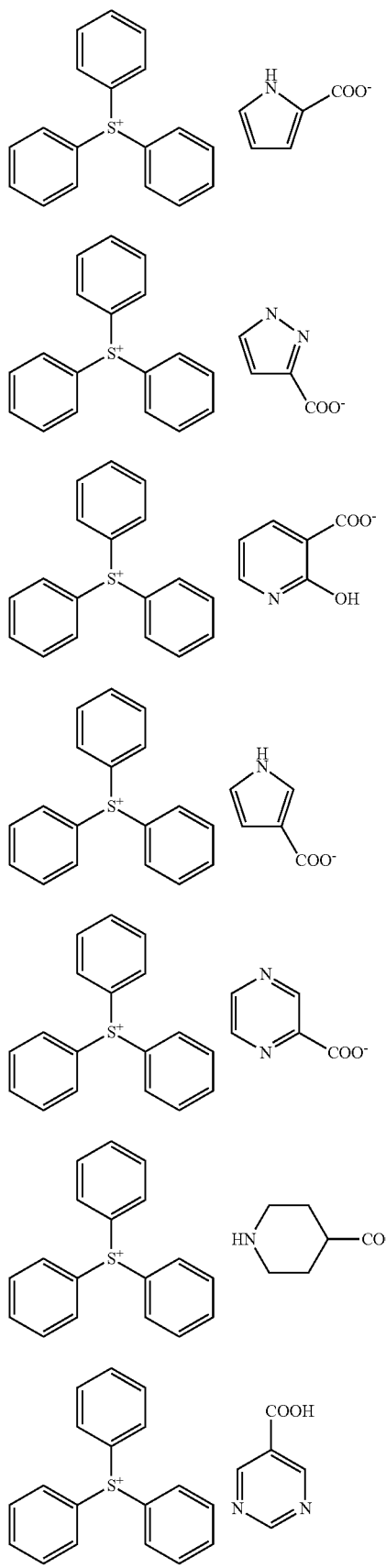

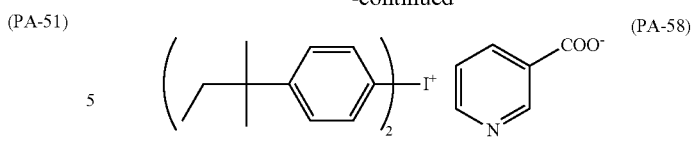

These compounds can be easily synthesized from a compound represented by formula (PA-I) or a lithium, sodium or potassium salt thereof and a hydroxide, bromide, chloride or the like of iodonium or sulfonium, by utilizing the salt exchange method described in JP-T-11-501909 (the term "JP-T" as used herein means a "published Japanese translation of a PCT patent application") or JP-A-2003-246786.

Specific examples of the compound (PA) capable of generating a compound represented by formula (PA-II) upon irradiation with actinic rays or radiation are set forth below, but the present invention is not limited thereto.

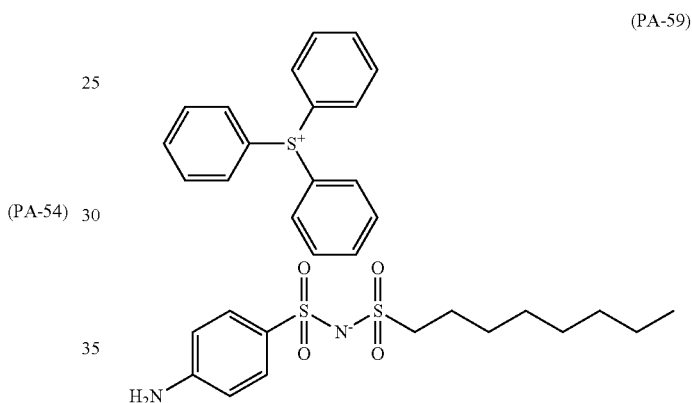

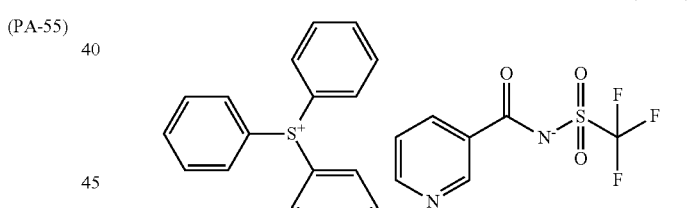

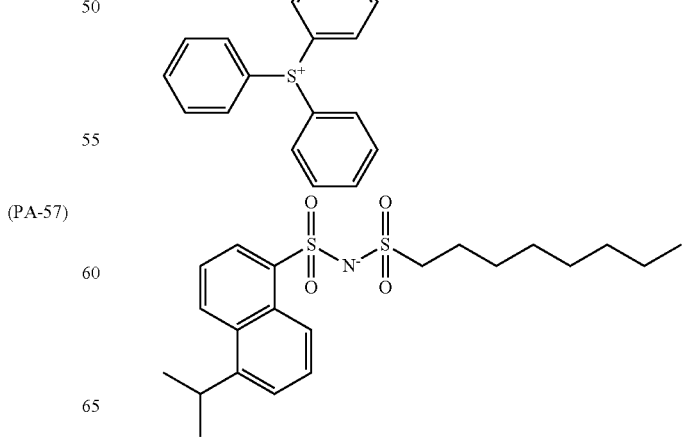

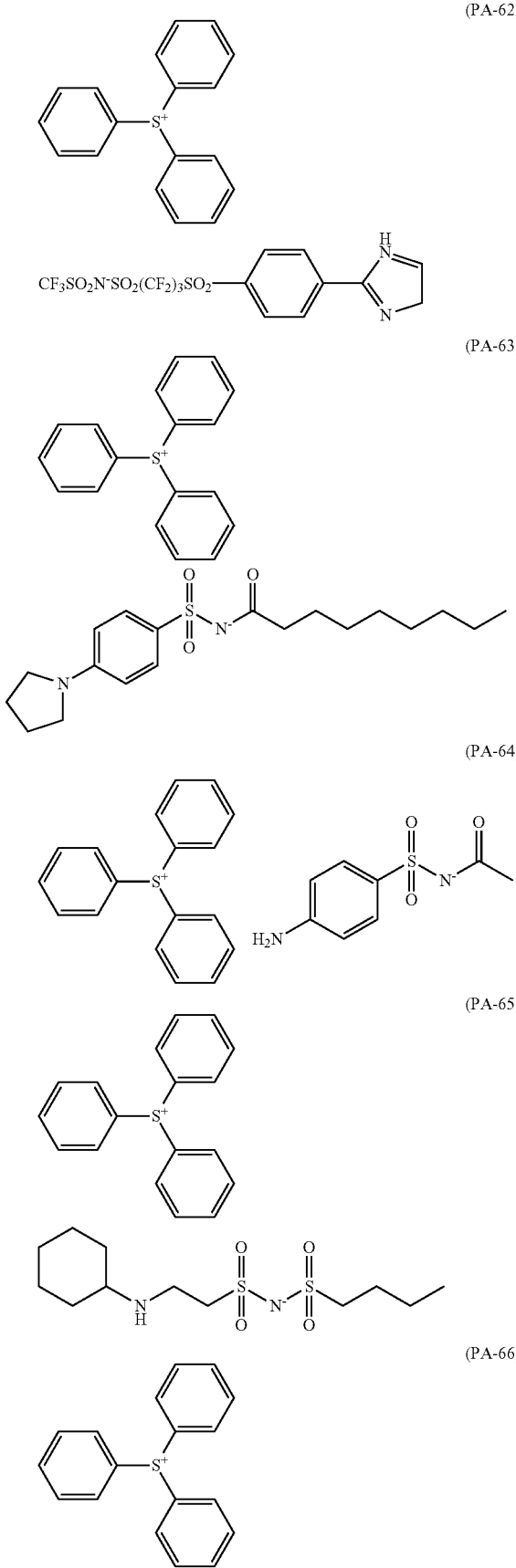

(PA-71)
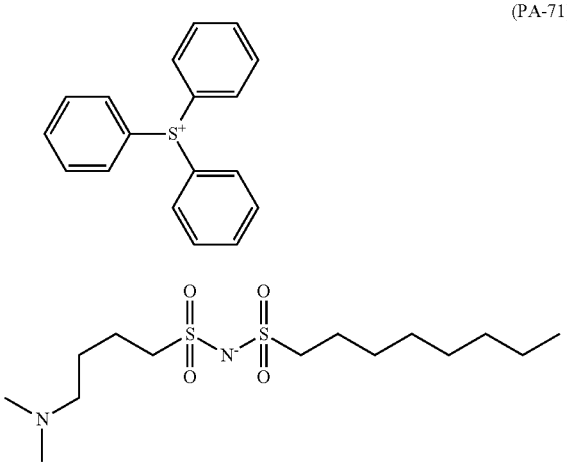
(PA-75)
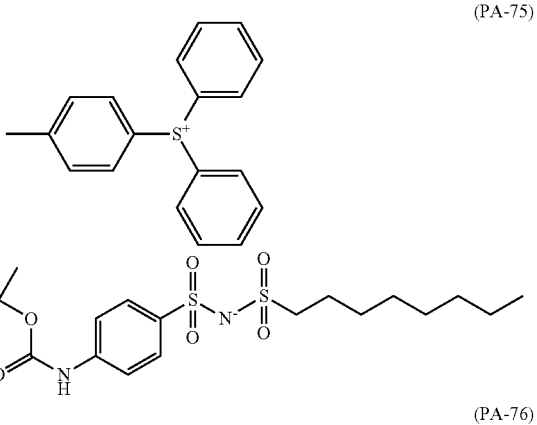
(PA-72)
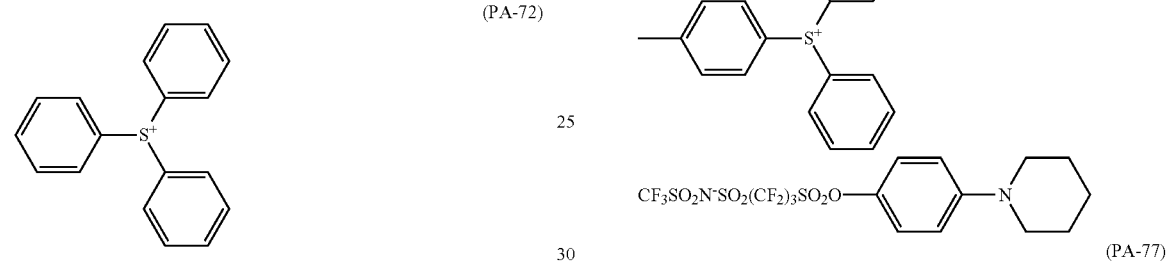
(PA-76)
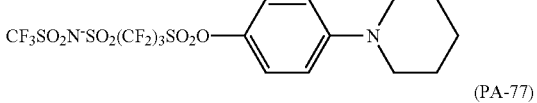
CF$_3$SO$_2$N$^-$SO$_2$(CF$_2$)$_3$SO$_2$O
(PA-73)
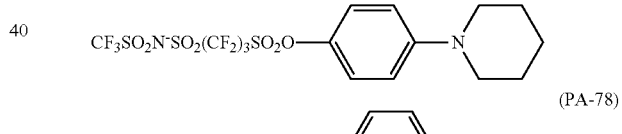
CF$_3$SO$_2$N$^-$SO$_2$(CF$_2$)$_3$SO$_2$O
(PA-77)
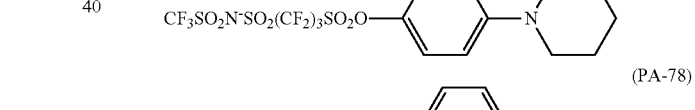
CF$_3$SO$_2$N$^-$SO$_2$(CF$_2$)$_3$SO$_2$O
(PA-74)
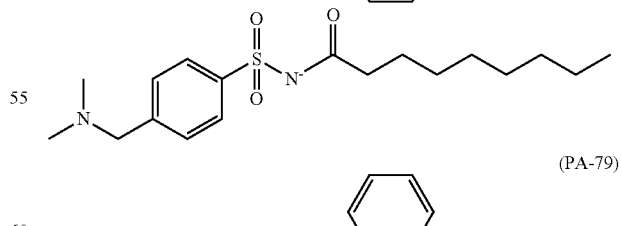
(PA-78)
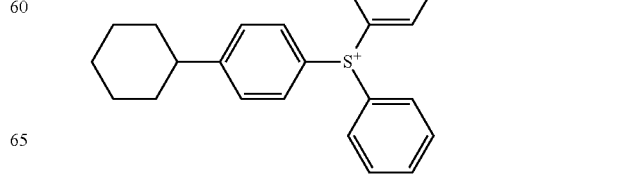
(PA-79)
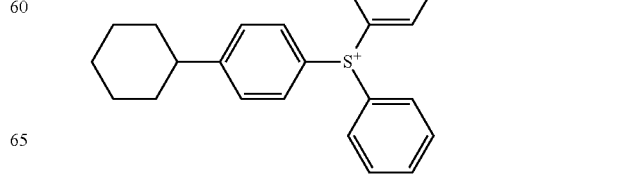

-continued
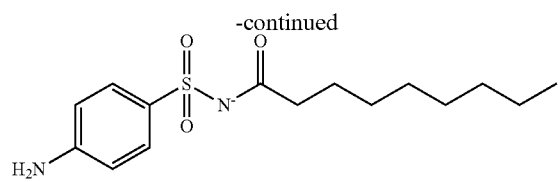
(PA-80)
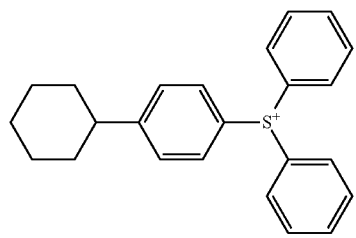
(PA-81)
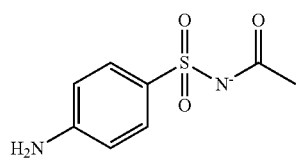
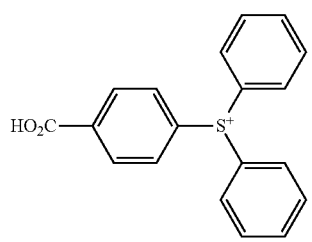
(PA-82)
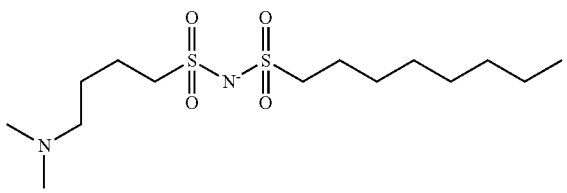
(PA-83)
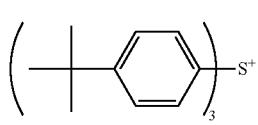
-continued
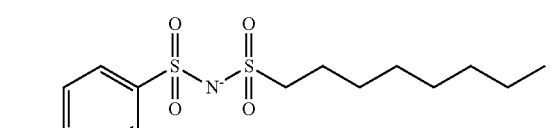
(PA-84)
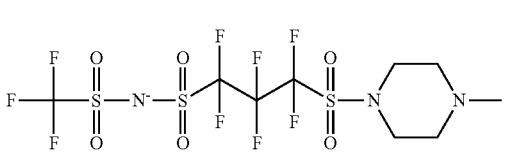
(PA-85)
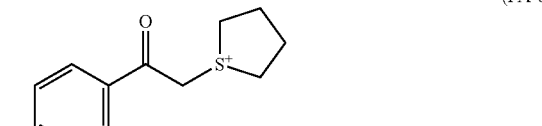
(PA-86)
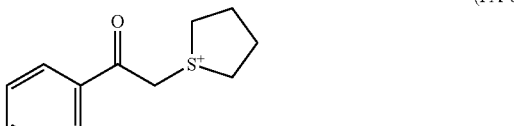
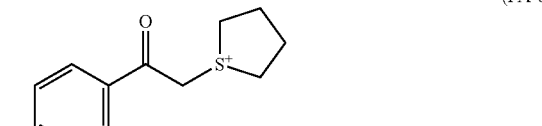
(P-87)
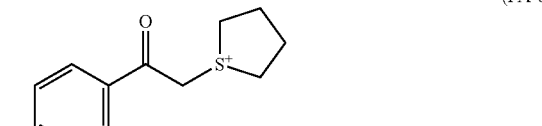

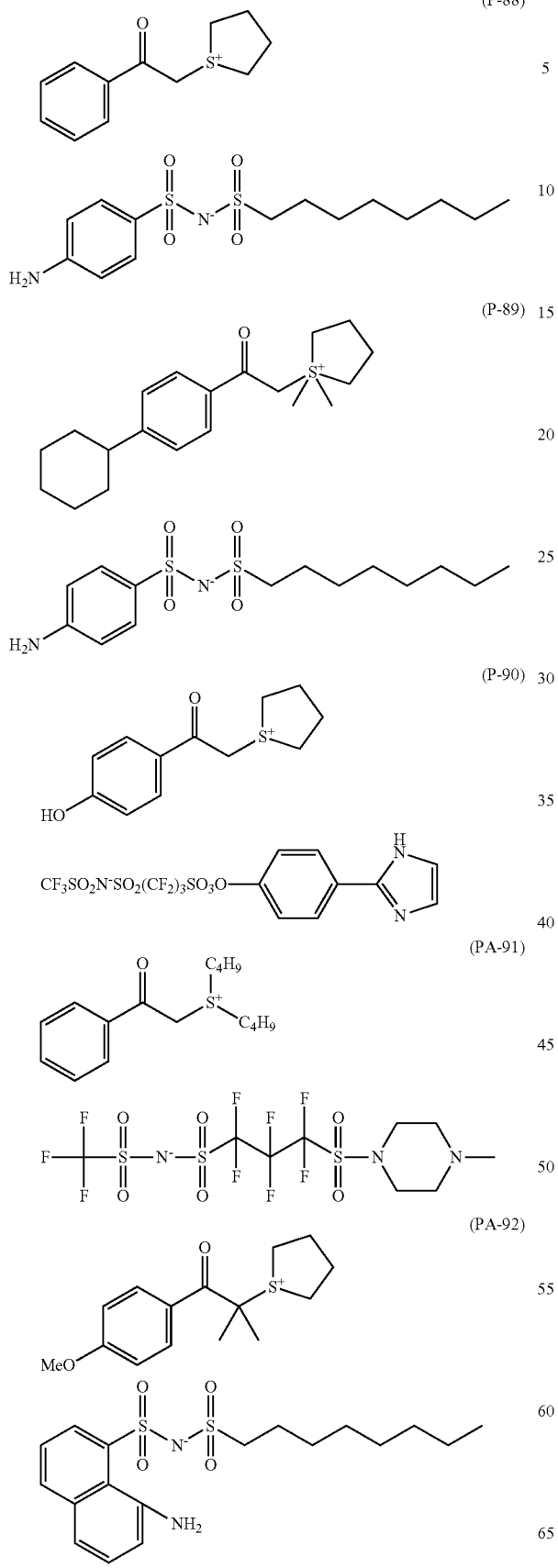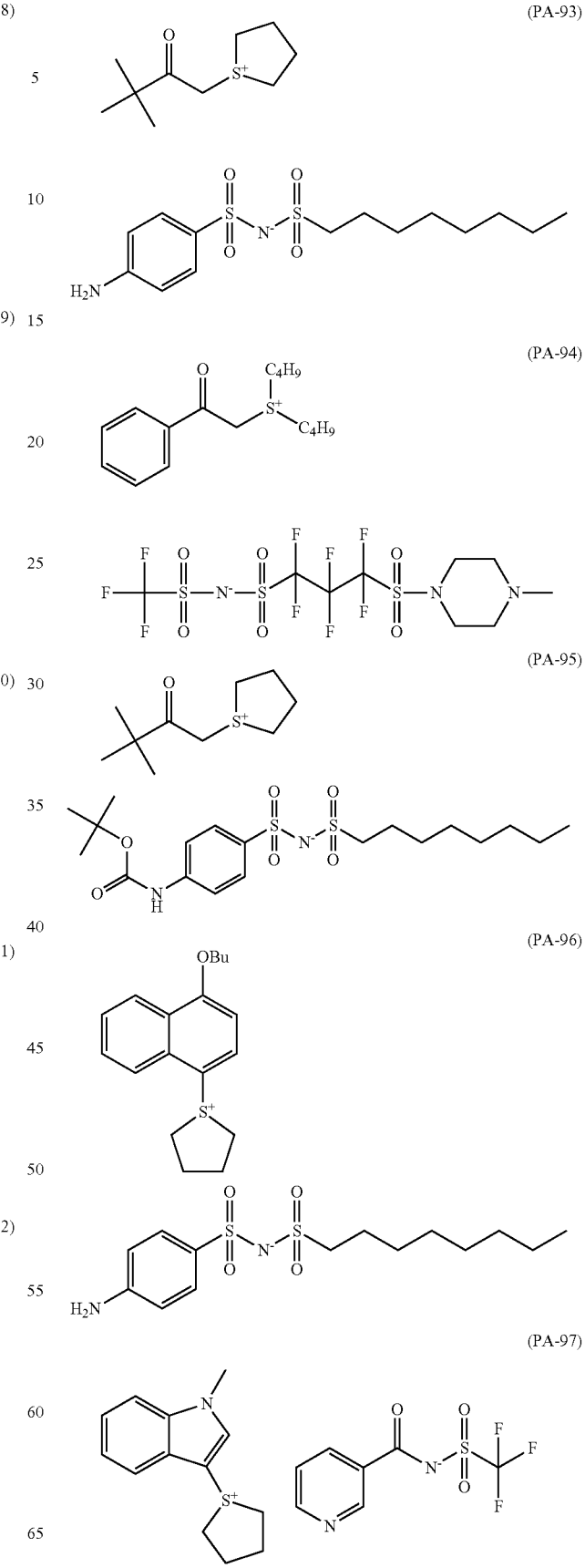

-continued (PA-98)
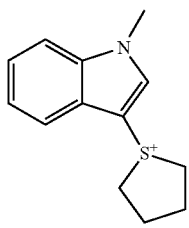

(PA-99)
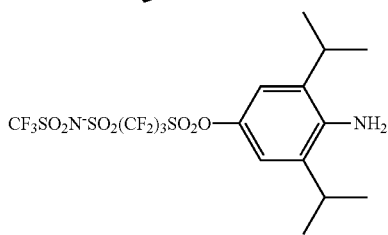

(PA-100)
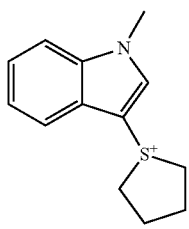

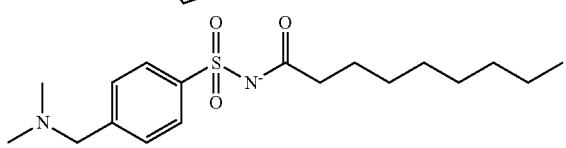

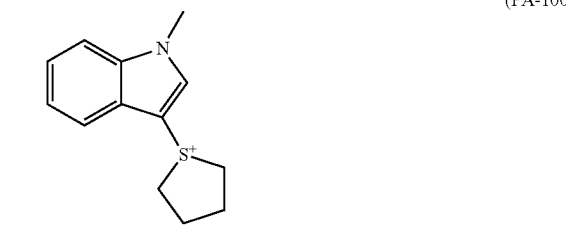

(PA-101)
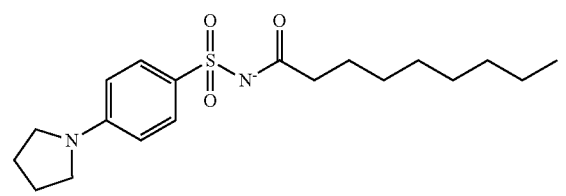

(PA-102)
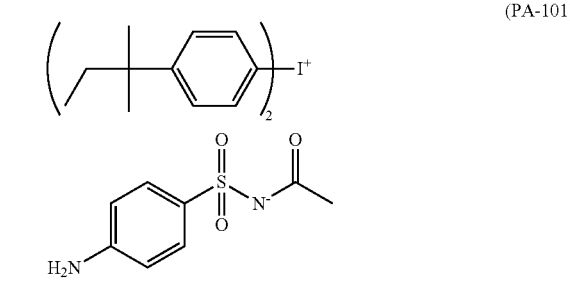

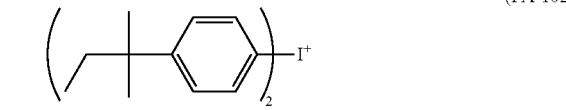

-continued (PA-98)
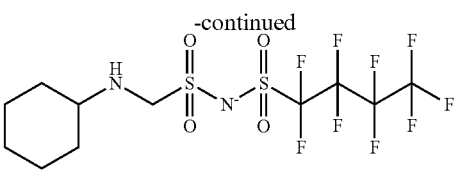

These compounds can be easily synthesized by using a general sulfonic acid esterification reaction or sulfonamidation reaction. For example, the compound may be obtained by a method of selectively reacting one sulfonyl halide moiety of a bis-sulfonyl halide compound with an amine, alcohol or the like containing a partial structure represented by formula (PA-II) to form a sulfonamide bond or a sulfonic acid ester bond and then hydrolyzing the other sulfonyl halide moiety, or a method of ring-opening a cyclic sulfonic anhydride by an amine or alcohol containing a partial structure represented by formula (PA-II). The amine or alcohol containing a partial structure represented by formula (PA-II) can be synthesized by reacting an amine or alcohol with an anhydride (e.g., $(R'O_2C)_2O$, $R'O_2CCl$) or an acid chloride compound under basic conditions.

The content of the compound (PA) in the positive resist composition of the present invention is preferably from 0.1 to 20 mass %, more preferably from 0.1 to 10 mass %, based on the solid content of the composition.

Antioxidant:

The resist composition of the present invention preferably contains an antioxidant.

The antioxidant is added for preventing the organic material from being oxidized in the presence of oxygen.

The antioxidant is not particularly limited as long as it is an antioxidant used in general and has an effect of preventing oxidation of a plastic and the like, and examples thereof include a phenol-based antioxidant, an antioxidant composed of an organic acid derivative, a sulfur-containing antioxidant, a phosphorus-based antioxidant, an amine-based antioxidant, an antioxidant composed of an amine-aldehyde condensate, and an antioxidant composed of an amine-ketone condensate. Out of these antioxidants, in order to bring out the effects of the present invention without reducing the functions of the resist, the antioxidant is preferably a phenol-based antioxidant or an antioxidant composed of an organic acid derivative.

Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butyl•hydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethylamino-p-cresol, 6-(4-hydroxy-3,5-di-tert-butyl•anilino)2,4-bis•octyl-thio-1,3,5-triazine, n-octadecyl-3-(4'-hydroxy-3',5'-di-tert-butyl•phenyl)propionate, octylated phenol, aralkyl-substituted phenols, alkylated p-cresol and hindered phenol; bis-, tris- and poly-phenols such as 4,4'-dihydroxy•diphenyl, methylene•bis(dimethyl-4,6-phenol), 2,2'-methylene-bis-(4-methyl-6-tert-butylphenol), 2,2'-methylene-bis-(4-methyl-6-cyclohexyl•phenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyl•diphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5- tert-butylphenyl)butane, and tetrakis-[methylene-3-(3',5'-di-tert-butyl-4'-hydroxyphenyl)propionate]methane.

Furthermore, a commercially available antioxidant may be used as it is. Examples of the commercially available antioxidant include Irganox (produced by Ciba Specialty Chemicals Corp.).

Specific preferred examples of the antioxidant for use in the present invention include 2,6-di-tert-butyl-4-methylphenol, 4-hydroxymethyl-2,6-di-tert-butylphenol, 2,2'-methylenebis(4-methyl-6-tert-butylphenol), butylhydroxyanisole, tert-butyl hydroquinone, 2,4,5-trihydroxybutyrophenone, nordihydroguajaretic acid, propyl gallate, octyl gallate, lauryl gallate and isopropyl citrate. Among these, 2,6-di-tert-butyl-4-methylphenol, 4-hydroxymethyl-2,6-di-tert-butylphenol, butylhydroxyanisole and tert-butyl hydroquinone are preferred, and 2,6-di-tert-butyl-4-methylphenol and 4-hydroxymethyl-2,6-di-tert-butylphenol are more preferred.

The content of the antioxidant in the resist composition is preferably 1 ppm or more, more preferably 5 ppm or more, still more preferably 10 ppm or more, yet still more preferably 50 ppm or more, even yet still more preferably 100 ppm or more, and still more preferably from 100 to 10,000 ppm. A plurality of antioxidants may be mixed and used.

(D) Solvent

The resist composition of the present invention is dissolved in a solvent capable of dissolving respective components described above and then coated on a support. Usually, the solid content concentration of all resist components is preferably from 2 to 30 mass %, more preferably from 3 to 25 mass %.

The solvent used here is preferably a solvent containing at least one member of a propylene glycol monoalkyl ether carboxylate, a propylene glycol monoalkyl ether, an alkyl lactate, an acetic acid ester, an alkyl alkoxypropionate, a chain ketone and a cyclic ketone.

The propylene glycol monoalkyl ether carboxylate is preferably propylene glycol monomethyl ether acetate, propylene glycol monomethyl ether propionate or propylene glycol monoethyl ether acetate.

The propylene glycol monoalkyl ether is preferably propylene glycol monomethyl ether or propylene glycol monoethyl ether.

The alkyl lactate is preferably ethyl lactate or butyl lactate.

The acetic acid ester is preferably butyl acetate.

The alkyl alkoxypropionate is preferably methoxymethyl propionate or ethoxyethyl propionate.

The chain ketone is preferably methyl amyl ketone.

The cyclic ketone is preferably cyclohexanone, γ-butyrolactone or propylene carbonate.

At least one kind of a solvent selected from propylene glycol monomethyl ether acetate, propylene glycol monomethyl ether propionate, propylene glycol monoethyl ether acetate, propylene glycol monomethyl ether, ethyl lactate, methoxymethyl propionate, ethoxyethyl propionate, γ-butyrolactone and propylene carbonate is preferably used as the solvent.

The solvent may be one solvent alone or a combination of solvents.

The combination of solvents is preferably a combination of propylene glycol monomethyl ether acetate with propylene glycol monomethyl ether, ethyl lactate, butyl acetate, ethoxyethyl propionate or methyl amyl ketone.

Other Components:

The resist composition of the present invention may further contain, if desired, a dye, a photobase generator and the like.

1. Dye

In the present invention, a dye may be used.

The suitable dye includes an oily dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industries Co., Ltd.), Crystal Violet (CI42555), Methyl Violet (CI42535), Rhodamine B (CI45170B), Malachite Green (CI42000) and Methylene Blue (CI52015).

2. Photobase Generator

Examples of the photobase generator which can be added to the resist composition of the present invention include compounds described in JP-A-4-151156, JP-A-4-162040, JP-A-5-197148, JP-A-5-5995, JP-A-6-194834, JP-A-8-146608, JP-A-10-83079 and European Patent 622,682. Specific examples of the photobase generator which can be suitably used include 2-nitrobenzyl carbamate, 2,5-dinitrobenzylcyclohexyl carbamate, N-cyclohexyl-4-methylphenylsulfonamide and 1,1-dimethyl-2-phenylethyl-N-isopropyl carbamate. Such a photobase generator is added for the purpose of improving the resist profile or the like.

The exposure may be performed by filling a liquid (immersion medium) having a refractive index higher than that of air between the resist film and a lens at the irradiation with actinic rays or radiation (immersion exposure). By this exposure, the resolution can be enhanced. The immersion medium used may be any liquid as long as it has a refractive index higher than that of air, but pure water is preferred.

The immersion liquid used in the immersion exposure is described below.

The immersion liquid is preferably a liquid transparent to light at the exposure wavelength and having as small a temperature coefficient of refractive index as possible so as to minimize the distortion of an optical image projected on the resist film. Particularly, when the exposure light source is an ArF excimer laser (wavelength: 193 nm), water is preferably used in view of easy availability and easy handleability in addition to the above-described aspects.

Furthermore, a medium having a refractive index of 1.5 or more can also be used from the standpoint that the refractive index can be more enhanced. This medium may be either an aqueous solution or an organic solvent.

In the case of using water as the immersion liquid, for the purpose of decreasing the surface tension of water and increasing the surface activity, an additive (liquid) which does not dissolve the resist film on a wafer and at the same time, gives only a negligible effect on the optical coat at the undersurface of the lens element, may be added in a small ratio. The additive is preferably an aliphatic alcohol having a refractive index nearly equal to that of water, and specific examples thereof include methyl alcohol, ethyl alcohol and isopropyl alcohol. By virtue of adding an alcohol having a refractive index nearly equal to that of water, even when the alcohol component in water is evaporated and its content concentration is changed, the change in the refractive index of the entire liquid can be advantageously made very small. On the other hand, if a substance opaque to light at 193 nm or an impurity greatly differing in the refractive index from water is mingled, this incurs distortion of the optical image projected on the resist film. Therefore, the water used is preferably distilled water. Pure water further filtered through an ion exchange filter or the like may also be used.

The electrical resistance of water is preferably 18.3 MΩcm or more, and TOC (total organic carbon) is preferably 20 ppb or less. Also, the water is preferably subjected to a deaeration treatment.

The lithography performance can be enhanced by increasing the refractive index of the immersion liquid. From such a standpoint, an additive for increasing the refractive index may be added to water, or heavy water ($D_2O$) may be used in place of water.

In the case where the resist film formed from the resist composition of the present invention is exposed through an immersion medium, a hydrophobic resin (HR) may be further added, if desired. The hydrophobic resin (HR) when added is unevenly distributed to the surface layer of the resist film and in the case of using water as the immersion medium, the resist film formed can be enhanced in the receding contact angle on the resist film surface for water as well as in the followability of the immersion liquid. The hydrophobic resin (HR) may be any resin as long as the receding contact angle on the surface is enhanced by its addition, but a resin having at least either one of a fluorine atom and a silicon atom is preferred. The receding contact angle of the resist film is preferably from 60 to 90°, more preferably 70° or more. The amount of the hydrophobic resin added may be appropriately adjusted to give a resist film having a receding contact angle in the range above but is preferably from 0.1 to 10 mass %, more preferably from 0.1 to 5 mass %, based on the entire solid content of the positive resist composition. The hydrophobic resin (HR) is, as described above, unevenly distributed to the interface but unlike a surfactant, need not have necessarily a hydrophilic group in the molecule and may not contribute to uniform mixing of polar/nonpolar substances.

The receding contact angle is a contact angle measured when a contact line recedes on the liquid droplet-substrate interface, and is generally known to be useful in simulating the mobility of a liquid droplet in the dynamic state. In a simple manner, the receding contact angle can be defined as a contact angle created by the liquid droplet interface on receding when a liquid droplet ejected from a needle tip is landed on a substrate and then the liquid droplet is again sucked into the needle. The receding contact angle can be generally measured by a contact angle measuring method called an expansion/contraction method.

In the immersion exposure step, the immersion liquid needs to move on a wafer following the movement of an exposure head which is scanning the wafer at a high speed and forming an exposure pattern. Therefore, the contact angle of the immersion liquid in a dynamic state for the resist film is important, and a performance of allowing a liquid droplet to follow the high-speed scanning of an exposure head without remaining is required of the resist.

The fluorine atom or silicon atom in the hydrophobic resin (HR) may be present in the main chain of the resin or may be substituted to the side chain.

The hydrophobic resin (HR) is preferably a resin where a fluorine atom-containing alkyl group, a fluorine atom-containing cycloalkyl group or a fluorine atom-containing aryl group is contained as a fluorine atom-containing partial structure.

The fluorine atom-containing alkyl group (preferably having a carbon number of 1 to 10, more preferably from 1 to 4) is a linear or branched alkyl group with at least one hydrogen atom being substituted by a fluorine atom and may further have another substituent.

The fluorine atom-containing cycloalkyl group is a monocyclic or polycyclic cycloalkyl group with at least one hydrogen atom being substituted by a fluorine atom and may further have another substituent.

The fluorine atom-containing aryl group is an aryl group (e.g., phenyl, naphthyl) with at least one hydrogen atom being substituted by a fluorine atom and may further have another substituent.

Preferred examples of the fluorine atom-containing alkyl group, fluorine atom-containing cycloalkyl group and fluorine atom-containing aryl group include the groups represented by the following formulae (F2) to (F4), but the present invention is not limited thereto.

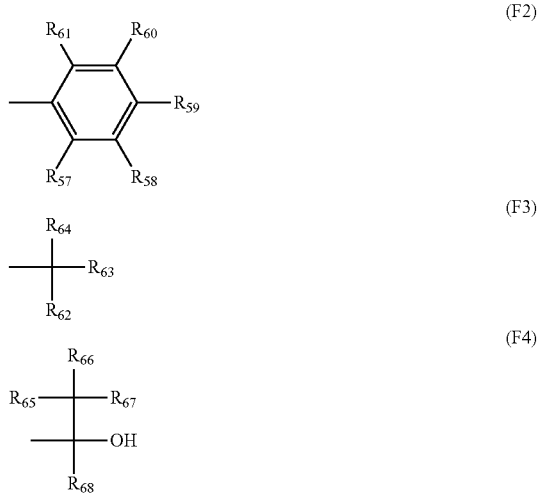

In formulae (F2) to (F4), $R_{57}$ to $R_{68}$ each independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being substituted by a fluorine atom. It is preferred that $R_{57}$ to $R_{61}$ and $R_{65}$ to $R_{67}$ all are a fluorine atom. $R_{62}$, $R_{63}$ and $R_{68}$ each is preferably an alkyl group (preferably having a carbon number of 1 to 4) with at least one hydrogen atom being substituted by a fluorine atom, more preferably a perfluoroalkyl group having a carbon number of 1 to 4. $R_{62}$ and $R_{63}$ may combine together to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoromethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —$C(CF_3)_2OH$, —$C(C_2F_5)_2OH$, —$C(CF_3)(CH_3)OH$ and —$CH(CF_3)OH$, with —$C(CF_3)_2OH$ being preferred.

Specific examples of the repeating unit having a fluorine atom are set forth below, but the present invention is not limited thereto.

In specific examples, $X_1$ represents a hydrogen atom, —$CH_3$, —F or —$CF_3$.

$X_2$ represents —F or —$CF_3$.

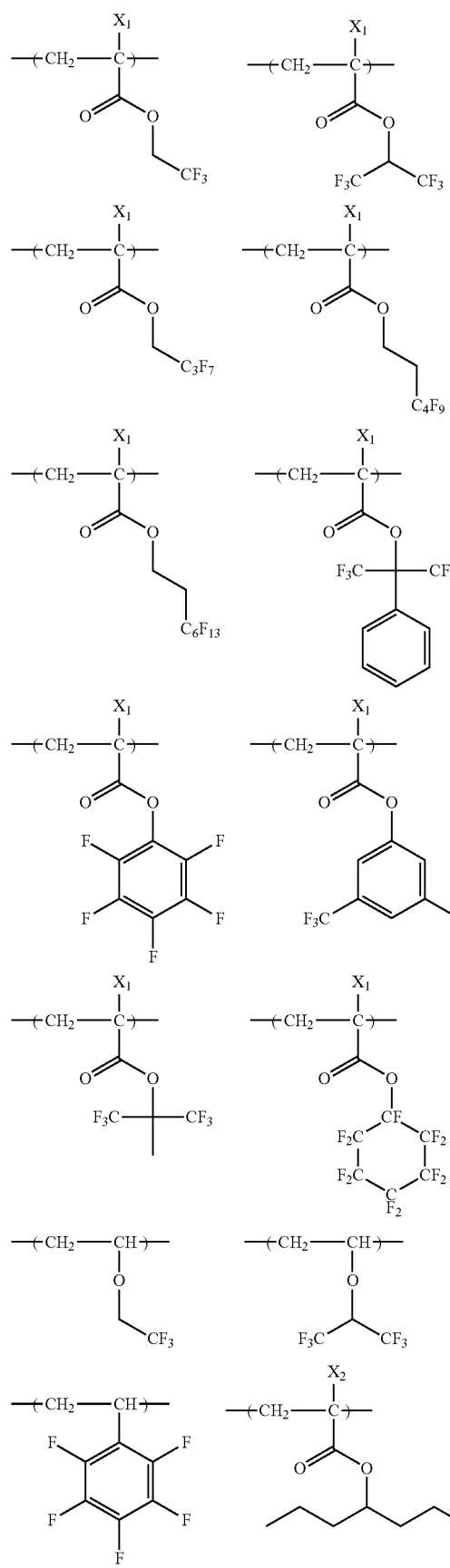
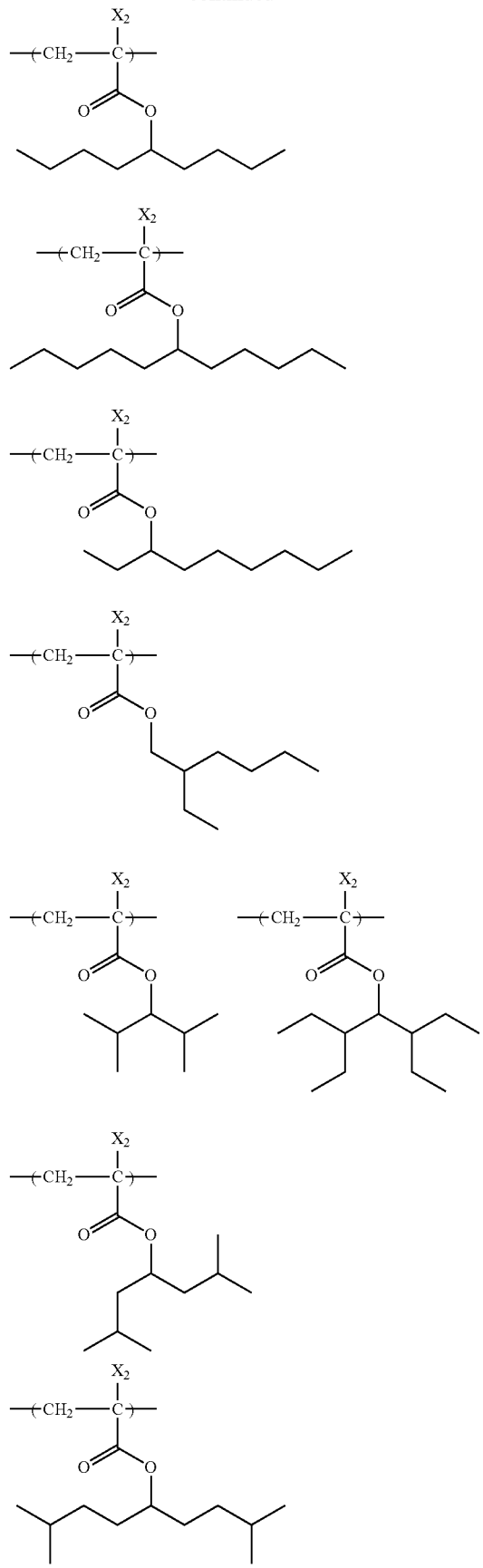

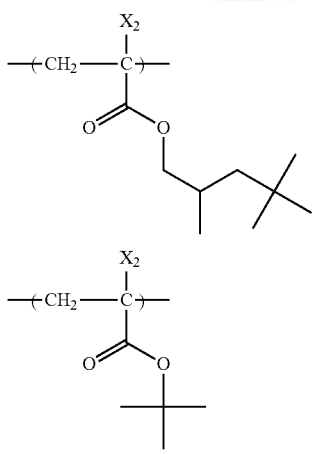

The hydrophobic resin (HR) is preferably a resin where an alkylsilyl structure (preferably a trialkylsilyl group) or a cyclic siloxane structure is contained as a silicon atom-containing partial structure.

Specific examples of the alkylsilyl structure and cyclic siloxane structure include the groups represented by the following formulae (CS-1) to (CS-3):

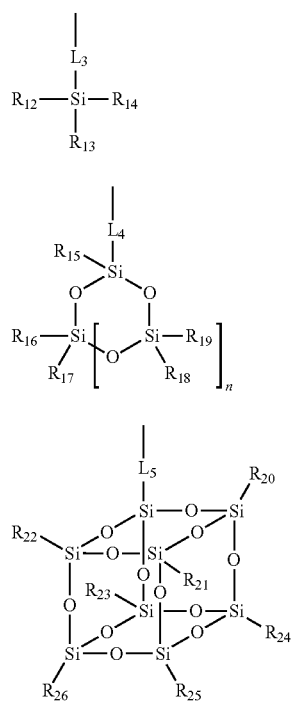

In formulae (CS-1) to (CS-3), $R_{12}$ to $R_{26}$ each independently represents a linear or branched alkyl group (preferably having a carbon number of 1 to 20) or a cycloalkyl group (preferably having a carbon number of 3 to 20).

$L_3$ to $L_5$ each represents a single bond or a divalent linking group. The divalent linking group is a sole group or a combination of two or more groups selected from the group consisting of an alkylene group, a phenylene group, an ether group, a thioether group, a carbonyl group, an ester group, an amide group, a urethane group and a ureylene group.

n represents an integer of 1 to 5.

Specific examples of the repeating unit having a silicon atom are set forth below, but the present invention is not limited thereto.

In specific examples, $X_1$ represents a hydrogen atom, $-CH_3$, $-F$ or $-CF_3$.

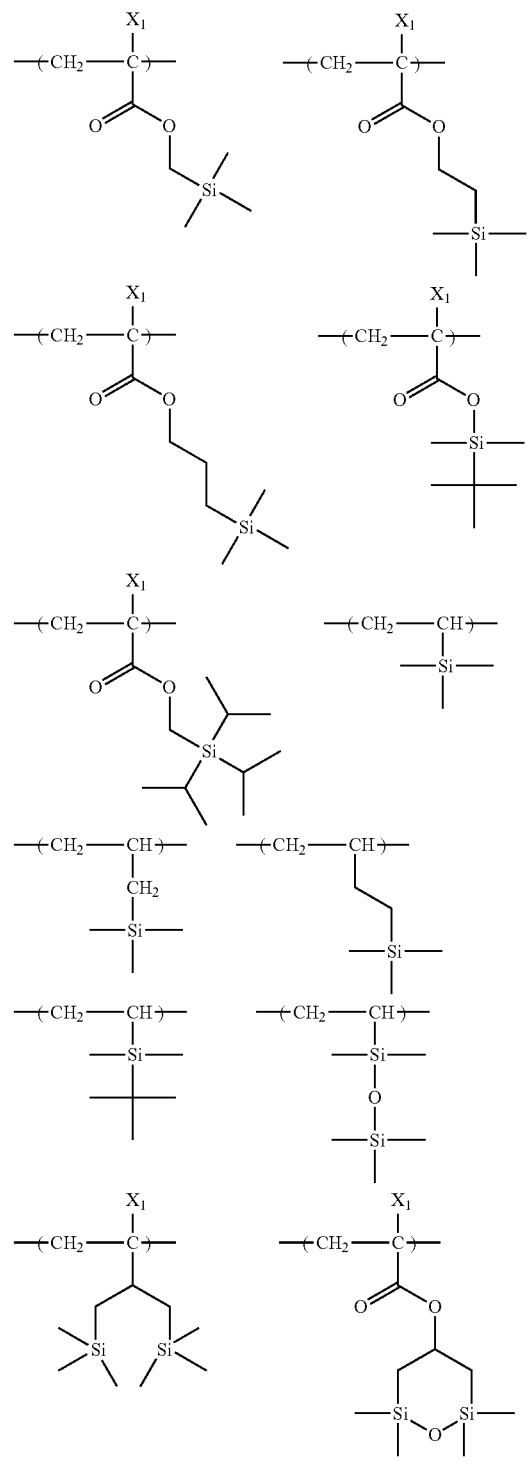

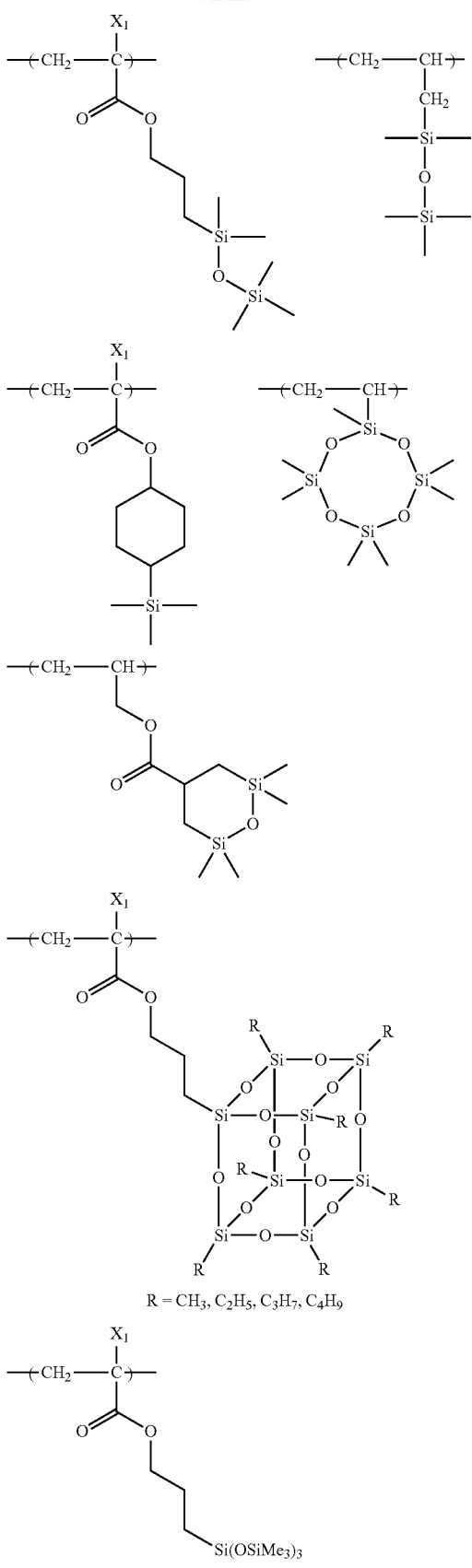

Furthermore, the hydrophobic resin (HR) may contain at least one group selected from the group consisting of the following (x) to (z):

(x) an alkali-soluble group, (y) a group that decomposes by the action of an alkali developer to increase the solubility in an alkali developer, and (z) a group that decomposes by the action of an acid.

Examples of the (x) alkali-soluble group include groups having a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)-imide group, a tris(alkylcarbonyl)methylene group or a tris(alkylsulfonyl)methylene group.

Preferred alkali-soluble groups are a fluorinated alcohol group (preferably hexafluoroisopropanol), a sulfonimide group and a bis(carbonyl)methylene group.

As for the repeating unit having (x) an alkali-soluble group, all of a repeating unit where an alkali-soluble group is directly bonded to the resin main chain, such as repeating unit by an acrylic acid or a methacrylic acid, a repeating unit where an alkali-soluble group is bonded to the resin main chain through a linking group, and a repeating unit where an alkali-soluble group is introduced into the polymer chain terminal by using an alkali-soluble group-containing polymerization initiator or chain transfer agent at the polymerization, are preferred.

The content of the repeating unit having (x) an alkali-soluble group is preferably from 1 to 50 mol %, more preferably from 3 to 35 mol %, still more preferably from 5 to 20 mol %, based on all repeating units in the polymer.

Specific examples of the repeating unit having (x) an alkali-soluble group are set forth below, but the present invention is not limited thereto.

In the formulae, Rx represents H, CH$_3$, CF$_3$ or CH$_2$OH.

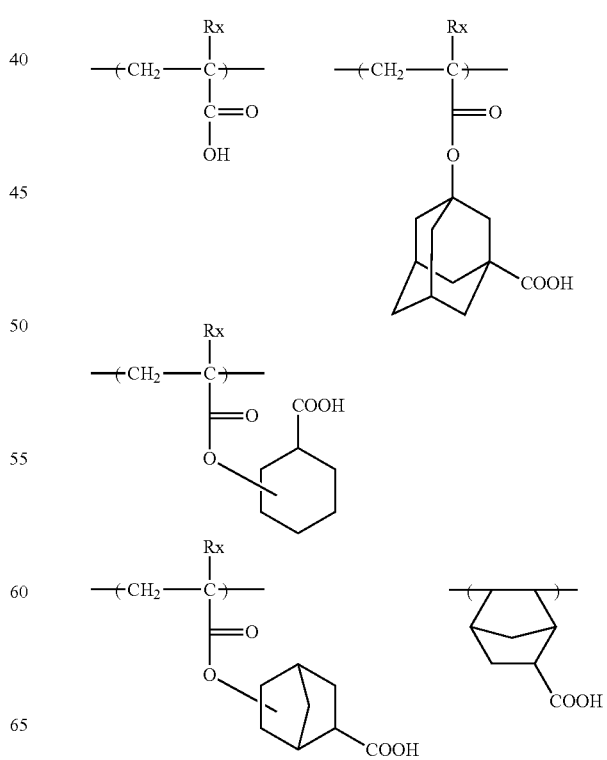

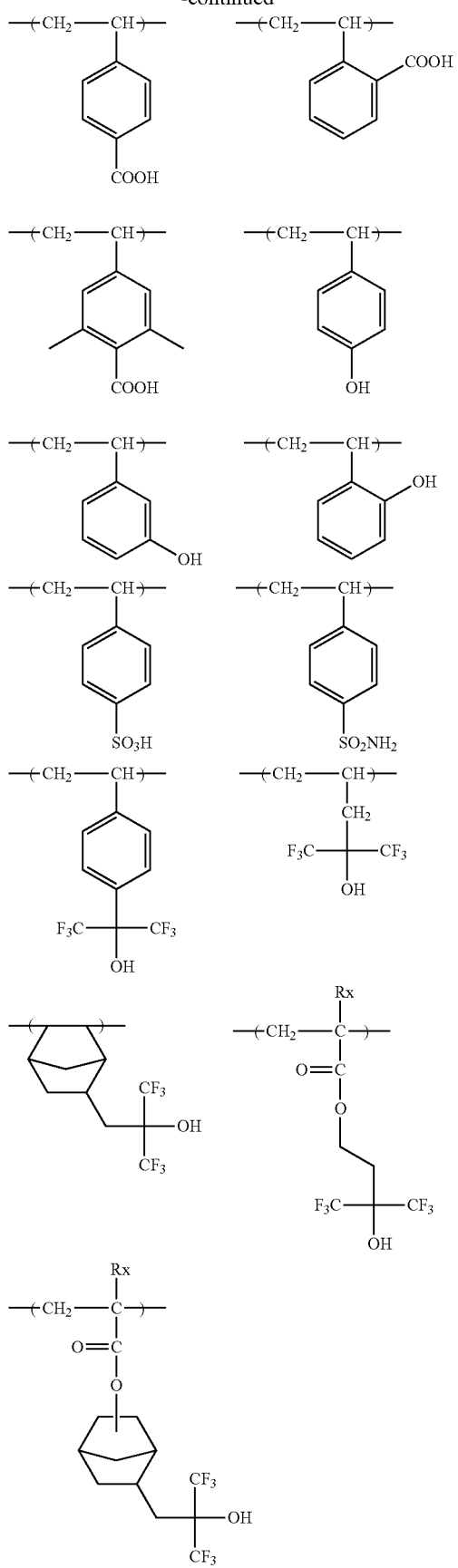
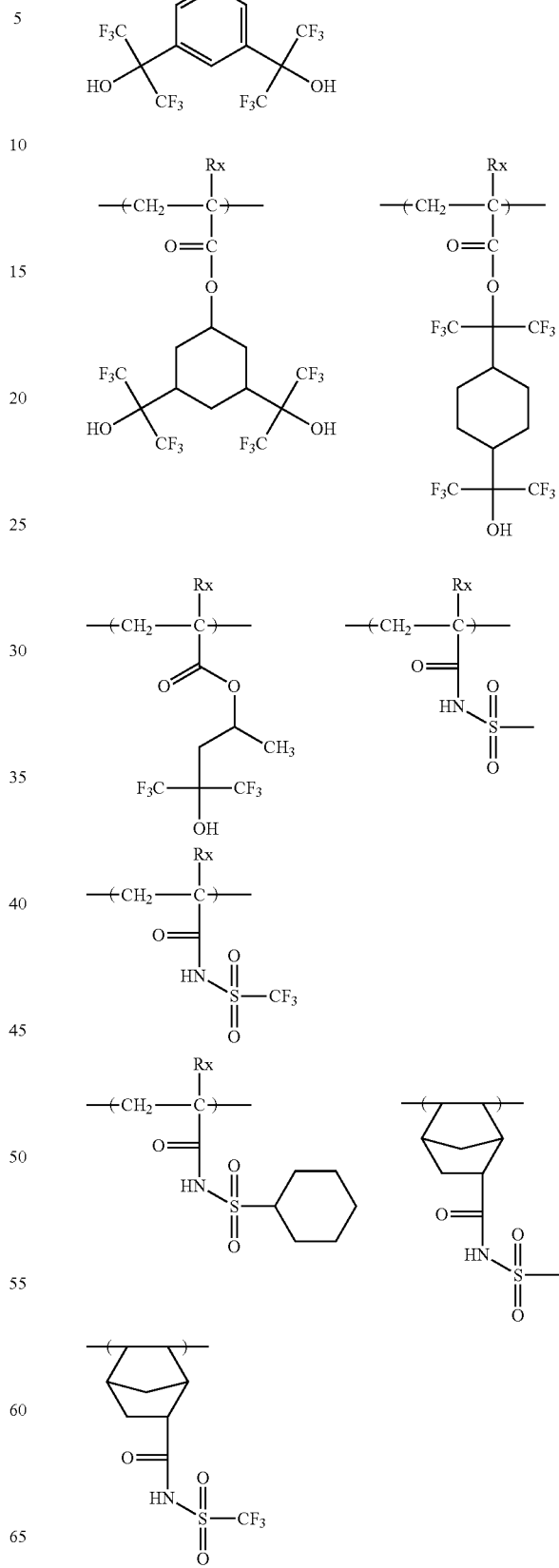

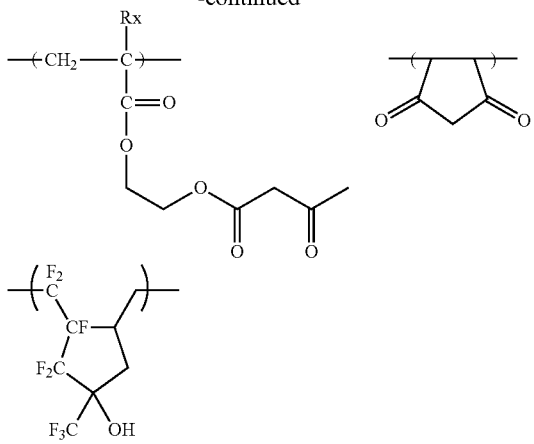

Examples of the (y) group that decomposes by the action of an alkali developer to increase the solubility in an alkali developer include a lactone structure-containing group, an acid anhydride and an acid imide group, with a lactone structure-containing group being preferred.

As for the repeating unit having (y) a group that decomposes by the action of an alkali developer to increase the solubility in an alkali developer, both a repeating unit where (y) a group that decomposes by the action of an alkali developer to increase the solubility in an alkali developer is bonded to the resin main chain, such as repeating unit by an acrylic acid ester or a methacrylic acid ester, and a repeating unit where (y) a group of which solubility in an alkali developer increases is introduced into the polymer chain terminal by using a polymerization initiator or chain transfer agent containing this group at the polymerization are preferred.

The content of the repeating unit having (y) a group of which solubility in an alkali developer increases is preferably from 1 to 40 mol %, more preferably from 3 to 30 mol %, still more preferably from 5 to 15 mol %, based on all repeating units in the polymer.

Specific examples of the repeating unit having (y) a group of which solubility in an alkali developer increases are the same as those of the repeating unit having a lactone structure described for the resin as the component (B).

Examples of the repeating unit having (z) a group that decomposes by the action of an acid, contained in the hydrophobic resin (HR), are the same as those of the repeating unit having an acid-decomposable group described for the resin (A). In the hydrophobic resin (HR), the content of the repeating unit having (z) a group that decomposes by the action of an acid is preferably from 1 to 80 mol %, more preferably from 10 to 80 mol %, still more preferably from 20 to 60 mol %, based on all repeating units in the polymer.

The hydrophobic resin (HR) may further contain a repeating unit represented by the following formula (III):

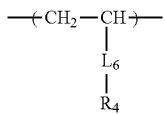

(III)

In formula (III), $R_4$ represents a group having an alkyl group, a cycloalkyl group, an alkenyl group or a cycloalkenyl group.

$L_6$ represents a single bond or a divalent linking group.

In formula (III), the alkyl group of $R_4$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The divalent linking group of $L_6$ is preferably an alkylene group (preferably having a carbon number of 1 to 5) or an oxy group.

In the case where the hydrophobic resin (HR) contains a fluorine atom, the fluorine atom content is preferably from 5 to 80 mass %, more preferably from 10 to 80 mass %, based on the molecular weight of the hydrophobic resin (HR). Also, the content of the fluorine atom-containing repeating unit in the hydrophobic resin (HR) is preferably from 10 to 100 mass %, more preferably from 30 to 100 mass %.

In the case where the hydrophobic resin (HR) contains a silicon atom, the silicon atom content is preferably from 2 to 50 mass %, more preferably from 2 to 30 mass %, based on the molecular weight of the hydrophobic resin (HR). Also, the content of the silicon atom-containing repeating unit in the hydrophobic resin (HR) is preferably from 10 to 100 mass %, more preferably from 20 to 100 mass %.

The standard polystyrene-reduced weight average molecular of the hydrophobic resin (HR) is preferably from 1,000 to 100,000, more preferably from 1,000 to 50,000, still more preferably from 2,000 to 15,000.

In the hydrophobic resin (HR), similarly to the resin (A), the amount of impurities such as metal is of course preferably small, and the content of the residual monomer or oligomer component is preferably from 0 to 10 mass %, more preferably from 0 to 5 mass %, still more preferably from 0 to 1 mass %. When these conditions are satisfied, a resist free from foreign matters in liquid or change in the sensitivity and the like with aging can be obtained. Also, in view of the resolution, resist profile and side wall, roughness or the like of the resist pattern, the molecular weight distribution (Mw/Mn, also called dispersity) is preferably from 1 to 5, more preferably from 1 to 3, still more preferably from 1 to 2.

As for the hydrophobic resin (HR), various commercially available products may be used or the resin may be synthesized by an ordinary method (for example, radical polymerization)). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the positive resist composition of the present invention. By the use of the same solvent, production of particles during storage can be suppressed.

The polymerization reaction is preferably performed in an inert gas atmosphere such as nitrogen and argon. As for the polymerization initiator, the polymerization is initiated using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The reaction concentration is from 5 to 50 mass %, preferably from 30 to 50 mass %, and the reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of applying water washing or combining an appropriate solvent to remove residual monomers or oligomer components; a purification method in a solution sate, such as ultrafiltration of extracting and removing only polymers having a molecular weight not more than a specific molecular weight; a reprecipitation method of adding dropwise the resin solution in a poor solvent to solidify the resin in the poor solvent and thereby remove residual monomers and the like; and a purification method in a solid state, such as a method of washing a resin slurry separated by filtration with a poor solvent. For example, the resin is precipitated as a solid matter by contacting the reaction solution with a solvent in which the resin is sparingly soluble or insoluble (poor solvent) and which is in a volume amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent to the polymer, and the solvent used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer. Among these solvents, the precipitation or reprecipitation solvent is preferably a solvent containing at least an alcohol (particularly methanol or the like) or water.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank by a known method such as batch system or continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volume amount of less than 10 times (preferably 5 times or less) the resin solution A, to precipitate a resin solid (step d), and separating the precipitated resin (step e).

Specific examples of the hydrophobic resin (FIR) are set forth below. Also, the molar ratio of repeating units (corresponding to repeating units from the left), weight average molecular weight and dispersity of each resin are shown in Table 1 below.

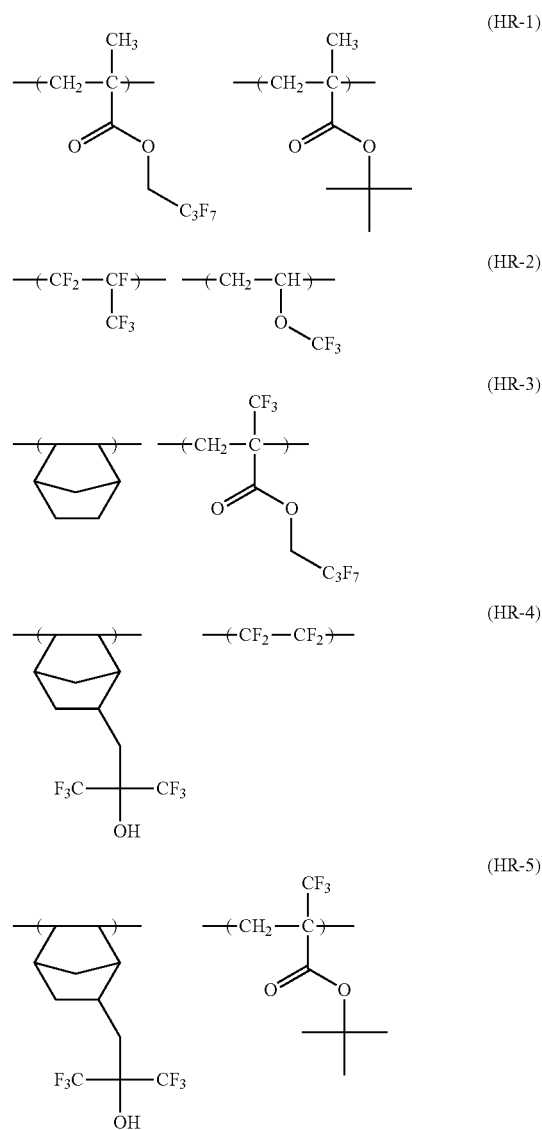

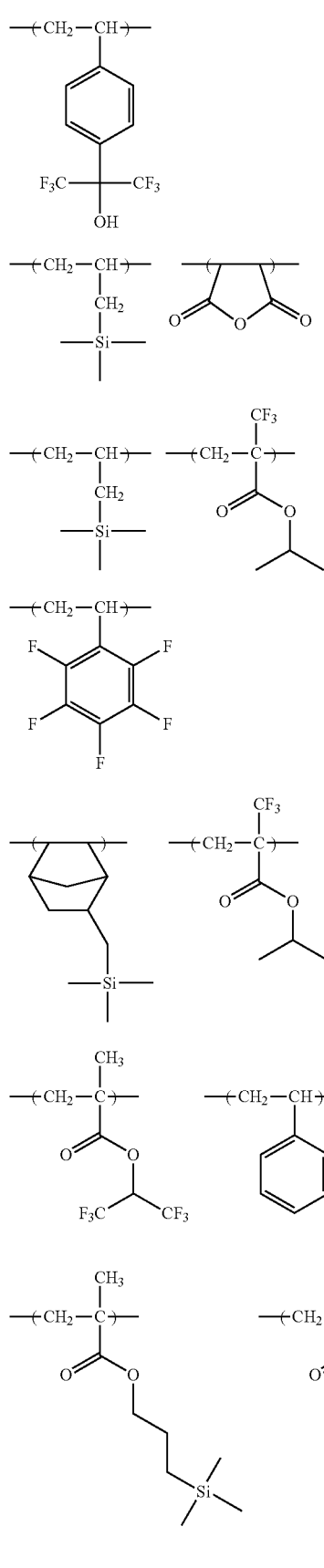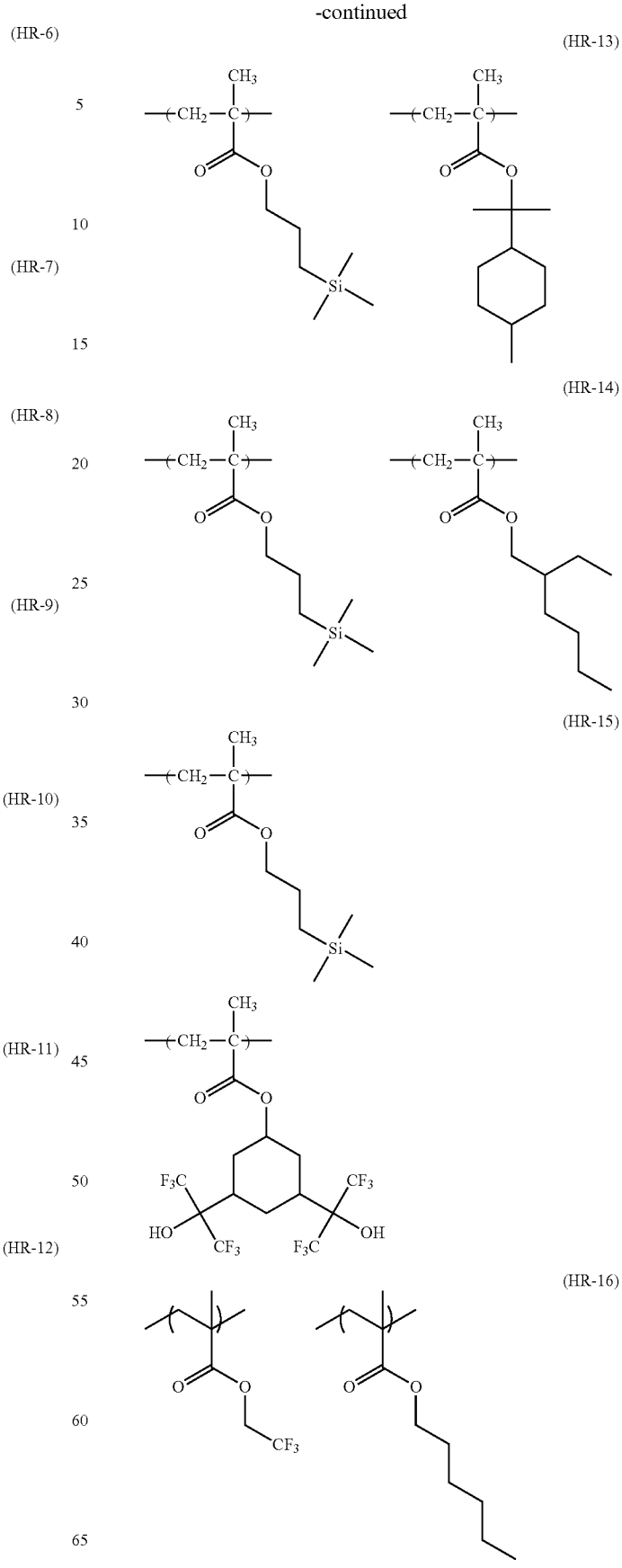

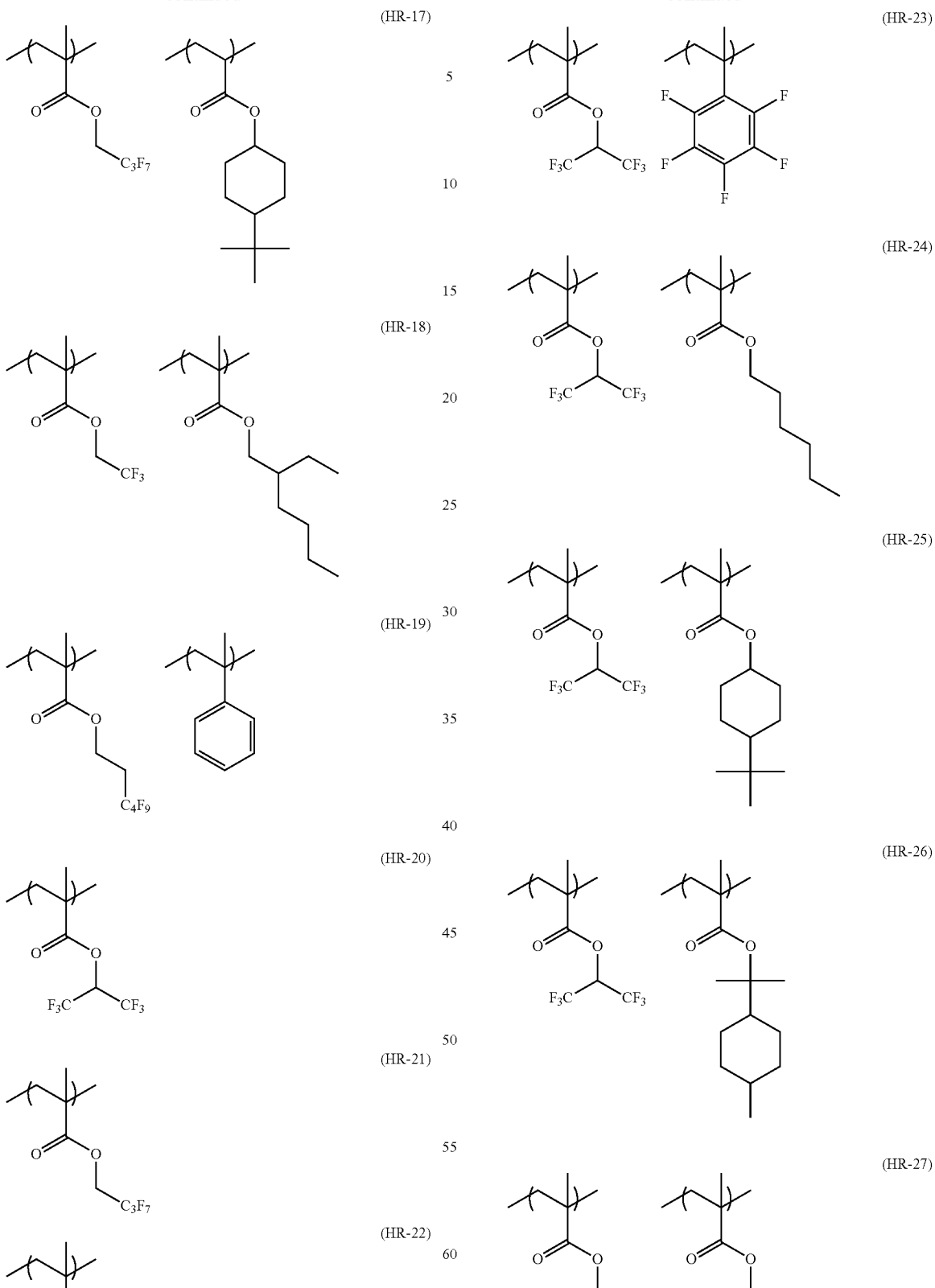

(HR-28)
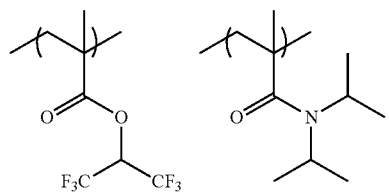
(HR-29)
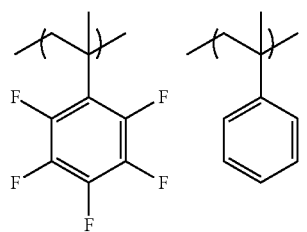
(HR-30)
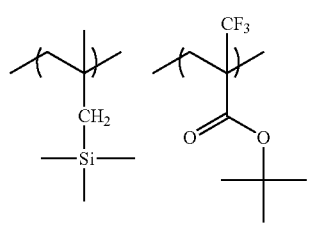
(HR-31)
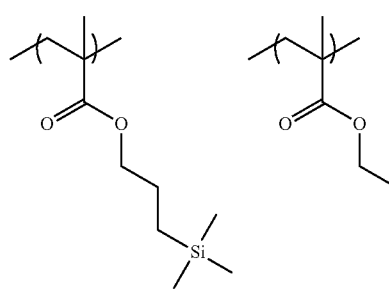
(HR-32)
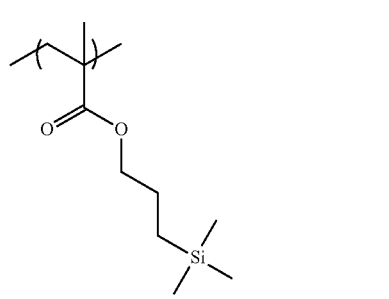
(HR-33)
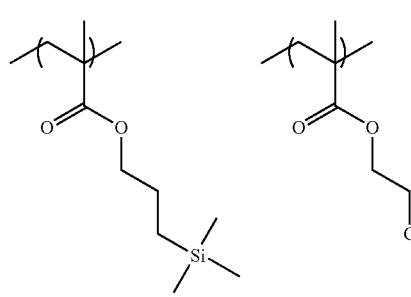
(HR-34)
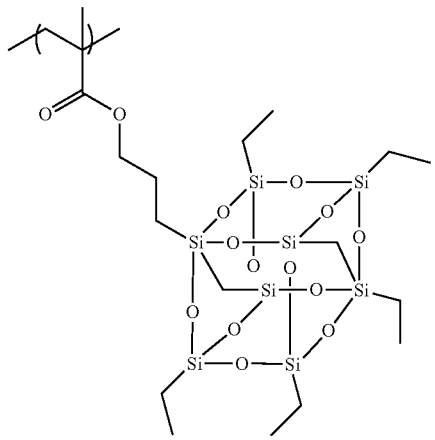
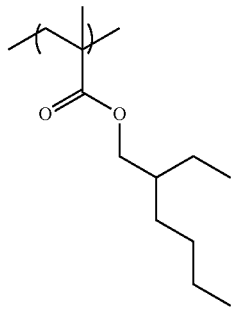
(HR-35)
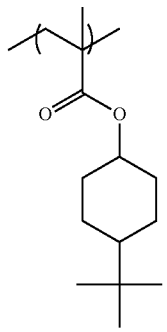

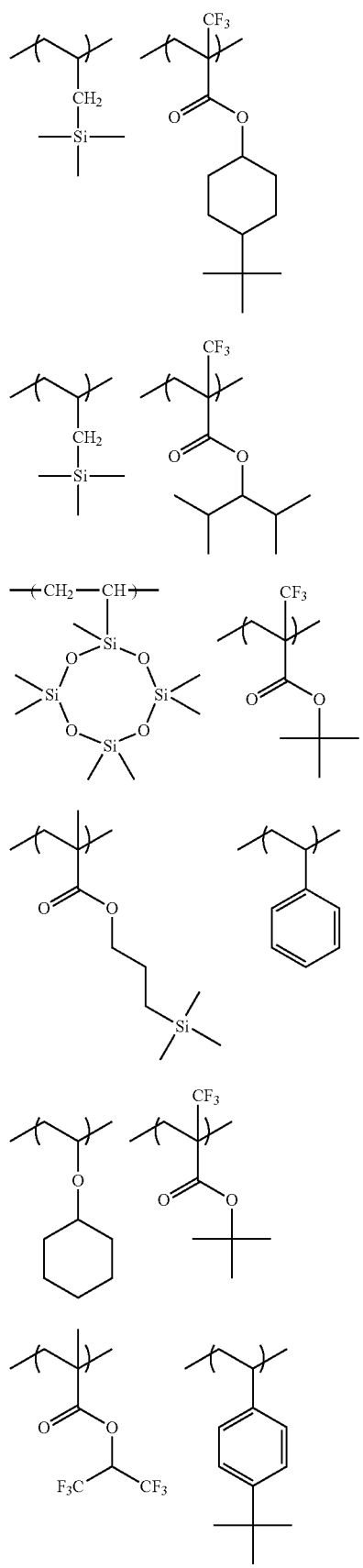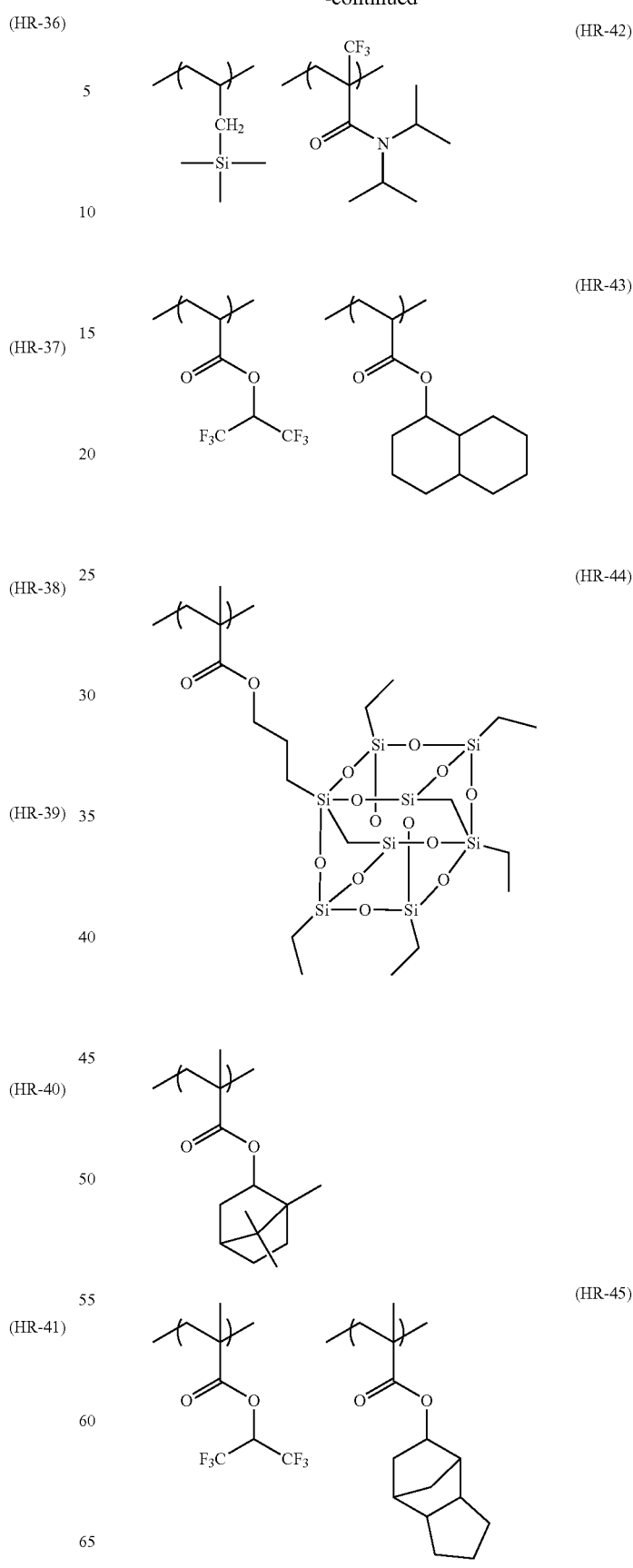

-continued
(HR-46)
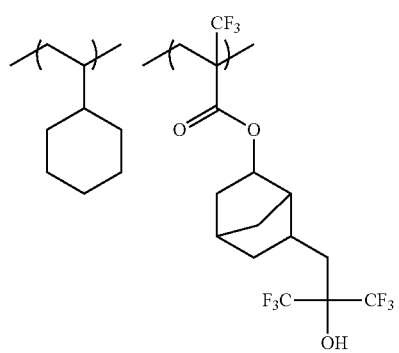
(HR-47)
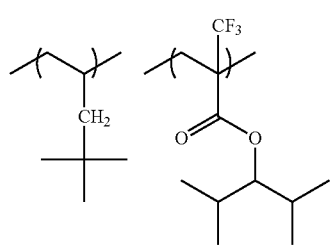
(HR-48)
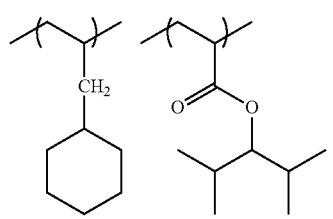
(HR-49)
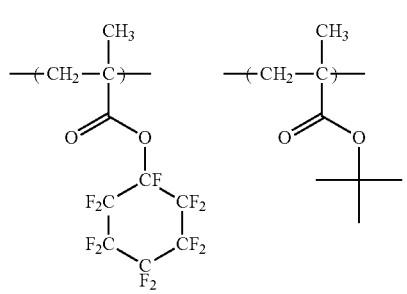
(HR-50)
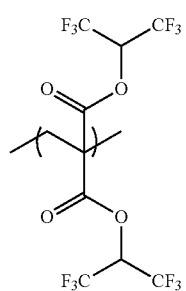
-continued
(HR-51)
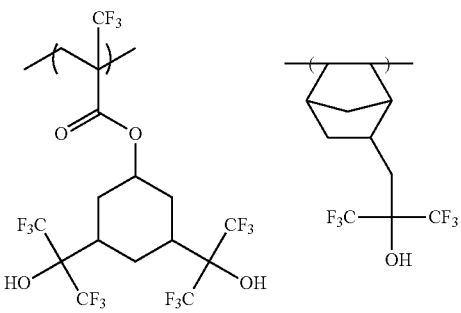
(HR-52)
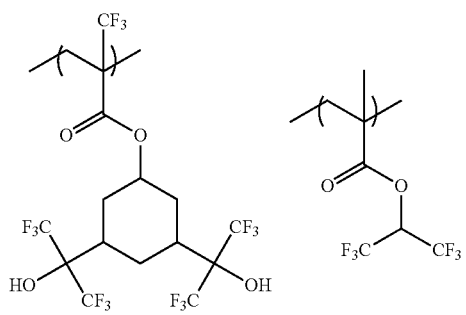
(HR-53)
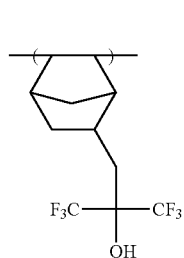
(HR-54)
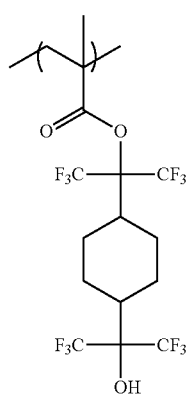
(HR-55)
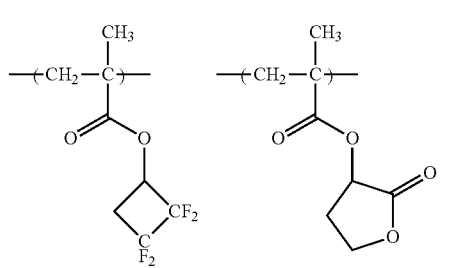

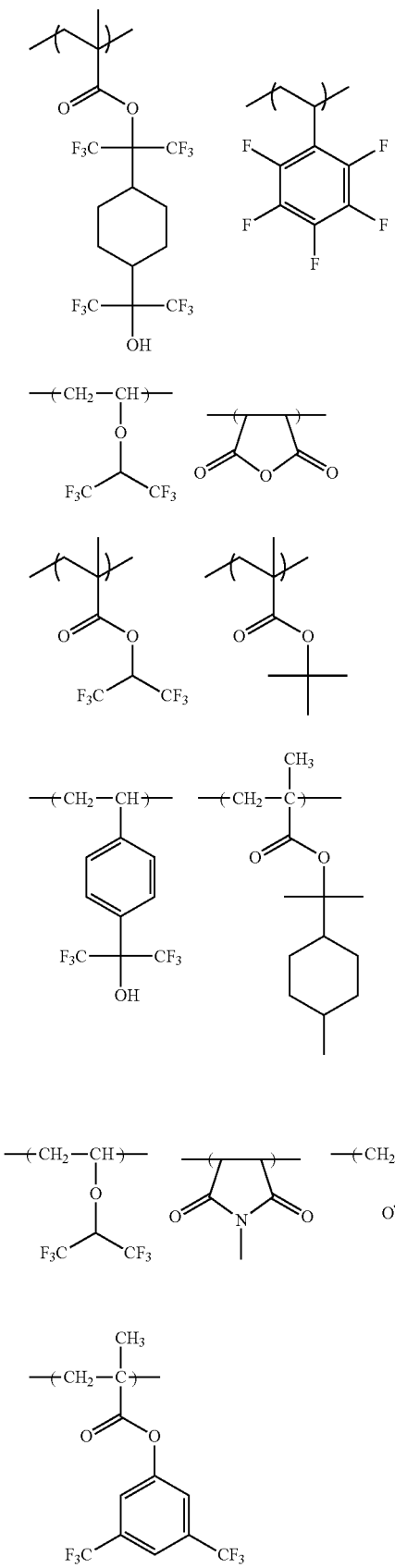
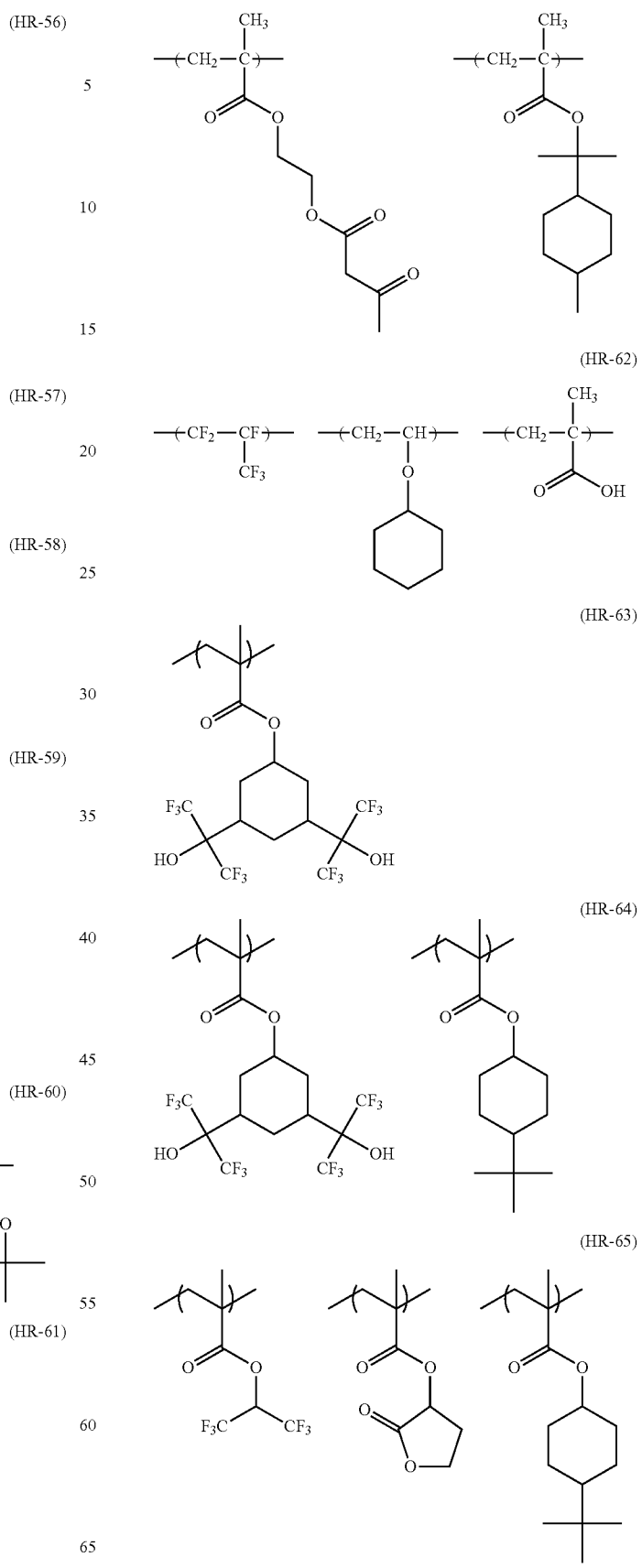

(HR-66)
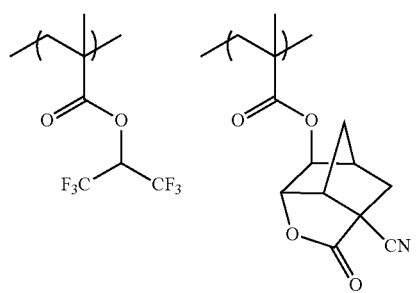
(HR-67)
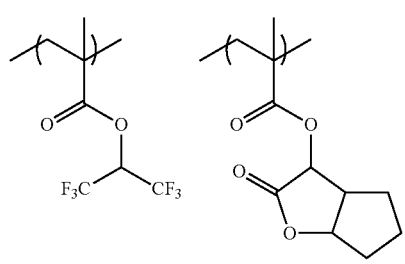
(HR-68)
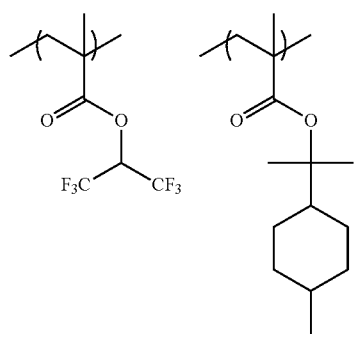
(HR-69)
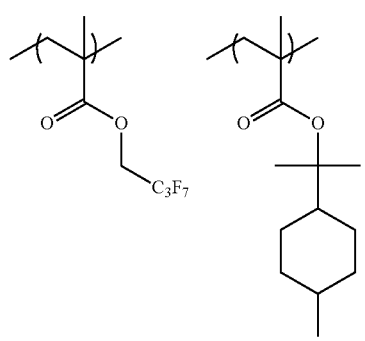
(HR-70)
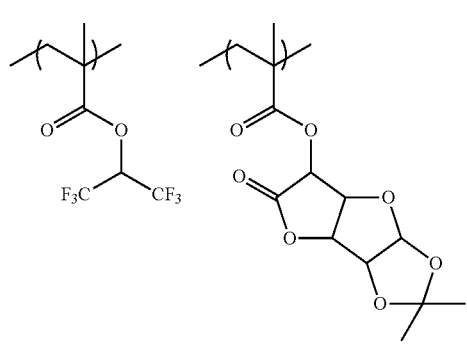
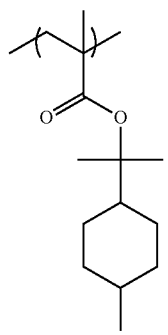
(HR-71)
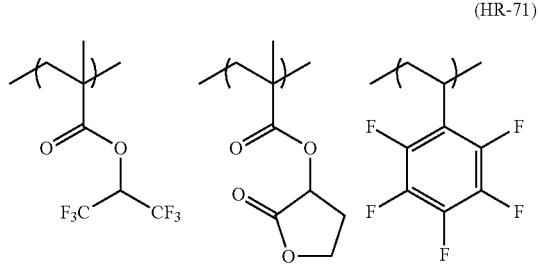
(HR-72)
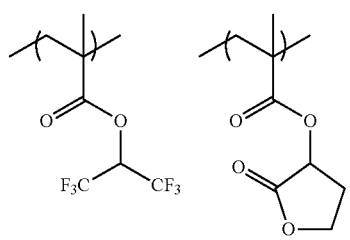
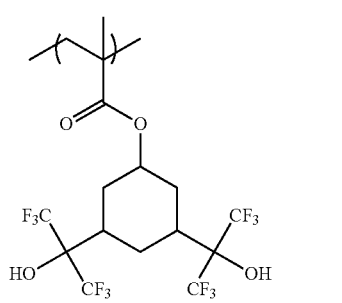
(HR-73)
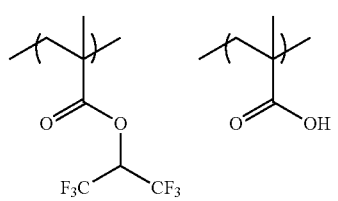
(HR-74)
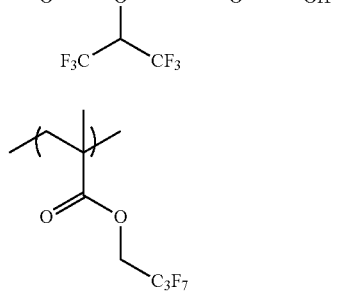

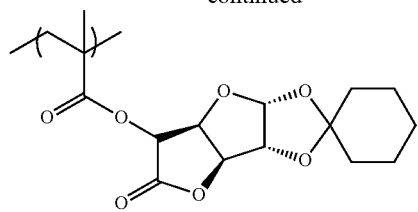
(HR-75)
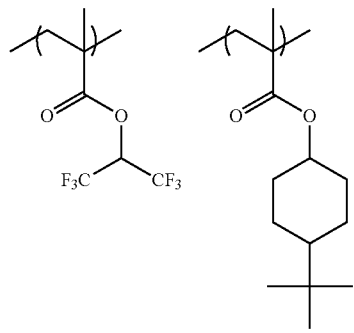
(HR-76)
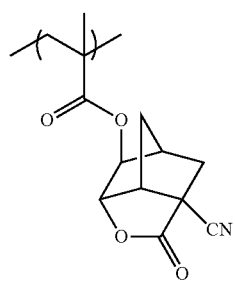
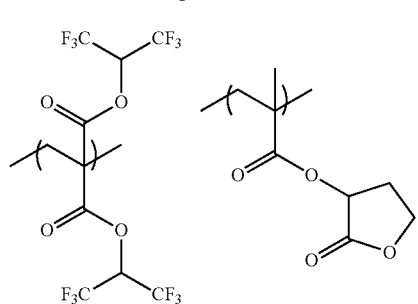
(HR-77)
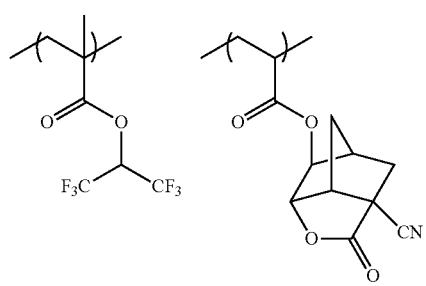
(HR-78)
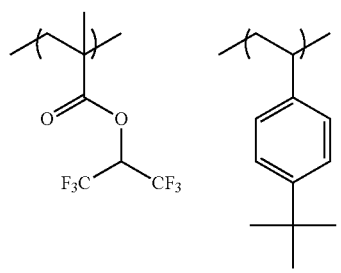
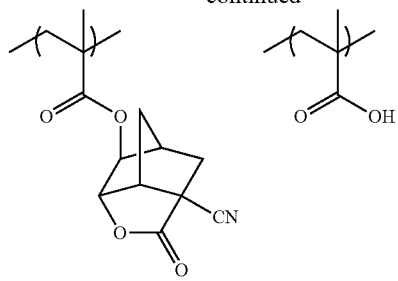
(HR-79)
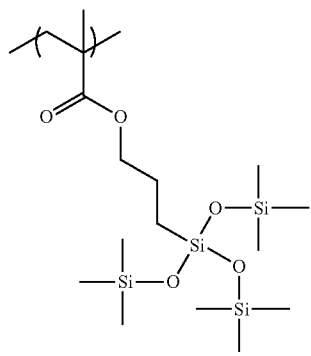
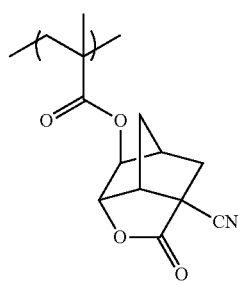
(HR-80)
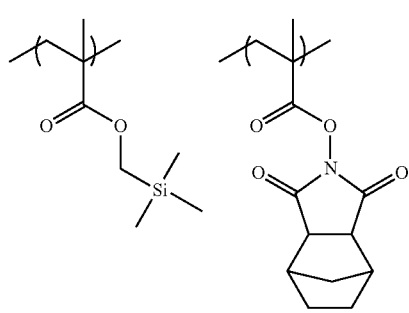
(HR-81)
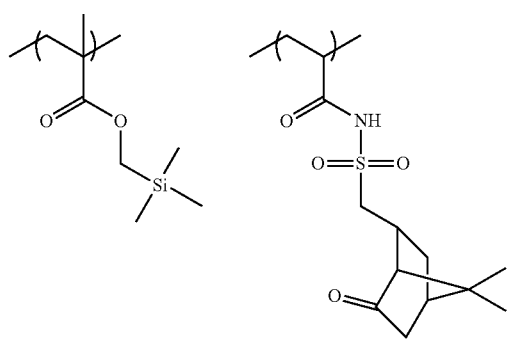

-continued

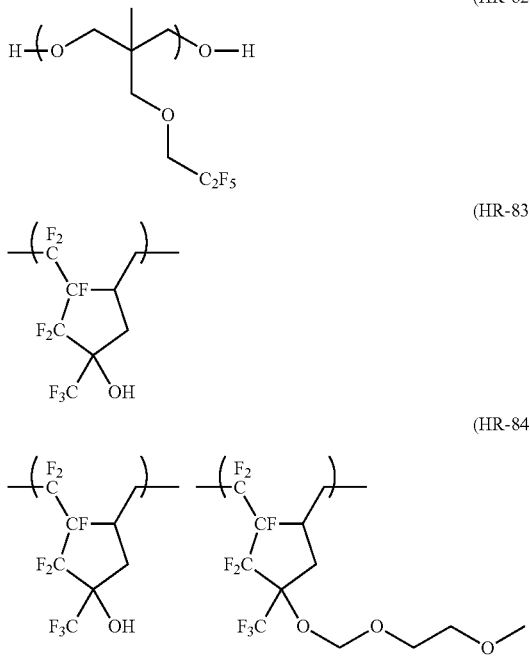

TABLE 1

| Resin | Composition | Mw | Mw/Mn |
|---|---|---|---|
| HR-1 | 50/50 | 8800 | 2.1 |
| HR-2 | 50/50 | 5200 | 1.8 |
| HR-3 | 50/50 | 4800 | 1.9 |
| HR-4 | 50/50 | 5300 | 1.9 |
| HR-5 | 50/50 | 6200 | 1.9 |
| HR-6 | 100 | 12000 | 2.0 |
| HR-7 | 50/50 | 5800 | 1.9 |
| HR-8 | 50/50 | 6300 | 1.9 |
| HR-9 | 100 | 5500 | 2.0 |
| HR-10 | 50/50 | 7500 | 1.9 |
| HR-11 | 70/30 | 10200 | 2.2 |
| HR-12 | 40/60 | 15000 | 2.2 |
| HR-13 | 40/60 | 13000 | 2.2 |
| HR-14 | 80/20 | 11000 | 2.2 |
| HR-15 | 60/40 | 9800 | 2.2 |
| HR-16 | 50/50 | 8000 | 2.2 |
| HR-17 | 50/50 | 7600 | 2.0 |
| HR-18 | 50/50 | 12000 | 2.0 |
| HR-19 | 20/80 | 6500 | 1.8 |
| HR-20 | 100 | 6500 | 1.2 |
| HR-21 | 100 | 6000 | 1.6 |
| HR-22 | 100 | 2000 | 1.6 |
| HR-23 | 50/50 | 6000 | 1.7 |
| HR-24 | 50/50 | 8800 | 1.9 |
| HR-25 | 50/50 | 7800 | 2.0 |
| HR-26 | 50/50 | 8000 | 2.0 |
| HR-27 | 80/20 | 8000 | 1.8 |
| HR-28 | 30/70 | 7000 | 1.7 |
| HR-29 | 50/50 | 6500 | 1.6 |
| HR-30 | 50/50 | 6500 | 1.6 |
| HR-31 | 50/50 | 9000 | 1.8 |
| HR-32 | 100 | 10000 | 1.6 |
| HR-33 | 70/30 | 8000 | 2.0 |
| HR-34 | 10/90 | 8000 | 1.8 |
| HR-35 | 30/30/40 | 9000 | 2.0 |
| HR-36 | 50/50 | 6000 | 1.4 |
| HR-37 | 50/50 | 5500 | 1.5 |
| HR-38 | 50/50 | 4800 | 1.8 |
| HR-39 | 60/40 | 5200 | 1.8 |
| HR-40 | 50/50 | 8000 | 1.5 |
| HR-41 | 20/80 | 7500 | 1.8 |
| HR-42 | 50/50 | 6200 | 1.6 |
| HR-43 | 60/40 | 16000 | 1.8 |
| HR-44 | 80/20 | 10200 | 1.8 |
| HR-45 | 50/50 | 12000 | 2.6 |
| HR-46 | 50/50 | 10900 | 1.9 |
| HR-47 | 50/50 | 6000 | 1.4 |
| HR-48 | 50/50 | 4500 | 1.4 |
| HR-49 | 50/50 | 6900 | 1.9 |
| HR-50 | 100 | 2300 | 2.6 |
| HR-51 | 60/40 | 8800 | 1.5 |
| HR-52 | 68/32 | 11000 | 1.7 |
| HR-53 | 100 | 8000 | 1.4 |
| HR-54 | 100 | 8500 | 1.4 |
| HR-55 | 80/20 | 13000 | 2.1 |
| HR-56 | 70/30 | 18000 | 2.3 |
| HR-57 | 50/50 | 5200 | 1.9 |
| HR-58 | 50/50 | 10200 | 2.2 |
| HR-59 | 60/40 | 7200 | 2.2 |
| HR-60 | 32/32/36 | 5600 | 2.0 |
| HR-61 | 30/30/40 | 9600 | 1.6 |
| HR-62 | 40/40/20 | 12000 | 2.0 |
| HR-63 | 100 | 6800 | 1.6 |
| HR-64 | 50/50 | 7900 | 1.9 |
| HR-65 | 40/30/30 | 5600 | 2.1 |
| HR-66 | 50/50 | 6800 | 1.7 |
| HR-67 | 50/50 | 5900 | 1.6 |
| HR-68 | 49/51 | 6200 | 1.8 |
| HR-69 | 50/50 | 8000 | 1.9 |
| HR-70 | 30/40/30 | 9600 | 2.3 |
| HR-71 | 30/40/30 | 9200 | 2.0 |
| HR-72 | 40/29/31 | 3200 | 2.1 |
| HR-73 | 90/10 | 6500 | 2.2 |
| HR-74 | 50/50 | 7900 | 1.9 |
| HR-75 | 20/30/50 | 10800 | 1.6 |
| HR-76 | 50/50 | 2200 | 1.9 |
| HR-77 | 50/50 | 5900 | 2.1 |
| HR-78 | 40/20/30/10 | 14000 | 2.2 |
| HR-79 | 50/50 | 5500 | 1.8 |
| HR-80 | 50/50 | 10600 | 1.9 |
| HR-81 | 50/50 | 8600 | 2.3 |
| HR-82 | 100 | 15000 | 2.1 |
| HR-83 | 100 | 6900 | 2.5 |
| HR-84 | 50/50 | 9900 | 2.3 |

Furthermore, in order to prevent the resist film from directly contacting with the immersion liquid, an immersion liquid sparingly soluble film (hereinafter, sometimes referred to as a "topcoat") may be provided between the immersion liquid and the resist film formed from the resist composition of the present invention. The functions required of the topcoat are suitability for coating on the resist upper layer part, transparency to radiation particularly at 193 nm, and sparing solubility in the immersion liquid. It is preferred that the topcoat does not intermix with the resist and can be uniformly coated on the resist upper layer.

In view of transparency to light at 193 nm, the topcoat is preferably a polymer not abundantly containing an aromatic, and specific examples thereof include a hydrocarbon polymer, an acrylic acid ester polymer, a polymethacrylic acid, a polyacrylic acid, a polyvinyl ether, a silicon-containing polymer and a fluorine-containing polymer. The above-described hydrophobic resin (HR) is suitable also as the topcoat. If impurities dissolve out into the immersion liquid from the topcoat, the optical lens is contaminated. In this viewpoint, the residual monomer components of the polymer are preferably less contained in the topcoat.

On peeling off the topcoat, a developer may be used or a release agent may be separately used. The release agent is preferably a solvent less permeating into the resist film. From the standpoint that the peeling step can be performed simultaneously with the development step of the resist film, the topcoat is preferably peelable with an alkali developer and for enabling the peeling with an alkali developer, the topcoat is preferably acidic, but in view of non-intermixing with the resist film, the topcoat may be neutral or alkaline.

With no difference in the refractive index between the topcoat and the immersion liquid, the resolution is enhanced. In the case of using water as the immersion liquid at the exposure with an ArF excimer laser (wavelength: 193 nm), the topcoat for ArF immersion exposure preferably has a refractive index close to the refractive index of the immersion liquid. From the standpoint of making the refractive index close to that of the immersion liquid, the topcoat preferably contains a fluorine atom. Also, in view of transparency and refractive index, the topcoat is preferably a thin film.

The topcoat is preferably free of intermixing with the resist film and further with the immersion liquid. From this standpoint, when the immersion liquid is water, the solvent for use in the topcoat is preferably a water-insoluble medium that is sparingly soluble in the solvent used for the positive photosensitive composition. Furthermore, when the immersion liquid is an organic solvent, the topcoat may be either water-soluble or water-insoluble.

The resist composition of the present invention is coated on a substrate to form a thin film. The thickness of this coating film is preferably from 0.05 to 4.0 μm.

In the present invention, a commercially available inorganic or organic antireflection film may be used, if desired. Furthermore, the antireflection film may be used by coating it as an overlayer or underlayer of the resist.

The antireflection film used as the underlayer of the resist may be either an inorganic film type such as titanium, titanium dioxide, titanium nitride, chromium oxide, carbon and amorphous silicon, or an organic film type comprising a light absorbent and a polymer material. The former requires equipment for the film formation, such as vacuum deposition apparatus, CVD apparatus and sputtering apparatus. Examples of the organic antireflection film include a film comprising a diphenylamine derivative/formaldehyde-modified melamine resin condensate, an alkali-soluble resin and a light absorbent described in JP-B-7-69611 (the term "JP-B" as used herein means an "examined Japanese patent publication"), a reaction product of a maleic anhydride copolymer and a diamine-type light absorbent described in U.S. Pat. No. 5,294,680, a film containing a resin binder and a methylolmelamine-based heat crosslinking agent described in JP-A-6-118631, an acrylic resin-type antireflection film containing a carboxylic acid group, an epoxy group and a light absorbing group within the same molecule described in JP-A-6-118656, a film comprising a methylolmelamine and a benzophenone-based light absorbent described in JP-A-8-87115, and a film obtained by adding a low molecular light absorbent to a polyvinyl alcohol resin described in JP-A-8-179509.

Also, the organic antireflection film may be a commercially available organic antireflection film such as DUV30 Series and DUV-40 Series produced by Brewer Science, Inc., or AR-2, AR-3 and AR-5 produced by Shipley Co., Ltd.

In regard to the organic antireflection film as an overlayer of the resist, an organic antireflection film such as AQUA-TAR-II, AQUATAR-III and AQUATAR-VII produced by AZ Electronic Materials may be used.

In the production or the like of a precision integrated circuit device, the step of forming a pattern on a resist film is performed by coating the positive resist composition of the present invention on a substrate (for example, a silicon/silicon dioxide-coated substrate, a glass substrate, an ITO substrate or a quartz/chromium oxide-coated substrate) to form a resist film, irradiating thereon actinic rays or radiation such as KrF excimer laser light, ArF excimer laser light, electron beam or EUV light, and then subjecting the resist film to heating, development, rinsing and drying, whereby a good resist pattern can be formed.

The alkali developer which can be used in the development is an aqueous solution of alkalis (usually from 0.1 to 20 mass %) such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimethylethanolamine, triethanolamine), quaternary ammonium salts (e.g., tetramethylammonium hydroxide, tetraethylammonium hydroxide, choline) and cyclic amines (e.g., pyrrole, piperidine). This aqueous solution of alkalis may be used after adding thereto an appropriate amount of alcohols such as isopropyl alcohol or a surfactant such as nonionic surfactant.

Among these developers, a quaternary ammonium salt is preferred, and tetramethylammonium hydroxide and choline are more preferred.

The pH of the alkali developer is usually from 10 to 15.

EXAMPLES

The present invention is described in greater detail below by referring to Examples, but the present invention should not be construed as being limited thereto.

Synthesis Example 1: synthesis of Resin (A-8)

p-Acetoxystyrene (25.92 g (0.16 mol)) and 11.01 g (0.11 mol) of tert-butyl methacrylate were dissolved in 120 ml of butyl acetate, 0.033 g of azobisisobutyronitrile (AIBN) was added three times every 2.5 hours with stirring at 80° C. in a nitrogen stream, and the stirring was further continued for 5 hours, thereby performing the polymerization reaction. The reaction solution was poured in 1,200 ml of hexane to precipitate a white resin, and the obtained resin was dried and then dissolved in 200 ml of methanol.

An aqueous solution containing 7.7 g (0.19 mol) of sodium hydroxide/50 ml water was added thereto, and the resulting solution was refluxed under heating for 1 hour to effect the hydrolysis. Thereafter, the reaction solution was diluted by adding 200 ml of water and neutralized with hydrochloric acid to precipitate a white resin. This resin was separated by filtration, washed with water and dried. The resin was further dissolved in 200 ml of tetra-hydrofuran, and the resulting solution was added dropwise to 5 L of ultrapure water with vigorous stirring, thereby effecting reprecipitation. This reprecipitation operation was repeated three times. The obtained resin was dried in a vacuum drier at 120° C. for 12 hours to obtain Resin (A-8) (p-hydroxystyrene/tert-butyl methacrylate copolymer).

Synthesis Example 2: synthesis of Resin (A-7)

Poly(p-hydroxystyrene) (VP-15000, produced by Nippon Soda Co., Ltd.) (10 g) was dissolved in 50 ml of pyridine, and 3.63 g of di-tert-butyl dicarbonate was added dropwise thereto with stirring at room temperature.

After stirring for 3 hours at room temperature, the reaction solution was added dropwise to a solution containing 1 L of ion exchanged water/20 g of concentrated hydrochloric acid. The precipitated powder was filtered, washed with water and dried to obtain Resin (A-7).

Resins shown in Table 2 below were synthesized by the same method as in Synthesis Examples above.

TABLE 2

| Resin | Composition Unit (I) | (II) | (III) | Compositional Ratio (I) | (II) | (III) | Weight Average Molecular Weight | Dispersity |
|---|---|---|---|---|---|---|---|---|
| A-1 | H-1 | * | IIIb | 35 | 0 | 65 | 15000 | 1.14 |
| A-2 | H-4 | * | IIIb | 25 | 0 | 75 | 12000 | 1.12 |
| A-3 | H-23 | * | IIIc | 30 | 0 | 70 | 12000 | 1.10 |
| A-4 | H-19 | * | IIIb | 30 | 0 | 70 | 8000 | 1.09 |
| A-5 | H-16 | IIc | IIIb | 20 | 13 | 67 | 15000 | 1.50 |
| A-6 | H-13 | IIb | IIIb | 20 | 10 | 70 | 10000 | 1.40 |
| A-7 | H-14 | * | IIIb | 35 | 0 | 65 | 18000 | 1.22 |
| A-8 | I-1 | * | IIIb | 40 | 0 | 60 | 9000 | 1.38 |
| A-9 | I-41 | IIa | IIIb | 20 | 10 | 70 | 13000 | 1.55 |
| A-10 | I-19 | * | IIIb | 20 | 0 | 80 | 10000 | 1.30 |
| A-11 | I-6 | IIa | IIIb | 23 | 7 | 70 | 18000 | 1.50 |
| A-12 | I-21 | * | IIIb | 30 | 0 | 70 | 8000 | 1.35 |
| A-13 | I-33 | IIa | IIIb | 25 | 7 | 68 | 6000 | 1.40 |
| A-14 | I-46 | IIb | IIIb | 20 | 10 | 70 | 18000 | 1.50 |
| A-15 | I-50 | IIc | IIIb | 35 | 10 | 55 | 14000 | 1.45 |

Units (IIa) to (IIc), (IIIb) and (IIIc) in Table 2 are shown below.

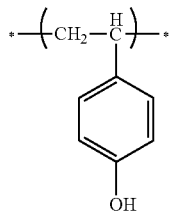

(IIIb)

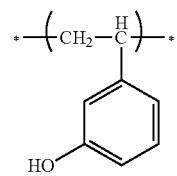

(IIIc)

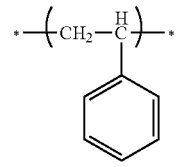

(IIa)

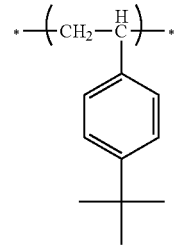

(IIb)

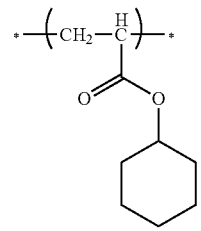

(IIc)

Examples 1 to 16 and Comparative Examples 1 to 4

(1) Preparation of Positive Resist

Respective components shown in Table 3 below were dissolved, and the obtained solution was microfiltered through a membrane filter having a pore size of 0.1 μm to prepare a resist solution.

TABLE 3

| | Resin (1.544 g) | Acid Generator (0.050 g) | | Ratio | Basic Compound (0.005 g) | Ratio | Surfactant (0.001 g) | Solvent (18.4 g) | | Ratio |
|---|---|---|---|---|---|---|---|---|---|---|
| Example 1 | A-1 | * | Z35 | 100 | C1-1 | C3-1 | 80/20 W-1 | D-1 | D-2 | 80/20 |
| Example 2 | A-2 | * | Z36 | 100 | C1-4 | C3-4 | 80/20 W-1 | D-3 | D-2 | 80/20 |
| Example 3 | A-3 | * | Z40 | 100 | C1-5 | C3-2 | 80/20 W-1 | D-1 | D-2 | 80/20 |
| Example 4 | A-8 | Z18 | * | 100 | C1-9 | C4-1 | 80/20 W-1 | D-1 | D-2 | 70/30 |
| Example 5 | A-9 | Z55 | * | 100 | C1-4 | C3-1 | 80/20 W-1 | D-1 | D-2 | 80/20 |
| Example 6 | A-10 | Z84 | * | 100 | C1-5 | C3-4 | 80/20 W-2 | D-1 | D-2 | 80/20 |
| Example 7 | A-11 | Z70 | * | 100 | C1-12 | C3-2 | 70/30 W-1 | D-1 | D-4 | 80/20 |
| Example 8 | A-12 | Z2 | * | 100 | C1-4 | C4-1 | 70/30 W-1 | D-1 | D-4 | 70/30 |
| Example 9 | A-13 | Z7 | * | 100 | C1-5 | C3-1 | 70/30 W-1 | D-1 | D-2 | 80/20 |
| Example 10 | A-15 | Z32 | * | 100 | C1-5 | C3-5 | 60/40 W-2 | D-3 | D-2 | 80/20 |
| Example 11 | A-1 | Z2 | * | 100 | C1-12 | * | 100 W-1 | D-1 | * | 100 |
| Example 12 | A-1 | Z32 | Z36 | 60/40 | C1-1 | C3-1 | 50/50 W-1 | D-1 | * | 100 |
| Example 13 | A-2 | Z7 | Z35 | 50/50 | C1-4 | C3-2 | 50/50 W-1 | D-1 | * | 100 |
| Example 14 | A-6 | * | Z37 | 100 | C1-5 | * | 100 W-2 | D-1 | * | 100 |
| Example 15 | A-9 | Z55 | Z35 | 80/20 | C1-1 | * | 100 W-1 | D-1 | * | 100 |
| Example 16 | A-15 | Z18 | Z36 | 70/30 | C1-5 | C4-1 | 50/50 W-1 | D-1 | * | 100 |
| Comparative Example 1 | A-1 | * | Z35 | 100 | * | C3-6 | 100 W-1 | D-1 | * | 100 |
| Comparative Example 2 | A-7 | Z55 | * | 100 | * | C3-4 | 100 W-1 | D-1 | D-3 | 80/20 |
| Comparative Example 3 | A-9 | Z7 | Z35 | 70/30 | * | C4-1 | 100 W-2 | D-3 | * | 100 |
| Comparative Example 4 | A-13 | Z2 | Z37 | 70/30 | * | C3-1 | 100 W-1 | D-1 | D-2 | 70/30 |

The abbreviations in the Table indicate the followings.
<Basic Compound>
C3-1: Tri-(n-butyl)amine
C3-2: Tri-(n-octyl)amine
C3-3: Tri-(n-dodecyl)amine
C3-4: Dicyclomethylamine
C3-5: Dicycloethylamine
C3-6: Tris-[2-(2-methoxyethoxy)ethyl]amine
C4-1: Tetra-(n-butyl)ammonium hydroxide
C4-2: Tetra-(n-octyl)ammonium hydroxide
<Surfactant>
W-1: Megaface F-176 (produced by Dainippon Ink & Chemicals, Inc.)
W-2: PF6320 (produced by OMNOVA)<
<Solvent>
D-1: Propylene glycol monomethyl ether acetate
D-2: Propylene glycol monomethyl ether
D-3: Ethyl lactate
D-4: Methyl amyl ketone The ratio in the Table is the ratio by mass.

(2) Formation and Evaluation of Positive Resist Pattern

An antireflection film, DUV-44, produced by Nissan Chemical Industries, Ltd. was coated on a 8-inch silicon wafer by using a spin coater, ACT 8, manufactured by Tokyo Electron Ltd. and baked at 200° C. for 60 seconds to obtain a film having an average thickness of 60 nm. Thereafter, the resist solution prepared above was coated on the film and baked at 90° C. for 60 seconds in Examples and Comparative Examples using Resins (A-1) to (A-7) or baked at 130° C. for 60 seconds in Examples and Comparative Examples using Resins (A-8) to (A-15), to obtain a film having an average thickness of 340 nm.

The obtained resist film was then subjected to pattern exposure using a KrF excimer laser scanner (PAS5500/850C, manufactured by ASML, wavelength: 248 nm, NA: 0.80, sigma=0.65). The reticle used here was a 6% halftone mask.

After the exposure, the resist film was baked at 110° C. for 60 seconds in Examples and Comparative Examples using Resins (A-1) to (A-7) or baked at 130° C. for 60 seconds in Examples and Comparative Examples using Resins (A-8) to (A-15), then dipped in an aqueous 2.38 mass % tetramethylammonium hydroxide (TMAH) solution for 60 seconds, rinsed with water for 30 seconds and dried. The obtained pattern was evaluated by the following methods.

(2-1) Sensitivity

The obtained pattern was observed for the line width by a scanning electron microscope (S-9260, manufactured by Hitachi, Ltd.), and the irradiation energy when resolving an isolated hole of 140 nm (size of mask: 170 nm, Duty=1:10) was taken as the sensitivity (Eopt).

(2-2) Sidelobe Margin

Assuming that the exposure amount allowing generation of sidelobe is Elimit, the sidelobe margin defined by the following formula was calculated. A larger value indicates higher sidelobe resistance.

[Sidelobe margin]=(Elimit)/(Eopt)

(2-3) Exposure Latitude (EL)

By measuring the size for the exposure amount in the same manner as above, the sensitivity giving a size at ±10% of the target size 140 nm, that is, a size of 126 nm or 154 nm, was determined and the exposure latitude (EL) defined by the following formula was calculated. A larger value indicates better exposure latitude.

[EL(%)]=[(exposure amount for a size of 154 nm)–(exposure amount for a size of 126 nm)]/(Eopt)

(2-4) Depth-of-Focus (DOF)

The resist film was exposed with the sensitivity determined in (2-1) above by displacing the focus, and the range of the obtained size falling within ±10% of the target size 140 nm, that is, from 126 nm to 154 nm, is taken as the depth-of-focus (DOF) (μm). A larger value indicates a wider depth-of-focus (DOF).

(2-5) Pattern Profile

The side wall of the resist pattern where an isolated hole was finished in 140 nm (size of mask: 170 nm, Duty=1:10) with the sensitivity obtained in (2-1), was observed by a scanning electron microscope (S-4800, manufactured by Hitachi, Ltd.) and rated on the following 5-stage scale.

A: The pattern has a very clear side wall and the verticality of the side wall is from 85° to 90°.

B: The pattern has a very clear side wall and the verticality of the side wall is from 80° to less than 85°, or the pattern has a slightly rough side wall and the verticality of the side wall is from 85° to 90°.

C: The pattern has a slightly rough side wall and the verticality of the side wall is from 80° to less than 85°.

D: The pattern has a slightly rough side wall and the verticality of the side wall is less than 80°, or the pattern has a very rough side wall and the verticality of the side wall is from 80° to less than 85°.

E: The pattern has a very rough side wall and the verticality of the side wall is less than 80°.

(2-6) Resolution

To what nm is resolved with the sensitivity obtained in (2-1) was observed by the above-described scanning electron microscope.

Evaluation results of Examples 1 to 16 and Comparative Examples 1 to 4 are shown in Table 4 below.

TABLE 4

| | Sensitivity (mJ/cm$^2$) | Sidelobe Margin | EL (%) | DOF (μm) | Profile | Resolution (nm) |
|---|---|---|---|---|---|---|
| Example 1 | 28 | 1.28 | 20 | 0.45 | A | 115 |
| Example 2 | 48 | 1.21 | 22 | 0.40 | A | 115 |
| Example 3 | 50 | 1.21 | 23 | 0.45 | A | 120 |
| Example 4 | 40 | 1.18 | 20 | 0.40 | A | 125 |
| Example 5 | 50 | 1.20 | 24 | 0.45 | A | 120 |
| Example 6 | 58 | 1.24 | 22 | 0.45 | A | 120 |
| Example 7 | 36 | 1.11 | 17 | 0.30 | B | 130 |
| Example 8 | 33 | 1.23 | 23 | 0.40 | A | 120 |
| Example 9 | 40 | 1.22 | 22 | 0.35 | A | 120 |
| Example 10 | 51 | 1.17 | 22 | 0.40 | A | 120 |
| Example 11 | 41 | 1.13 | 17 | 0.35 | B | 130 |
| Example 12 | 58 | 1.28 | 25 | 0.45 | A | 115 |
| Example 13 | 33 | 1.34 | 23 | 0.45 | A | 115 |
| Example 14 | 43 | 1.24 | 21 | 0.40 | A | 125 |
| Example 15 | 51 | 1.32 | 21 | 0.40 | A | 120 |
| Example 16 | 52 | 1.33 | 22 | 0.45 | B | 115 |
| Comparative Example 1 | 72 | 0.95 | 17 | 0.30 | E | 140 |
| Comparative Example 2 | 61 | 1.03 | 18 | 0.25 | D | 140 |
| Comparative Example 3 | 57 | 1.05 | 16 | 0.25 | C | 135 |
| Comparative Example 4 | 55 | 0.98 | 17 | 0.20 | E | 135 |

As seen from Table 4, with respect to the pattern founation by KrF excimer laser exposure, the resist composition of the present invention exhibits high sensitivity and high sidelobe resistance, is excellent in the exposure latitude and depth-of-focus, and ensures good pattern profile and high resolution, as compared with Comparative Examples.

Examples 17 to 27 and Comparative Examples 5 and 6

(3) Formation and Evaluation of Pattern (EB)

Respective components shown in Table 5 below were dissolved and the obtained solution was microfiltered through a membrane filter having a pore size of 0.1 µm to prepare a resist solution.

TABLE 5

| | Resin | Acid Generator | | | Basic Compound | | Surfactant | | Solvent | | |
|---|---|---|---|---|---|---|---|---|---|---|---|
| | (1.544 g) | (0.050 g) | | Ratio | (0.005 g) | Ratio | (0.001 g) | | (18.4 g) | | Ratio |
| Example 17 | A-1 | * | Z35 | 100 | C1-1 | | C3-1 | 80/20 | W-1 | D-1 | D-2 | 80/20 |
| Example 18 | A-3 | * | Z40 | 100 | C1-5 | | C3-2 | 80/20 | W-1 | D-1 | D-2 | 80/20 |
| Example 19 | A-8 | Z18 | * | 100 | C1-9 | | C4-1 | 80/20 | W-1 | D-1 | D-2 | 70/30 |
| Example 20 | A-10 | Z84 | * | 100 | C1-5 | | C3-4 | 80/20 | W-2 | D-1 | D-2 | 80/20 |
| Example 21 | A-11 | Z70 | * | 100 | C1-12 | | C3-2 | 70/30 | W-1 | D-1 | D-4 | 80/20 |
| Example 22 | A-12 | Z2 | * | 100 | C1-4 | | C4-1 | 70/30 | W-1 | D-1 | D-4 | 70/30 |
| Example 23 | A-13 | Z7 | * | 100 | C1-5 | | C3-1 | 70/30 | W-1 | D-1 | D-2 | 80/20 |
| Example 24 | A-15 | Z32 | * | 100 | C1-5 | | C3-5 | 60/40 | W-2 | D-3 | D-2 | 80/20 |
| Example 25 | A-1 | Z32 | Z36 | 60/40 | C1-1 | | C3-1 | 50/50 | W-1 | D-1 | * | 100 |
| Example 26 | A-2 | Z7 | Z35 | 50/50 | C1-4 | | C3-2 | 50/50 | W-1 | D-1 | * | 100 |
| Example 27 | A-9 | Z55 | Z35 | 80/20 | C1-1 | | * | 100 | W-1 | D-1 | * | 100 |
| Comparative Example 5 | A-1 | * | Z35 | 100 | * | | C3-6 | 100 | W-1 | D-1 | * | 100 |
| Comparative Example 6 | A-9 | Z7 | Z35 | 70/30 | * | | C4-1 | 100 | W-2 | D-3 | * | 100 |

The obtained resist solution was coated on a hexamethyldisilazane-treated silicon wafer by using a spin coater, Mark 8, manufactured by Tokyo Electron Ltd. and baked at 120° C. for 60 seconds in Examples and Comparative Examples using Resins (A-1) to (A-7) or baked at 130° C. for 60 seconds in Examples and Comparative Examples using Resins (A-8) to (A-15), to obtain a film having an average thickness of 300 nm.

This resist film was irradiated with an electron beam by using an electron beam image-drawing apparatus (HL750, manufactured by Hitachi Ltd., accelerating voltage: 50 KeV). After the irradiation, the resist film was baked at 110° C. for 60 seconds in Examples and Comparative Examples using Resins (A-1) to (A-7) or baked at 130° C. for 60 seconds in Examples and Comparative Examples using Resins (A-8) to (A-15), then dipped in an aqueous 2.38 mass % tetramethylammonium hydroxide (TMAH) solution for 60 seconds, rinsed with water for 30 seconds and dried. The obtained pattern was evaluated by the following methods.

(3-1) Sensitivity

The obtained pattern was observed for the line width by a scanning electron microscope (S-9260, manufactured by Hitachi, Ltd.), and the irradiation energy when a 150-nm line (line: space=1:1) was finished in 150 nm was taken as the sensitivity.

(3-2) Evaluation of Resolution

To what nm the line: space=1:1 was resolved with the sensitivity obtained in (3-1) was observed by the above-described scanning electron microscope.

(3-3) LWR Evaluation

The line pattern where a 150-nm line (line: space=1:1) was finished in 150 nm with the sensitivity obtained in (3-1) was observed by a scanning electron microscope (S9260, manufactured by Hitachi Ltd.). With respect to the range of 2 µm edge in the longitudinal direction of the line pattern, the line width was measured at 50 points and after determining the standard deviation, 3 σ was calculated. A smaller value indicates better performance.

(3-4) Pattern Profile

The side wall of the resist pattern where a 150-nm line (line: space=1:1) was finished in 150 nm with the sensitivity obtained in (3-1), was observed by a scanning electron microscope (S-4800, manufactured by Hitachi, Ltd.) and rated on the following 5-stage scale.

A: The pattern has a very clear side wall and the verticality of the side wall is from 85° to 90°.

B: The pattern has a very clear side wall and the verticality of the side wall is from 80° to less than 85°, or the pattern has a slightly rough side wall and the verticality of the side wall is from 85° to 90°.

C: The pattern has a slightly rough side wall and the verticality of the side wall is from 80° to less than 85°.

D: The pattern has a slightly rough side wall and the verticality of the side wall is less than 80°, or the pattern has a very rough side wall and the verticality of the side wall is from 80° to less than 85°.

E: The pattern has a very rough side wall and the verticality of the side wall is less than 80°.

Evaluation results of Examples 17 to 27 and Comparative Examples 5 and 6 are shown in Table 6 below.

TABLE 6

| | Sensitivity ($\mu C/cm^2$) | Resolution (nm) | LWR (nm) | Profile |
|---|---|---|---|---|
| Example 17 | 7.3 | 85 | 4.8 | A |
| Example 18 | 8.3 | 100 | 4.4 | B |
| Example 19 | 7.7 | 95 | 5.7 | A |
| Example 20 | 6.4 | 95 | 5.6 | A |
| Example 21 | 5.7 | 100 | 7.5 | B |
| Example 22 | 7.1 | 95 | 6.0 | A |
| Example 23 | 7.5 | 70 | 7.2 | B |
| Example 24 | 6.7 | 90 | 6.7 | A |
| Example 25 | 8.7 | 90 | 5.2 | A |
| Example 26 | 8.5 | 75 | 4.6 | A |
| Example 27 | 6.2 | 80 | 4.8 | B |
| Comparative Example 5 | 16.2 | 145 | 14.2 | E |
| Comparative Example 6 | 15.2 | 150 | 13.2 | D |

As seen from the results in Table 6, with respect to the pattern formation by electron beam irradiation, the resist composition of the present invention exhibits high sensitivity and high resolution and is excellent in the LWR performance and pattern profile, as compared with Comparative Examples.

Examples 28 to 32 and Comparative Example 7

(4) Formation and Evaluation of Pattern (EUV)

Respective components shown in Table 7 below were dissolved and the obtained solution was microfiltered through a membrane filter having a pore size of 0.1 um to prepare a resist solution.

TABLE 7

| | Resin | Acid Generator | | Ratio | Basic Compound | | Ratio | Surfactant | Solvent | | Ratio |
|---|---|---|---|---|---|---|---|---|---|---|---|
| | (1.544 g) | (0.050 g) | | | (0.005 g) | | | (0.001 g) | (18.4 g) | | |
| Example 28 | A-2 | * | Z36 | 100 | C1-4 | C3-4 | 80/20 | W-1 | D-3 | D-2 | 80/20 |
| Example 29 | A-9 | Z55 | * | 100 | C1-4 | C3-1 | 80/20 | W-1 | D-1 | D-2 | 80/20 |
| Example 30 | A-2 | Z7 | Z35 | 50/50 | C1-4 | C4-2 | 50/50 | W-1 | D-1 | * | 100 |
| Example 31 | A-9 | Z55 | Z35 | 80/20 | C1-1 | * | 100 | W-1 | D-1 | * | 100 |
| Example 32 | A-14 | Z2 | Z37 | 50/50 | C1-9 | * | 100 | W-2 | D-1 | * | 100 |
| Comparative Example 7 | A-7 | Z55 | * | 100 | * | C3-6 | 100 | W-1 | D-1 | D-3 | 80/20 |

The obtained resist solution was coated on a hexamethyldisilazane-treated silicon wafer by using a spin coater, Mark 8, manufactured by Tokyo Electron Ltd. and baked at 120° C. for 60 seconds to obtain a film having an average thickness of 150 nm.

This resist film was exposed with EUV light (wavelength: 13 nm, EUVES, manufactured by Litho Tech Japan Co., Ltd.) by changing the exposure amount in steps of 0.5 mJ in the range from 0 to 20.0 mJ and further baked at 120° C. for 60 seconds. Thereafter, the dissolution rate at each exposure amount was measured by using an aqueous 2.38 mass % tetramethylammonium hydroxide (TMAH) solution to obtain a sensitivity curve.

(Sensitivity and Resolution (Dissolution Contrast))

In this sensitivity curve, the exposure amount when the dissolution rate of the resist was saturated was taken as the sensitivity and also, the dissolution contrast (γ value) indicative of the resolution was calculated from the gradient of the straight line part in the sensitivity curve. As the γ value is larger, the dissolution contrast is more excellent and the resolution is higher.

Evaluation results of Examples 28 to 32 and Comparative Example 7 are shown in Table 8 below.

TABLE 8

| | Sensitivity (mJ/cm$^2$) | Resolution (γ value) |
|---|---|---|
| Example 28 | 6 | 6.1 |
| Example 29 | 7 | 6.1 |
| Example 30 | 6 | 6.8 |
| Example 31 | 7 | 6.8 |
| Example 32 | 7 | 6.2 |
| Comparative Example 7 | 13 | 4.4 |

As seen from Table 8, with respect to the pattern formulation by EUV exposure, the resist composition of the present invention is assured of high sensitivity and high dissolution contrast, as compared with Comparative Examples.

In this way, the resist composition of the present invention exhibited good results even by EUV irradiation.

Synthesis Example 3 (Synthesis of Resin (1))

In a nitrogen stream, 8.6 g of cyclohexanone was charged into a three-neck flask and heated at 80° C. Thereto, a solution prepared by dissolving 9.8 g of 2-adamantylisopropyl methacrylate, 4.4 g of dihydroxyadamantyl methacrylate, 8.9 g of norbornane lactone methacrylate and a polymerization initiator V-601 (produced by Wako Pure Chemical Industries, Ltd.) in an amount of 8 mol % based on the monomers, in 79 g of cyclohexanone was added dropwise over 6 hours. After the completion of dropwise addition, the reaction was further allowed to proceed at 80° C. for 2 hours. The reaction solution was left standing to cool and then added dropwise to a mixed solution of 800-ml methanol/200-ml ethyl acetate over 20 minutes, and the precipitated powder was collected by filtration and dried to obtain 19 g of Resin (1). The weight average molecular weight of the obtained resin was 8,800 in terms of standard polystyrene, and the dispersity (Mw/Mn) was 1.9.

Resins (3), (17), (19) and (25) of which structures are shown above were synthesized in the same manner. The molar ratio of repeating units (starting from the left in the structure shown), the weight average molecular weight and the dispersity of each resin are shown in Table 9 below.

TABLE 9

| Resin | Compositional Ratio (by mol) | | | Weight Average Molecular Weight | Dispersity |
|---|---|---|---|---|---|
| (1) | 50 | 10 | 40 | 8800 | 1.90 |
| (3) | 34 | 33 | 33 | 11000 | 2.30 |
| (17) | 40 | 10 | 50 | 6000 | 1.80 |
| (19) | 35 | 30 | 35 | 9800 | 1.80 |
| (25) | 40 | 10 | 50 | 7700 | 2.00 |

Examples 33 to 39 and Comparative Examples 8 and 9

Respective components shown in Table 10 below were dissolved and the obtained solution was microfiltered through a membrane filter having a pore size of 0.1 μm to prepare a resist solution.

TABLE 10

| | Resin | Acid Generator | | Ratio | Basic Compound | | Ratio | Surfactant | Solvent | | Ratio | Hydrophobic Resin |
|---|---|---|---|---|---|---|---|---|---|---|---|---|
| | (1.133 g) | (0.060 g) | | | (0.006 g) | | | (0.001 g) | (18.8 g) | | | (0.02 g) |
| Example 33 | (1) | Z18 | * | 100 | C1-1 | C3-1 | 80/20 | W-1 | D-1 | D-2 | 80/20 | * |
| Example 34 | (17) | * | Z37 | 100 | C1-1 | C3-1 | 50/50 | W-1 | D-1 | D-2 | 70/30 | HR53 |
| Example 35 | (25) | Z55 | * | 100 | C1-5 | C3-1 | 70/30 | W-1 | D-1 | D-2 | 80/20 | * |
| Example 36 | (1) | Z2 | Z37 | 60/40 | C1-1 | * | 100 | W-2 | D-1 | D-2 | 80/20 | * |
| Example 37 | (3) | Z2 | * | 100 | C1-4 | C3-4 | 80/20 | W-1 | D-1 | * | 100 | HR83 |
| Example 38 | (19) | * | Z37 | 100 | C1-5 | * | 100 | W-1 | D-1 | * | 100 | * |
| Example 39 | (1) | Z18 | Z37 | 70/30 | C1-5 | C4-1 | 50/50 | W-1 | D-1 | * | 100 | * |

| | Resin | Acid Generator | | Ratio | Basic Compound | | Ratio | Surfactant | Solvent | | Ratio | Hydrophobic Resin |
|---|---|---|---|---|---|---|---|---|---|---|---|---|
| | (1.544 g) | (0.050 g) | | | (0.005 g) | | | (0.001 g) | (18.4 g) | | | (0.02 g) |
| Comparative Example 8 | (19) | * | Z37 | 100 | * | C3-6 | 100 | W-1 | D-1 | * | 100 | * |
| Comparative Example 9 | (25) | Z55 | * | 100 | * | C3-4 | 100 | W-1 | D-1 | D-3 | 80/20 | * |

An organic antireflection film, ARC29A (produced by Nissan Chemical Industries, Ltd.), was coated on a silicon wafer and baked at 205° C. for 60 seconds to form an antireflection film having a thickness of 78 nm, and the resist solution prepared was coated thereon and baked at 130° C. for 60 seconds to form a resist film having a thickness of 250 nm. The obtained wafer was subjected to pattern exposure using an ArF excimer laser scanner (PAS5500/1100, manufactured by ASML, NA: 0.75, σ=0.70). Thereafter, the wafer was heated at 130° C. for 60 seconds, then developed with an aqueous tetramethylammonium hydroxide solution (2.38 mass %) for 30 seconds, rinsed with pure water and spin-dried to obtain a resist pattern.

The obtained pattern was observed for the line width by a scanning electron microscope (S-9260, manufactured by Hitachi, Ltd.), and the irradiation energy when resolving an isolated hole of 110 nm (size of mask: 130 nm, Duty=1:10) was taken as the sensitivity (Eopt). Under this condition, the sidelobe margin, exposure latitude (EL), pattern profile and resolution were evaluated. The evaluation conditions are the same as in Example 1.

Evaluation results of Examples 33 to 39 and Comparative Examples 8 and 9 are shown in Table 11 below.

TABLE 11

| | Sensitivity (mJ/cm$^2$) | Sidelobe Margin | EL (%) | Profile | Resolution (nm) |
|---|---|---|---|---|---|
| Example 33 | 15 | 1.25 | 23 | A | 85 |
| Example 34 | 16 | 1.21 | 22 | A | 85 |
| Example 35 | 17 | 1.28 | 23 | A | 90 |
| Example 36 | 25 | 1.32 | 25 | A | 85 |
| Example 37 | 31 | 1.21 | 23 | A | 90 |
| Example 38 | 26 | 1.24 | 18 | B | 95 |
| Example 39 | 22 | 1.31 | 26 | B | 85 |
| Comparative Example 8 | 35 | 0.93 | 14 | E | 105 |
| Comparative Example 9 | 37 | 1.02 | 13 | E | 110 |

As seen from Table 11, with respect to the pattern formation by ArF excimer laser exposure, the resist composition of the present invention exhibits high sensitivity and high sidelobe resistance, is excellent in the exposure latitude, and ensures good pattern profile and high resolution, as compared with Comparative Examples.

In this way, the resist composition of the present invention exhibited good results even in ArF exposure.

Examples 40 and 41 and Comparative Example 10

Respective components shown in Table 12 below were dissolved and the obtained solution was microfiltered through a membrane filter having a pore size of 0.1 μm to prepare a resist solution.

TABLE 12

| | Resin | Acid Generator | | Ratio | Basic Compound | | Ratio | Surfactant | Solvent | | Ratio | Hydrophobic Resin |
|---|---|---|---|---|---|---|---|---|---|---|---|---|
| | (1.133 g) | (0.060 g) | | | (0.006 g) | | | (0.001 g) | (18.8 g) | | | (0.02 g) |
| Example 40 | (17) | * | Z37 | 100 | C1-1 | C3-1 | 50/50 | W-1 | D-1 | D-2 | 70/30 | HR53 |
| Example 41 | (3) | Z2 | * | 100 | C1-4 | C3-4 | 80/20 | W-1 | D-1 | * | 100 | HR83 |

| | Resin | Acid Generator | | Ratio | Basic Compound | | Ratio | Surfactant | Solvent | | Ratio | Hydrophobic Resin |
|---|---|---|---|---|---|---|---|---|---|---|---|---|
| | (1.544 g) | (0.050 g) | | | (0.005 g) | | | (0.001 g) | (18.4 g) | | | (0.02 g) |
| Comparative Example 10 | (19) | * | Z37 | 100 | * | C3-6 | 100 | W-1 | D-1 | * | 100 | HR83 |

An organic antireflection film, ARC29A (produced by Nissan Chemical Industries, Ltd.), was coated on a silicon wafer and baked at 205° C. for 60 seconds to form an antireflection film having a thickness of 78 nm, and the resist solution prepared was coated thereon and baked at 130° C. for 60 seconds to form a resist film having a thickness of 160 nm. The obtained wafer was subjected to pattern exposure using an ArF excimer laser immersion scanner (PAS5500/1250i, manufactured by ASML, NA: 0.85, σ=0.80) and using pure water as the immersion liquid. Thereafter, the wafer was heated at 130° C. for 60 seconds, then developed with an aqueous tetramethylammonium hydroxide solution (2.38 mass %) for 30 seconds, rinsed with pure water and spin-dried to obtain a resist pattern.

The obtained pattern was observed for the line width by a scanning electron microscope (S-9260, manufactured by Hitachi, Ltd.), and the irradiation energy when resolving an isolated hole of 80 nm (size of mask: 100 nm, Duty=1:10) was taken as the sensitivity (Eopt). Under this condition, the side-lobe margin, exposure latitude (EL), pattern profile and resolution were evaluated. The evaluation conditions are the same as in Example 1.

Evaluation results of Examples 40 and 41 and Comparative Example 10 are shown in Table 13 below.

TABLE 13

| | Sensitivity (mJ/cm$^2$) | Sidelobe Margin | EL (%) | Profile | Resolution (nm) |
|---|---|---|---|---|---|
| Example 40 | 19 | 1.25 | 8.3 | A | 65 |
| Example 41 | 29 | 1.23 | 7.6 | A | 70 |
| Comparative Example 10 | 37 | 1.02 | 5.1 | E | 80 |

As seen from Table 13, with respect to the pattern formation by ArF excimer laser immersion exposure, the resist composition of the present invention exhibits high sensitivity and high sidelobe resistance, is excellent in the exposure latitude, and ensures good pattern profile and high resolution, as compared with Comparative Examples.

Industrial Applicability

According to the present invention, a resist composition excellent in the sensitivity, resolution, pattern profile, sidelobe margin, exposure latitude (EL), depth-of-focus (DOF) performance and line width roughness performance and a pattern forming method using the composition can be provided.

The entire disclosure of each and every foreign patent application from which the benefit of foreign priority has been claimed in the present application is incorporated herein by reference, as if fully set forth.

The invention claimed is:

1. A resist composition, comprising:
   (A) a resin that decomposes by an action of an acid to increase a solubility of the resin (A) in an alkali developer;
   (B) a compound capable of generating an acid upon irradiation with actinic rays or radiation;
   (C) a compound represented by formula (C1); and
   (D) a solvent:

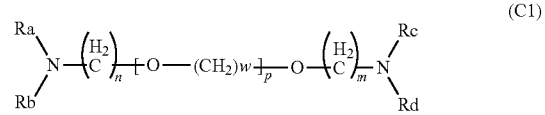

(C1)

wherein n represents an integer of 1 to 6;
w represents an integer of 1 to 6;
p represents an integer of 1 to 6;
m represents an integer of 1 to 6;
Ra, Rb, Rc and Rd each independently represents a hydrogen atom.

2. The resist composition according to claim 1, wherein in formula (C1), n, w and m each is 2.

3. The resist composition according to claim 1, wherein the resin (A) that decomposes by an action of an acid to increase the solubility in an alkali developer contains a repeating unit represented by formula (A1):

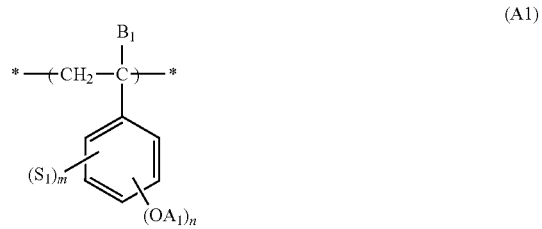

(A1)

wherein n represents an integer of 1 to 3;
m represents an integer of 0 to 3, provided that m+n≤5;
$A_1$ represents a group that leaves by an action of an acid or a group containing a group that decomposes by an action of an acid;
$S_1$ represents a substituent and when a plurality of $S_1$'s are present, the plurality of $S_1$'s may be the same or different; and
$B_1$ represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

4. The resist composition according to claim 1, wherein the resin (A) that decomposes by an action of an acid to increase the solubility in an alkali developer contains a repeating unit represented by formula (A2):

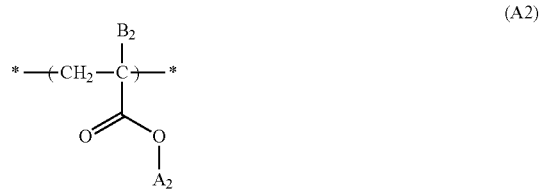

(A2)

wherein $A_2$ represents a group that leaves by an action of an acid or a group containing a group that decomposes by an action of an acid; and
$B_2$ represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

5. The resist composition according to claim 4, wherein the repeating unit represented by formula (A2) is represented by formula (A2'):

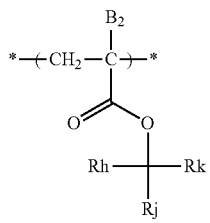

(A2')

wherein Rh, Rk and Rj each independently represents a hydrogen atom, an alkyl group, a cycloalkyl group, an aryl group or an aralkyl group, provided that Rk and Rj may combine together to form a ring; and B$_2$ represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group or an aralkyl group.

6. The resist composition according to claim 1, wherein the compound (B) capable of generating an acid upon irradiation with actinic rays or radiation contains at least one kind of a compound selected from the group consisting of triarylsulfonium salts, diazodisulfone derivatives and oxime esters of an organic sulfonic acid.

7. The resist composition according to claim 1, wherein the compound (B) capable of generating an acid upon irradiation with actinic rays or radiation contains at least one kind of a compound selected from the group consisting of triarylsulfonium salts, and at least one kind of a compound selected from the group consisting of diazodisulfone derivatives and oxime esters of an organic sulfonic acid.

8. The resist composition according to claim 1, wherein the solvent (D) contains at least one kind of a solvent selected from the group consisting of propylene glycol monomethyl ether acetate, propylene glycol monomethyl ether propionate, propylene glycol monoethyl ether acetate, propylene glycol monomethyl ether, ethyl lactate, methoxymethyl propionate, ethoxyethyl propionate, γ-butyrolactone and propylene carbonate.

9. The resist composition according to claim 1, further comprising:
a basic compound represented by formula (C3) or (C4):

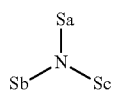

(C3)

wherein Sa, Sb and Sc each independently represents an alkyl group, a cycloalkyl group, an aryl group or an aralkyl group, provided that Sa and Sb may combine together to form a ring; and

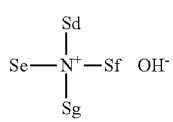

(C4)

wherein Sd, Se, Sf and Sg each independently represents an alkyl group, a cycloalkyl group, an aryl group or an aralkyl group, provided that Sd and Se may combine together to form a ring.

10. A pattern forming method, comprising:
forming a resist film from the resist composition according to claim 1; and
exposing and developing the resist film.

11. A pattern forming method, comprising:
forming a resist film from the resist composition according to claim 1;
exposing the resist film through an immersion medium, so as to form an exposed resist film; and
developing the exposed resist film.

* * * * *